United States Patent [19]
Tsutsumi

[11] Patent Number: 5,844,274
[45] Date of Patent: Dec. 1, 1998

[54] SEMICONDUCTOR DEVICE INCLUDING AN ELEMENT ISOLATING FILM HAVING A FLAT UPPER SURFACE

[75] Inventor: Toshiaki Tsutsumi, Hyogo, Japan

[73] Assignee: Mitsubishi Denki Kabushiki Kaisha, Tokyo, Japan

[21] Appl. No.: 623,035

[22] Filed: Mar. 28, 1996

[30] Foreign Application Priority Data

Aug. 11, 1995 [JP] Japan ..................... 7-205892

[51] Int. Cl.$^6$ .......................... H01G 29/76; H01G 29/94; H01G 31/062; H01G 31/113
[52] U.S. Cl. ..................... 257/333; 257/336; 257/340; 257/343; 257/344; 438/265; 438/303
[58] Field of Search .................... 257/333, 336, 257/340, 343–345, 637; 438/265, 303

[56] References Cited

U.S. PATENT DOCUMENTS

| | | | |
|---|---|---|---|
| 5,391,508 | 2/1995 | Matsuoka et al. | 438/302 |
| 5,436,482 | 7/1995 | Ogoh | 257/344 |
| 5,461,254 | 10/1995 | Tsai | 257/646 |
| 5,468,983 | 11/1995 | Hirase et al. | 257/344 |
| 5,489,791 | 2/1996 | Arima et al. | 257/336 |
| 5,508,216 | 4/1996 | Inoue | 438/151 |
| 5,576,572 | 11/1996 | Maeda et al. | 257/378 |
| 5,583,361 | 12/1996 | Morishita | 257/345 |
| 5,600,168 | 2/1997 | Lee | 257/336 |
| 5,648,672 | 7/1997 | Hasegawa et al. | 257/372 |
| 5,675,166 | 10/1997 | Llderem | 257/345 |

FOREIGN PATENT DOCUMENTS 4-186733  7/1992  Japan ..................... 257/344

Primary Examiner—Mahshid D. Saadat
Assistant Examiner—Allan R. Wilson
Attorney, Agent, or Firm—McDermott, Will & Emery

[57] ABSTRACT

A semiconductor device and a method of manufacturing the same provide a structure which can be easily integrated to a higher extent without providing an alignment margin taking an alignment accuracy of photolithography into consideration. In the semiconductor device, a gate electrode and a pair of source/drain electrodes are formed inside a transistor opening formed at first and second insulating films forming a flat element isolating film. Thereby, an end of the gate electrode in the width direction is defined in an aligned manner by the transistor opening in the step of forming the gate electrode so that it is not necessary to provide the alignment margin taking the alignment accuracy into consideration. This allows high integration.

10 Claims, 72 Drawing Sheets

SEMICONDUCTOR DEVICE INCLUDING AN ELEMENT ISOLATING FILM HAVING A FLAT UPPER SURFACE

BACKGROUND OF THE INVENTION

1. Field of the Invention

The present invention relates to a semiconductor device and a method of manufacturing the same, and particularly to a semiconductor device including an element isolating film having a flat upper surface and a method of manufacturing the same.

2. Description of the Background Art

FIG. 131 is a plan view showing an MISFET having a conventional LDD (Lightly Doped Drain) structure. FIG. 132 is a cross sectional view taken along line 100—100 in FIG. 131, and FIG. 133 is a cross sectional view taken along line 200—200 in FIG. 131. Referring to FIGS. 131 and 132, a semiconductor substrate 91 is provided at a predetermined region of its main surface with an element isolating film 92 which surrounds an active region and is manufactured by an LOCOS (Local Oxidation of Silicon) method. A channel stop layer 93 is formed under element isolating film 92. A gate insulating film 94 is formed on the active region. A gate electrode 95 is formed on gate insulating film 94 and element isolating film 92. An interlayer insulating film 99 is formed over gate electrode 95 and element isolating film 92.

In the section shown in FIG. 133, heavily doped impurity diffusion layers 98a and 98b are formed at the active region surrounded by element isolating film 92 and are spaced from each other by a predetermined distance to define a channel region. Lightly doped impurity diffusion layers 97 are formed at side edges of heavily doped impurity diffusion layers 98a and 98b. A gate electrode 95 is formed on the channel region with a gate insulating film 94 therebetween, and side wall insulating films 96 are formed at opposite side surfaces of gate electrode 95. Interlayer insulating film 99 is provided at regions located above heavily doped impurity diffusion regions 98a and 98b with contact holes 104a and 104b. A barrier metal 101a is formed along the bottom and side surfaces of contact hole 104a, and an inner space of barrier metal 101a is filled with electrically conductive film 102a. Barrier metal 101a and conductive film 102a form an interconnection layer 103a. Likewise, a barrier metal 101b and an electrically conductive layer 102b form an interconnection layer 103b in and above contact hole 104b.

Gate electrode 95 is formed in such a manner that gate insulating film 94 is formed by thermal oxidation after forming element isolating film 92, and then a polycrystalline silicon layer and a metal silicide layer are deposited on gate insulating film 94 and are patterned.

As shown in FIGS. 131 and 132, it is necessary to locate an end of gate electrode 95 over element isolating film 92. Its alignment margin La in the gate width direction depends on an alignment accuracy of photolithography. If alignment margin La is smaller than the alignment accuracy, the active region may be unpreferably exposed through a space, which is formed between the end of gate electrode 95 in the gate width direction and element isolating film 92 due to deviation of gate electrode 95 in the gate width direction as shown in FIGS. 134 and 135. In this case, impurity will be implanted into the exposed portion in a later ion implanting process for forming impurity diffusion layers 97, 98a and 98b. As a result, an impurity diffusion layer 98c of the same conductivity type as impurity diffusion layers 97, 98a and 98b will be formed at the exposed portion. This makes electrical connection between the source and drain at the impurity diffusion layer 98c, so that the FET cannot operate accurately. Accordingly, the conventional structure must have alignment margin La equal to or larger than the alignment accuracy.

An alignment margin Lb shown in FIGS. 131 and 133 must be equal to or larger than the alignment accuracy of photolithography. If alignment margin Lb is smaller than the alignment accuracy, contact hole 104b may be located above the end of element isolating film 92 as shown in FIGS. 136 and 137. In this case, interconnection layer 103b short-circuits impurity diffusion layers 97 and 98b to channel stop layer 93, so that the FET cannot operate normally. Accordingly, alignment margin Lb must be equal to or larger than the alignment accuracy of photolithography.

The alignment accuracy is a finite positive value determined by the performance of device, and is typically in a range from 0.1 to 0.2 $\mu$m. A size (alignment margin) corresponding to the alignment accuracy is additionally required in a pattern arrangement of a VLSI, which prevents sufficiently high integration.

In the conventional semiconductor device, when gate electrode 95 is formed by the patterning in a conventional RIE (Reactive Ion Etching) method, overetching must be effected on gate electrode 95 to a higher extent as element isolating film 92 has a steeper stepped portion. Etching for forming gate electrode 95 uses thin gate insulating film 94 as a stopper. In this case, as the thickness of gate insulating film 94 decreases below 5 nm, difficulty in patterning of gate electrode 95 increases. Since a selectivity ratio of etching between polycrystalline silicon forming gate electrode 95 and a silicon oxide film forming gate insulating film 94 is not sufficiently large, gate insulating film 94 forming the etching stopper may be shaved off in the process of overetching gate electrode 95. In this case, the surface of silicon substrate 91 is unpreferably hollowed. This problem becomes more remarkable as gate insulating film 94 is thinner.

SUMMARY OF THE INVENTION

An object of the invention is to provide a semiconductor device, which does not require an alignment margin required in the prior art and can be integrated to a higher extent.

Another object of the invention is to provide a transistor of a semiconductor device, in which a semiconductor substrate is not hollowed even when a gate electrode is patterned on a thin gate insulating film.

Still another object of the invention is to provide a method of manufacturing a semiconductor device, in which there is no possibility that a semiconductor substrate is hollowed in a process of patterning a gate electrode on a thin gate insulating film.

According to an aspect of the invention, a semiconductor device includes an element isolating film, a pair of source/drain regions, a gate electrode, a side wall insulating film and a pair of source/drain electrodes. The element isolating film is formed on a main surface of a semiconductor substrate, has a flat upper surface, is made of a plurality of layers, and has a predetermined opening. The pair of source/drain regions are formed on the main surface of the semiconductor substrate located in the opening, and are spaced by a predetermined distance to define a channel region therebetween. The gate electrode is formed on the channel region with a gate insulating film therebetween, fills a predetermined region in the opening of the element isolating film, and has an upper surface at the substantially same level as the upper surface of the element isolating film. The side wall insulating film surrounds the pair of source drain regions, and is formed along an inner side surface of the opening in the element isolating film and opposite side surfaces of the gate electrode. The pair of source/drain electrodes fill regions surrounded by the side wall insulating film, and are electrically connected to the pair of source/drain regions, respectively. The pair of source/drain electrodes have upper surfaces at the substantially same level as the upper surface of the element isolating film. The gate electrode and the pair of source/drain electrodes are electrically isolated by the side wall insulating film. In this semiconductor device, since the gate electrode fills the opening in the element isolating film having the flat upper surface, the end of the gate electrode is located in a self-aligned manner and thus does not protrude from the opening in the element isolating film. As a result it is not necessary to provide an alignment margin taking into consideration an alignment accuracy in contrast to the prior art, which allows integration to a higher extent. The opening in the element isolating film having the flat upper surface is filled with the gate electrode and the pair of source/drain electrodes, and the gate electrode and the pair of source/drain electrodes have the upper surfaces at the substantially same level as the upper surface of the element isolating film, so that a flat structure is formed as a whole. Consequently, interconnections and others formed above the flat structure can be patterned easily. In the semiconductor device described above, an impurity region of a conductivity type different from that of the source/drain regions may be formed in a buried manner only at the main surface of the semiconductor substrate located under the gate electrode. In this case, a punch-through phenomenon can be suppressed efficiently. In the semiconductor device described above, the gate electrode may include a U-shaped polycrystalline silicon layer formed on the gate insulating film and a metal silicide layer filling a space in the U-shaped polycrystalline silicon layer. In this case, the metal silicide layer which allows diffusion of impurity to a higher extent can promote diffusion of impurity into the polycrystalline silicon layer. In the semiconductor device described above, the element isolating film may be formed of a first insulating film, a conductive film formed thereon, and a second insulating film formed on the conductive film. In this case, the conductive film can achieve isolation of a field shield structure, and thus element isolating properties can be improved.

According to another aspect of the invention, a semiconductor device includes an element isolating film, a pair of source/drain regions, a gate electrode, a side wall insulating film, a pair of source/drain electrodes, and a gate interconnection. The gate interconnection is electrically connected to the gate electrode. The element isolating film includes a first insulating film formed on a main surface of the semiconductor substrate and a second insulating film formed on the first insulating film and having a groove. The gate interconnection fills the grove in the second insulating film, is formed integrally with the gate electrode, and has an upper surface at the substantially same level as the upper surface of the second insulating film. The gate interconnection and the gate electrodes are electrically isolated from the pair of source/drain electrodes by the side wall insulating film. In this semiconductor device, since not only the gate electrode and the pair of source/drain electrodes but also the gate interconnection are formed to fill the groove, the flatness of the element can be further improved. Since the gate electrode and the gate interconnection are formed integrally with each other, the gate electrode and the gate interconnection can be formed simultaneously. This simplifies a manufacturing process.

According to yet another aspect of the invention, a semiconductor device includes an element isolating film, a pair of source/drain regions, a gate electrode, a side wall insulating film, a pair of source/drain electrodes, and a gate interconnection. The element isolating film includes a first insulating film, a second insulating film and a third insulating film. The first insulating film is formed on a main surface of a semiconductor substrate. The second insulating film is formed on the first insulating film, and has a material different from that of the first insulating film. The third insulating film is formed on the second insulating film, and has a material different from that of the second insulating film. The gate interconnection fills the groove and is integral with the gate electrode. The gate interconnection has an upper surface at the substantially same level as an upper surface of the third insulating film, and has a film thickness substantially equal to a thickness of the third insulating film. The gate interconnection and the gate electrodes are electrically isolated from the pair of source/drain electrodes by the side wall insulating film.

According to the semiconductor device of the above aspect, the opening in the element isolating film having the flat upper surface is filled with the gate electrode and the pair of source/drain electrodes, and the groove formed at the second insulating film is filled with the gate interconnection, so that the flatness of the element can be improved. Since the gate interconnection and the gate electrode are integral with each other, the gate electrode and the gate interconnection can be formed simultaneously, which can simplify a manufacturing process. Further, the gate interconnection has the substantially same thickness as the third insulating film, the thickness of the gate interconnection can be controlled easily by controlling the thickness of the third insulating film.

According to further another aspect of the invention, a semiconductor device includes an element isolating film, a pair of source/drain regions, a gate electrode, a side wall insulating film, a pair of source/drain electrodes, an interconnection layer, a coupling groove, and a conductive film. The element isolating film has a flat upper surface, and also has a predetermined opening and a groove. The interconnection layer fills the groove in the element isolating film, and has an upper surface at the substantially same level as the upper surface of the element isolating film. The coupling groove is formed at the side wall insulating film located between one of the source/drain electrodes and the interconnection layer. The conductive film fills the coupling groove, and is provided for electrically connecting the one of the source/drain electrodes and the interconnection layer. The gate electrode is electrically isolated from the pair of source/drain electrodes by the side wall insulating film. In this semiconductor device, the gate electrode and the pair of source/drain electrodes are formed in the opening of the element isolating film having an upper surface, and the interconnection layer fills the groove in the element isolating film, so that the element can have a flat structure. Further, the interconnection layer is electrically connected to the one of the source/drain electrodes via the conductive layer filling the coupling groove, so that the connection layer connected to the source/drain electrodes can be formed easily.

According to a further aspect of the invention, a semiconductor device includes an element isolating film having a flat upper surface and a predetermined opening, a pair of source/drain regions, a gate electrode, a side wall insulating film, a pair of source/drain electrodes, and an interlayer insulating film. The interlayer insulating film is formed on the element isolating film, the gate electrode and the pair of source/drain electrodes. The element isolating film includes first and second insulating films. The first insulating film is formed on a main surface of a semiconductor substrate, and the second insulating film is formed on the first insulating film and has a material different from that of the first insulating film. The side wall insulating film is formed along an inner side surface of the opening in the element isolating film and opposite side surfaces of the gate electrode, and includes a first side wall insulating film and a second side wall insulating film. The first side wall insulating film is formed on the main surface of the semiconductor substrate. The second side wall insulating film is formed on the first side wall insulating film, and has the same material as the second insulating film. The interlayer insulating film has a material different from that of the second insulating film. A contact hole is formed at the interlayer insulating film, the second insulating film and the second side wall insulating film for exposing the upper and side surfaces of one of the source/drain electrodes. There is provided an interconnection having a portion filling the contact hole and being in electrical contact with the upper and side surfaces of the one of the source/drain electrodes. This semiconductor device is provided with the interconnection having the portion which is located in the contact hole and is in electrical contact with not only the upper surface but also the side surface of the source/drain electrode. Therefore, a contact area between the interconnection and the source/drain electrode can be increased, and thus a contact resistance can be reduced.

According to a method of manufacturing a semiconductor device of a further aspect of the invention, a first insulating film is formed on a main surface of a semiconductor substrate. A second insulating film having a material different from that of the first insulating film is formed on the first insulating film. Etching is effected on predetermined regions of the second and first insulating films to form a transistor opening for a transistor. A third insulating film having a material different from that of the second insulating film is formed to fill the transistor opening. A gate electrode opening for a gate electrode is formed at a predetermined region in the third insulating film. A gate insulating film is formed on the main surface of the semiconductor substrate located in the gate electrode opening. The gate electrode filling the gate electrode opening is formed on the gate insulating film in the gate electrode opening. A side wall insulating film is formed in contact with opposite side surfaces of the gate electrode after removing the third insulating film. Impurity is ion-implanted into the main surface of the semiconductor substrate in the transistor opening not provided with the gate electrode to form a pair of source/drain regions. A step is performed to form a pair of source/drain electrodes filling a region in the transistor opening not provided with the gate electrode and the side wall insulating film and electrically connected to the pair of source/drain regions, respectively. In this method of manufacturing the semiconductor device, since the gate electrode fills the gate electrode opening formed in the third insulating film, the gate electrode can be formed in a self-aligned manner, so that it is not necessary to provide an alignment margin taking an alignment accuracy of photolithography into consideration. This allows easy manufacturing of the semiconductor device which can be integrated to a higher extent. Since the gate electrode and the pair of source/drain electrodes are located in the transistor opening, flatness can be improved further, and patterning for forming interconnections and others in later steps can be performed easily. In the above manufacturing method, an impurity region of the conductivity type different from that of the source/drain regions may be formed by ion-implanting the impurity into the surface of the semiconductor substrate in the transistor opening using the third insulating film and the element isolating film as a mask, prior to the step of forming the gate insulating film. According to this manner, the impurity region which can suppress punch-through can be selectively formed in a self-aligned manner only immediately under the gate electrode. In the above manufacturing method, removal of the third insulating film may be performed in such a manner that the third insulating film is removed partially to leave the third insulating film thicker than the gate insulating film. This can prevent etching of the gate insulating film during etching for removing the third insulating film, so that separation of the gate electrode can be prevented. In this case, the remaining third insulating film can be removed by the overetching in the step of forming the side wall insulating film.

According to a method of manufacturing a semiconductor device of a further aspect of the invention, a first insulating film is formed on a main surface of a semiconductor substrate. A conductive film is formed on the first insulating film. A second insulating film is formed on the conductive film. Etching is effected on predetermined regions of the first insulating film, the conductive film and the second insulating film to form a transistor opening for a transistor. A third insulating film having a material different from that of the second insulating film is formed to fill the transistor opening. A gate electrode opening for a gate electrode is formed at a predetermined region in the third insulating film. A gate insulating film is formed on the main surface of the semiconductor substrate located in the gate electrode opening, and a fourth insulating film is formed at a side surface of the conductive film exposed at the side wall of the transistor opening. The gate electrode filling the gate electrode opening is formed on the gate insulating film in the gate electrode opening. A side wall insulating film is formed in contact with opposite side surfaces of the gate electrode after removing the third insulating film. Impurity is ion-implanted into the main surface of the semiconductor substrate in the transistor opening not provided with the gate electrode to form a pair of source/drain regions. A step is performed to form a pair of source/drain electrodes filling a region in the transistor opening not provided with the gate electrode and the side wall insulating film and electrically connected to the pair of source/drain regions, respectively. Since this method of manufacturing the semiconductor device forms the conductive film which is employed as an intermediate layer of the element isolating film, separation of the field-shield structure can be achieved, so that the semiconductor device can have excellent element isolating properties. Since the fourth insulating film is formed at the side surface of the conductive film exposed at the side wall of the transistor opening, electrical contact between the conductive film and the source/drain electrodes can be prevented.

According to a method of manufacturing a semiconductor device of a further aspect of the invention, a first insulating film is formed on a main surface of a semiconductor substrate. A second insulating film having a material different from that of the first insulating film is formed on the first insulating film. Etching is effected on predetermined regions of the first and second insulating films to form a transistor opening for a transistor. A third insulating film having a material different from that of the second insulating film is formed to fill the transistor opening. An interconnection groove for an interconnection not extending to the first insulating film is formed at a predetermined region in the second insulating film. A gate electrode opening for a gate electrode is formed at a predetermined region in the third insulating film. A gate insulating film is formed on the main surface of the semiconductor substrate located in the gate electrode opening. A step is performed for forming a conductive film filling the gate electrode opening and the interconnection groove and forming the gate electrode and the gate electrode interconnection. A side wall insulating film is formed on opposite side surfaces of the gate electrode after removing the third insulating film located in the transistor opening. Impurity is ion-implanted into the main surface of the semiconductor substrate in the transistor opening not provided with the gate electrode to form a pair of source/drain regions. A step is performed to form a pair of source/drain electrodes filling a region in the transistor opening not provided with the gate electrode and the side wall insulating film and electrically connected to the pair of source/drain regions, respectively. In this method of manufacturing the semiconductor device, since the conductive film forming the gate electrode and the gate electrode interconnection is formed to fill the gate electrode opening and the interconnection groove, the gate electrode and the gate electrode interconnection can be formed simultaneously, so that the manufacturing process can be simplified. Since the gate electrode fills the gate electrode opening, the end of the gate electrode can be formed in a self-aligned manner, so that it is not necessary to provide an alignment margin taking an alignment accuracy of photolithography into consideration. This allows easy manufacturing of the semiconductor device which can be integrated to a higher extent.

According to a method of manufacturing a semiconductor device of a further aspect of the invention, a first insulating film made of a silicon oxide film is formed on a main surface of a semiconductor substrate. A second insulating film made of a silicon nitride film is formed on the first insulating film. A third insulating film made of a silicon oxide film is formed on the second insulating film. Predetermined regions of the first, second and third insulating films are etched to form a transistor opening for a transistor. A fourth insulating film made of a silicon oxide film doped with phosphorus is formed to fill the transistor opening. The third and fourth insulating films are etched to form an interconnection groove for an interconnection reaching the second insulating film and a gate electrode opening for a gate electrode using a common etching mask. A gate insulating film is formed on the main surface of the semiconductor substrate located in the gate electrode opening. A conductive film forming the gate electrode and the gate electrode interconnection are formed to fill the gate electrode opening and the interconnection groove. The fourth insulating film located in the transistor opening is removed with a gas containing a vapor of hydrogen fluoride. A side wall insulating film is formed on opposite side surfaces of the gate electrode. Impurity is ion-implanted into the main surface of the semiconductor substrate in the transistor opening not provided with the gate electrode to form a pair of source/drain regions. A step is performed to form a pair of source/drain electrodes filling a region in the transistor opening not provided with the gate electrode and the side wall insulating film and electrically connected to the pair of source/drain regions, respectively. In this method of manufacturing the semiconductor device, since the gate electrode and the gate electrode interconnection fill the gate electrode opening and the interconnection groove, the structure integrally provided with the gate electrode and the gate electrode interconnection can be formed easily by a simplified manufacturing process. Since the gate electrode interconnection has a thickness substantially equal to a thickness of the third insulating film, the thickness of the gate electrode interconnection can be easily controlled by controlling the thickness of the third insulating film.

According to a method of manufacturing a semiconductor device of a further aspect of the invention, a first insulating film is formed on a main surface of a semiconductor substrate. A second insulating film having a material different from that of the first insulating film is formed on the first insulating film. Etching is effected on predetermined regions of the first and second insulating films to form a transistor opening for a transistor. A third insulating film having a material different from that of the second insulating is formed to fill the transistor opening. Predetermined regions of the second and third insulating films are etched to form a gate electrode opening for a gate electrode and an interconnection groove for an interconnection not extending to the first insulating film. A gate insulating film is formed on the main surface of the semiconductor substrate in the gate electrode opening. The gate electrode and a buried interconnection are formed to fill the gate electrode opening and the interconnection groove, respectively. A side wall insulating film is formed along opposite side surfaces of the gate electrode and an inner side surface of the transistor opening after removing the third insulating film located in the transistor opening. Impurity is ion-implanted into the main surface of the semiconductor substrate in the transistor opening not provided with the gate electrode to form a pair of source/drain regions. A step is performed to form a pair of source/drain electrodes filling a region in the transistor opening not provided with the gate electrode and the side wall insulating film and electrically connected to the pair of source/drain regions, respectively. A coupling groove is formed by removing the side wall insulating film located between the buried interconnection and the source/drain electrodes. A conductive film is formed to fill the coupling groove. In this method of manufacturing the semiconductor device, the conductive film filling the coupling groove is formed after forming the coupling groove by removing the side wall insulating film located between the buried interconnection and the source/drain electrode, so that the buried interconnection and the source/drain electrode can be connected easily.

According to a method of manufacturing a semiconductor device of a further aspect of the invention, a first insulating film is formed on a main surface of a semiconductor substrate. A second insulating film having a material different from that of the first insulating film is formed on the first insulating film. Etching is effected on predetermined regions of the first and second insulating films to form a transistor opening for a transistor. A third insulating film having a material different from that of the second insulating film is formed to fill the transistor opening. Predetermined regions of the second and third insulating films are etched to form a gate electrode opening for a gate electrode. A gate insulating film is formed on the main surface of the semiconductor substrate in the gate electrode opening. The gate electrode is formed to fill the gate electrode opening. A side wall insulating film is formed along opposite side surfaces of the gate electrode and an inner side surface of the transistor opening after removing the third insulating film located in the transistor opening. Impurity is ion-implanted into the main surface of the semiconductor substrate in the transistor opening not provided with the gate electrode to form a pair of source/drain regions. A step is performed to form a pair of source/drain electrodes filling a region in the transistor opening not provided with the gate electrode and the side wall insulating film and electrically connected to the pair of source/drain regions, respectively. An upper portion of the side wall insulating film is removed to form an insulating film groove. A fourth insulating film of the same material as the second insulating film is formed to fill the insulating film groove. An interlayer insulating film having a material different from that of the second insulating film is formed on the second and fourth insulating films, the pair of source/drain electrodes and the gate electrode. A contact hole is formed at a predetermined region in the interlayer insulating film. Upper portions of the second and fourth insulating films located at the bottom of the contact hole are etched to expose partially side surfaces of the source/drain electrode. A step is performed to form a source/drain electrode interconnection filling the contact hole and being in contact with the upper and side surfaces of the source/drain electrode. According to this method of manufacturing the semiconductor device, the source/drain electrode and the source/drain electrode interconnection are in contact with not only the upper surface of the source/drain electrodes interconnection but also the side surface of the same, so that a contact area can be large, and thus a contact resistance can be small. Since the material of the interlayer insulating film is different from that of the second insulating film located under the same, the upper portions of the second and fourth insulating films can be etched after forming the contact hole in the interlayer insulating film. Consequently, the etching quantities of the second and fourth insulating films can be controlled easily.

According to a method of manufacturing a semiconductor device of a further aspect of the invention, a first insulating film is formed on a main surface of a semiconductor substrate. A second insulating film having a material different from that of the first insulating film is formed on the first insulating film. Etching is effected on predetermined regions of the first and second insulating films to form a transistor opening for a transistor. A third insulating film having a material different from that of the second insulating film is formed to fill the transistor opening. Predetermined regions of the first and second insulating film and a predetermined region of the third insulating film are etched using the same etching mask to form an interconnection groove for an interconnection not extending to the semiconductor substrate in the first and second insulating film and to form a gate electrode opening for a gate electrode in the third insulating film. A gate insulating film is formed on the main surface of the semiconductor substrate in the gate electrode opening. A conductive film forming the gate electrode and the gate electrode interconnection is formed to fill the gate electrode opening and the interconnection groove. A side wall insulating film is formed on opposite side surfaces of the gate electrode after removing the third insulating film located in the transistor opening. Impurity is ion-implanted into the main surface of the semiconductor substrate in the transistor opening not provided with the gate electrode to form a pair of source/drain regions. A step is performed to form a pair of source/drain electrodes filling a region in the transistor opening not provided with the gate electrode and the side wall insulating film and electrically connected to the pair of source/drain regions, respectively. In this method of manufacturing the semiconductor device, since the conductive film forming the gate electrode and the gate electrode interconnection is formed to fill the gate electrode opening and the interconnection groove, the structure integrally provided with the gate electrode and the gate electrode interconnection can be formed easily. The same etching mask is used for etching the first and third insulating films as well as the second insulating film which is etched at a ratio different from those of the first and third insulating films, whereby the interconnection grooves not extending to the semiconductor substrate and the gate electrode opening are formed. Therefore, the manufacturing process can be simplified further.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
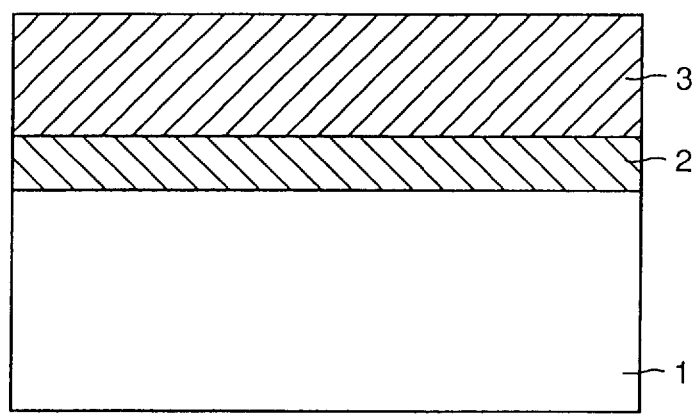
FIGS. 1 to 12 are cross sectional views and a plan view showing a process of manufacturing a semiconductor device of an embodiment 1 of the invention.

Embodiments of the invention will now be described below.

(Embodiment 1)

FIGS. 1 to 17 are cross sectional views, a plan view (lateral sectional view) and a perspective view showing a method of manufacturing a semiconductor device according to the embodiment 1 of the invention. Referring first to FIG. 14, a structure of the embodiment 1 will be described below. A pair of heavily doped impurity diffusion layers 13, which are spaced from each other by a predetermined distance to define a channel region therebetween, are formed at an active region of a main surface of a semiconductor substrate 1. Lightly doped impurity diffusion layers 11 are formed at opposite side ends of heavily doped impurity diffusion layers 13. Heavily doped impurity diffusion layers 13 and lightly doped impurity diffusion layers 11 form source/drain regions of an LDD structure. An ion-implanted layer 5a forming a channel stopper layer is formed adjacently to the active region. An ion-implanted layer 5b is buried under the active region. Ion-implanted layers 5a and 5b have a conductivity type opposite to that of the lightly doped impurity diffusion layer 11 and heavily doped impurity diffusion layer 13. A first insulating film 2 is formed on an element isolating region of semiconductor substrate 1. A second insulating film 3 is formed on first insulating film 2. First and second insulating films 2 and 3 form an element isolating film. First insulating film 2 is made of, e.g., a silicon oxide film and has a thickness of about 50 nm. Second insulating film 3 is made of, e.g., a silicon nitride film and has a thickness of about 400 nm.

Second insulating film 3 forming the element isolating film has a flat upper surface. A transistor opening 4 for forming a transistor is formed at regions of the first and second insulating films 2 and 3 located above the active region. Transistor opening 4 is filled with a gate electrode 10 and a pair of source/drain electrodes 14. Gate electrode 10 is formed on the channel region with a gate insulating film 9 therebetween. Source/drain electrodes 14 are in contact with heavily doped impurity diffusion layers 13. Side wall insulating films 12 are formed between gate electrode 10 and source/drain electrodes 14 and between source/drain electrodes 14 and first and second insulating films 2 and 3. Side wall insulating films 12 electrically isolate gate electrode 10 from paired source/drain electrodes 14.

The upper surfaces of gate electrode 10 and paired source/drain electrodes 14 are located at the substantially same level as the upper surface of second insulating film 3. Thus, the upper surfaces of second insulating film 3, gate electrode 10 and paired source/drain electrodes 14 are entirely flat. A barrier metal 15 and a first interconnection 16 are electrically connected to the upper surface of one of the source/drain electrodes 14. An interlayer insulating film 17 covers second insulating film 3, side wall insulating film 12, paired source/drain electrodes 14 and gate electrode 10. A contact hole 18 is formed at a region of interlayer insulating film located above the other of source/drain electrodes 14. There is formed a barrier metal 19 having a portion which is located in contact hole 18 and is in contact with the upper surface of the other of source/drain electrodes 14. A second interconnection 20 is formed on the upper surface of barrier metal 19.

Figure 131:
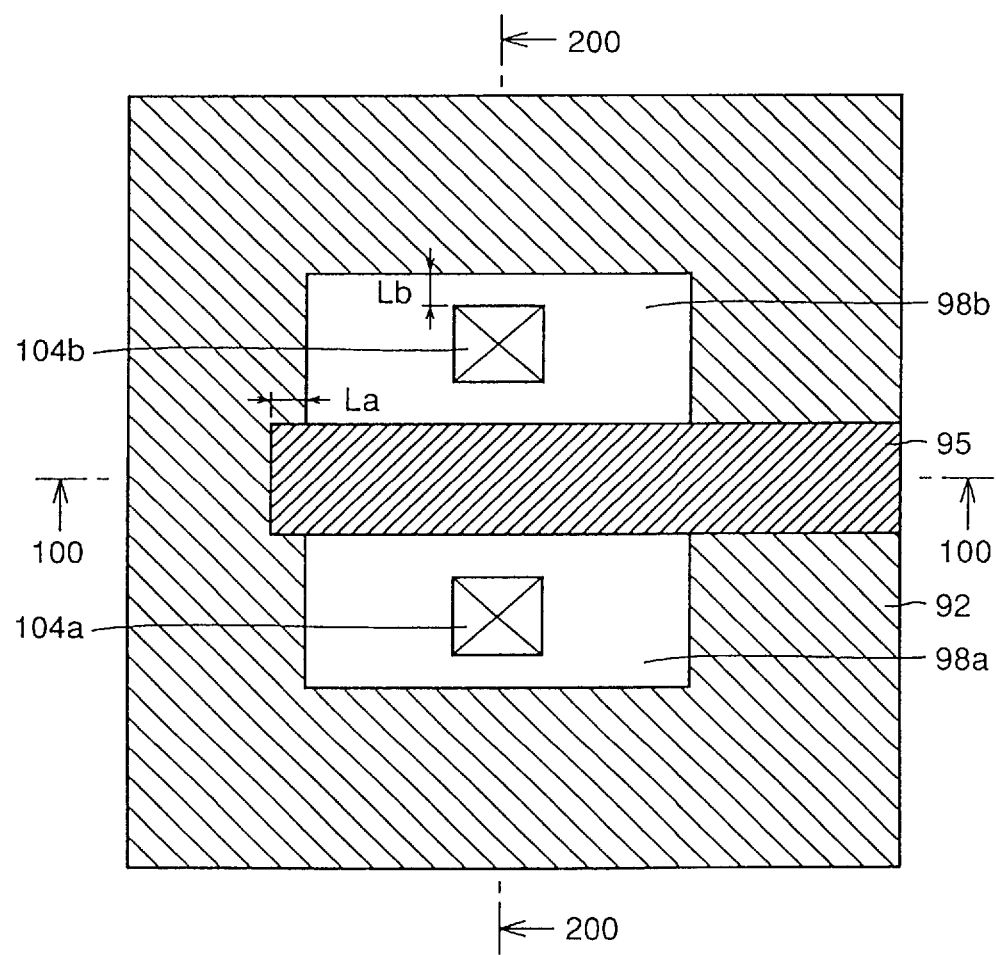
FIG. 131 is a plan view showing a structure of a conventional semiconductor device.
Figure 132:
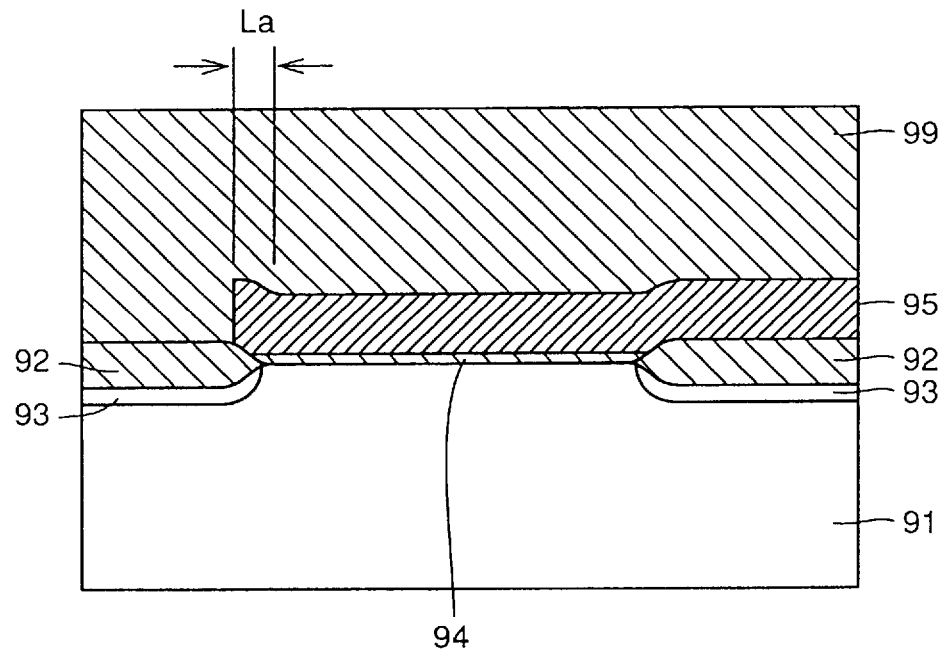
FIG. 132 is a cross sectional view taken along line 100—100 in FIG. 131.
Figure 133:
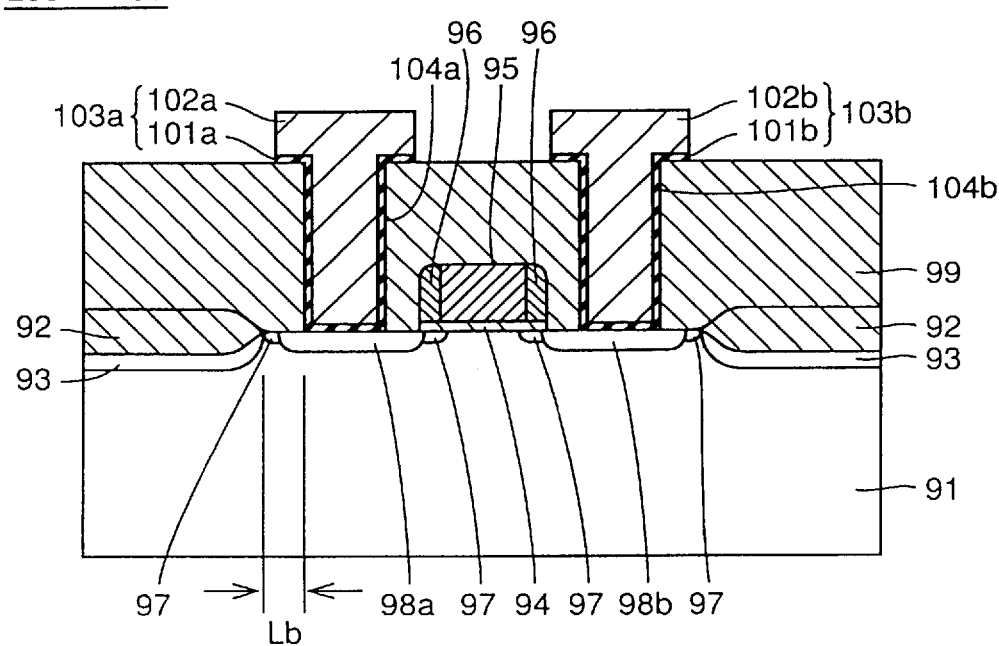
FIG. 133 is a cross sectional view taken along line 200—200 in FIG. 131.
Figure 134:
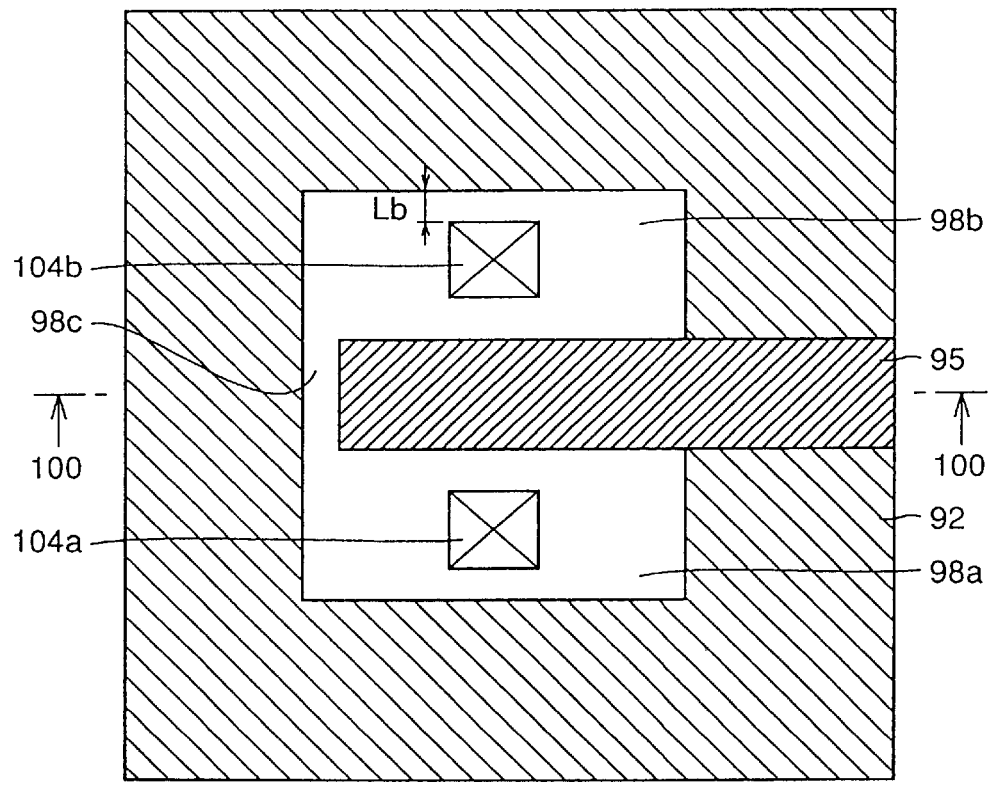
FIG. 134 is a plan view showing a problem caused by misalignment in a gate width direction.
Figure 135:
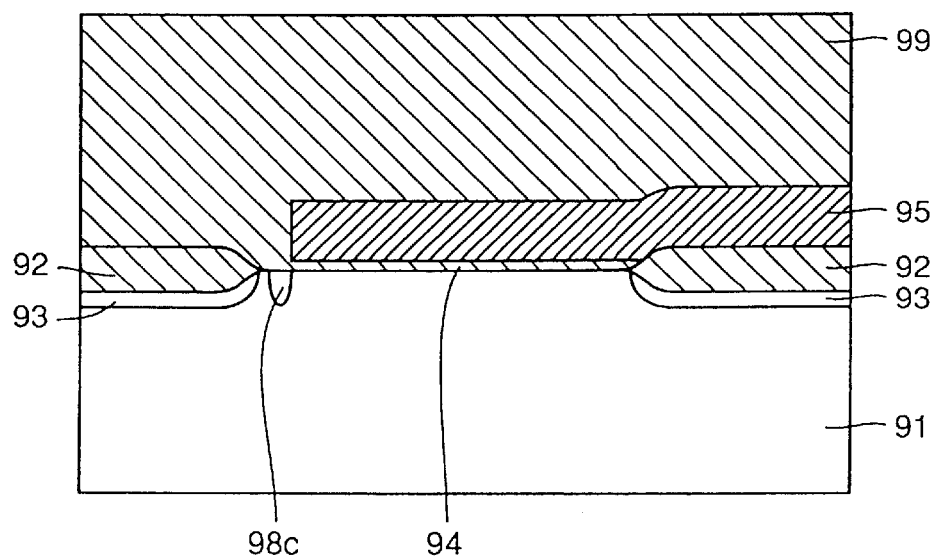
FIG. 135 is a cross sectional view taken along line 100—100 in FIG. 134.
Figure 136:
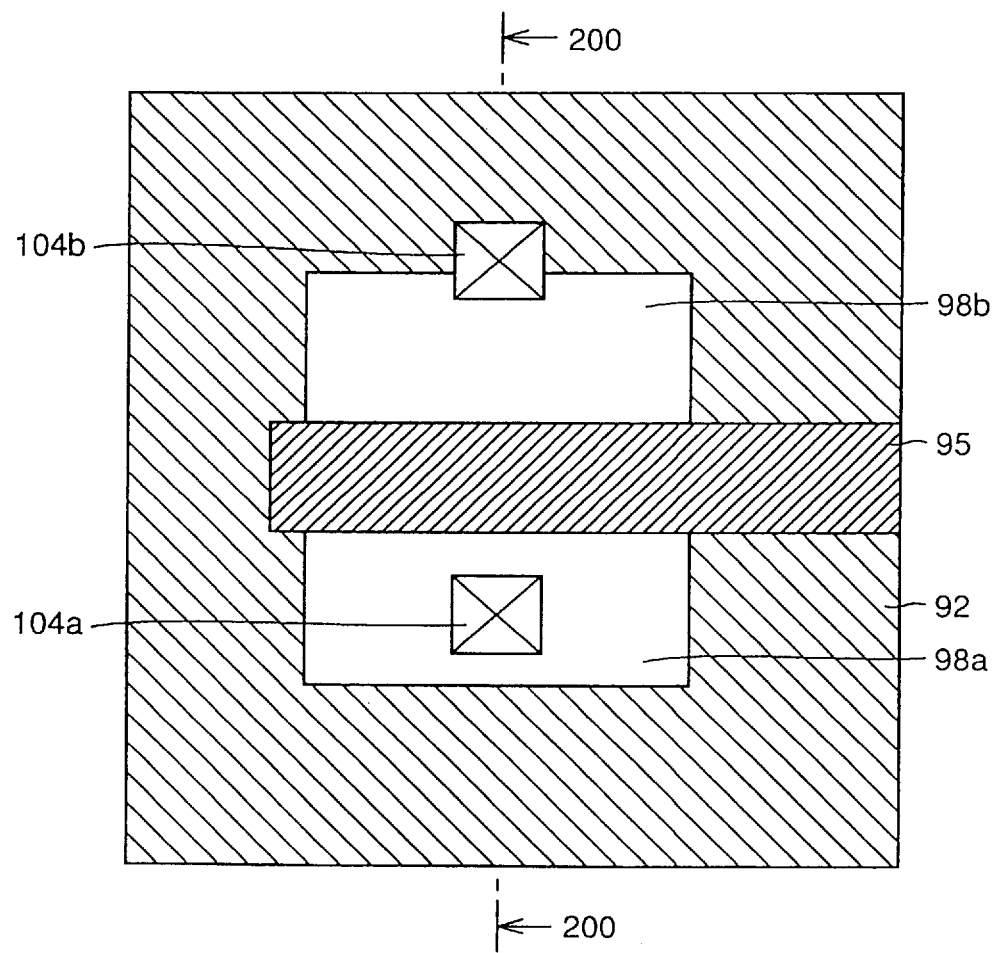
FIG. 136 is a plan view showing a problem caused by misalignment of a contact hole.
Figure 137:
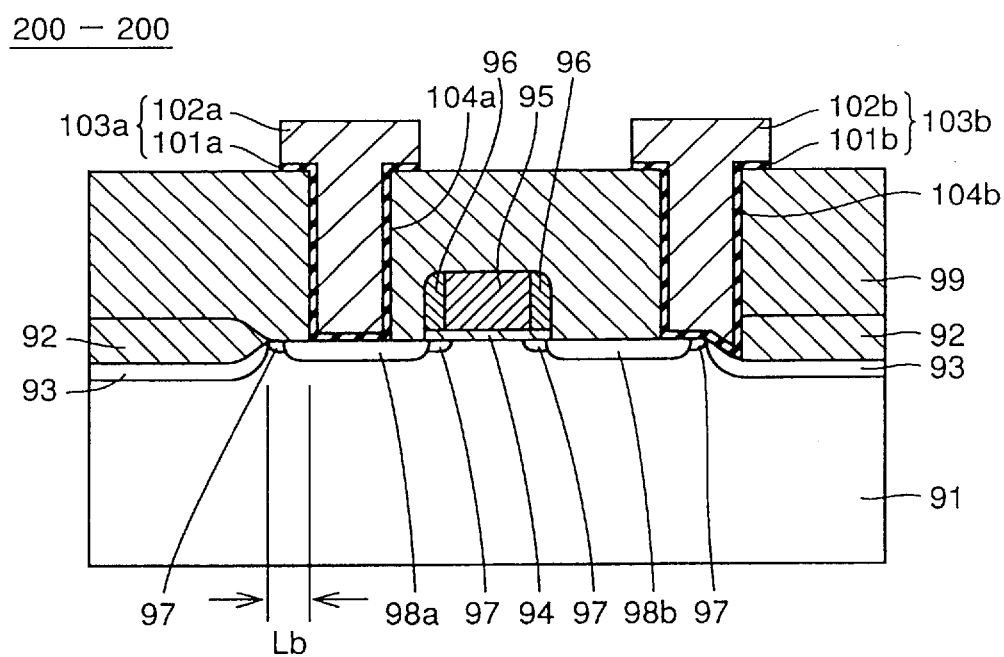
FIG. 137 is a cross sectional view taken along line 200—200 in FIG. 136.

According to the structure of the embodiment 1, as described above, gate electrode 10 is disposed inside transistor opening 4 which is formed in the first and second insulating films 2 and 3 forming the element isolating film. Therefore, the end of gate electrode 10 is defined in a self-aligned manner, and does not protrude from transistor opening 4. Accordingly, it is not necessary to provide alignment margin La taking an alignment accuracy of the gate electrode into consideration in contrast to the conventional structure shown in FIGS. 131 and 132. Consequently, the structure can be integrated to a higher extent owing to elimination of alignment margin La as compared with the prior art. Since the upper surfaces of gate electrode 10 and paired source/drain electrodes 14 filling transistor opening 4 are located at the substantially same level as the upper surface of the second insulating film 3, the flatness of the whole structure can be improved. This allows easy patterning for forming interconnections and others in later steps. In the structure of the embodiment 1, no problem arises even if the end of contact hole 18 is located over second insulating film 18 in contrast to the conventional structure shown in FIGS. 136 and 137. In the structure of the embodiment 1 shown in FIG. 14, contact hole 18 does not extend to semiconductor substrate 1, so that a junction is not destroyed in contrast to the conventional structure shown in FIGS. 136 and 137. Thus, in the structure of the embodiment 1 shown in FIG. 14, alignment margin Lb shown in FIGS. 131 and 134 may be 0 or negative. This also allows integration to a higher extent.

Referring to FIGS. 1 to 17, a process of manufacturing the semiconductor device of the embodiment 1 will be described below.

As shown in FIG. 1, first insulating film 2 of about 50 nm in thickness made of a silicon oxide film is formed on semiconductor substrate 1 by a CVD method or a thermal oxidation method. Second insulating film 3 of about 400 nm in thickness made of a material (e.g., silicon nitride) different from that of first insulating film 2 is formed on first insulating film 2. These two layered insulating films form the element isolating film.

Figure 2:
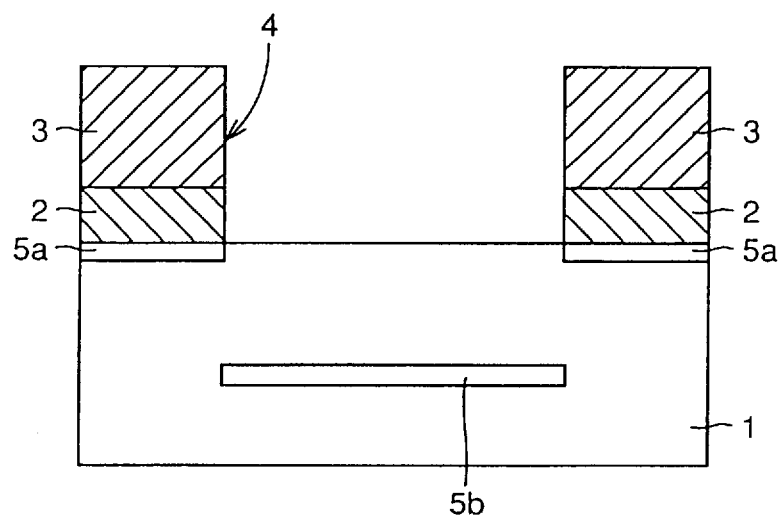

Then, as shown in FIG. 2, predetermined regions of the second and first insulating films 3 and 2 are successively etched by photolithography and an RIE (Reactive Ion Etching) method to form transistor opening 4 which extends to the surface of semiconductor substrate 1. Transistor opening 4 has sizes of, e.g., 1.2 $\mu$m×0.6 $\mu$m, in which case the gate width goes to 0.6 $\mu$m. In this state, ion-implantation is effected to implant boron (B) into a portion near an interface between first insulating film 2 and semiconductor substrate 1 under conditions of 100–300 keV and $1 \times 10^{12}$–$1 \times 10^{13}$ cm$^{-2}$, whereby a P-type ion-implanted layer 5a is formed. Ion-implanted layer 5a forms a channel stop layer, and thus has an effect of element isolation. Ion-implanted layer 5a can be formed in a self-aligned manner from the element isolating film (2 and 3). In this step, ion-implanted layer 5b is formed at a position which is located under transistor opening 4 and is lower by about hundreds nanometers than the surface of semiconductor substrate 1. Ion-implanted layer 5b does not affect transistor characteristics.

Figure 3:
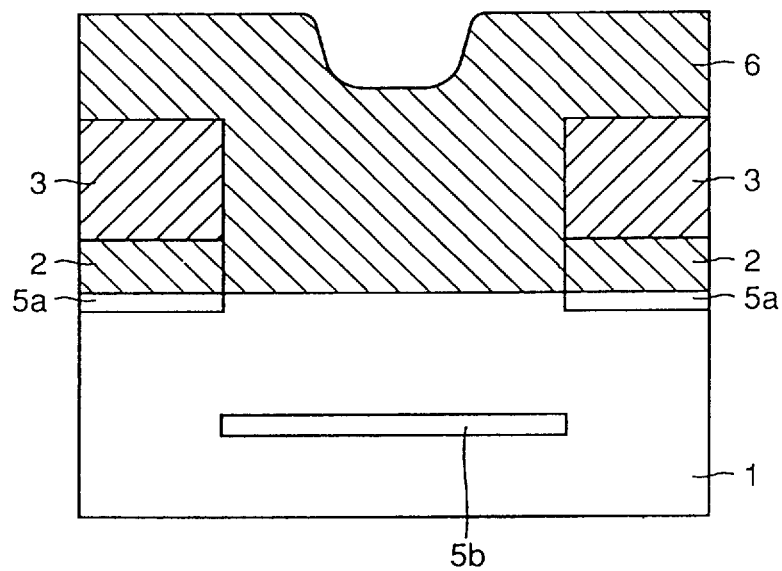
Figure 4:
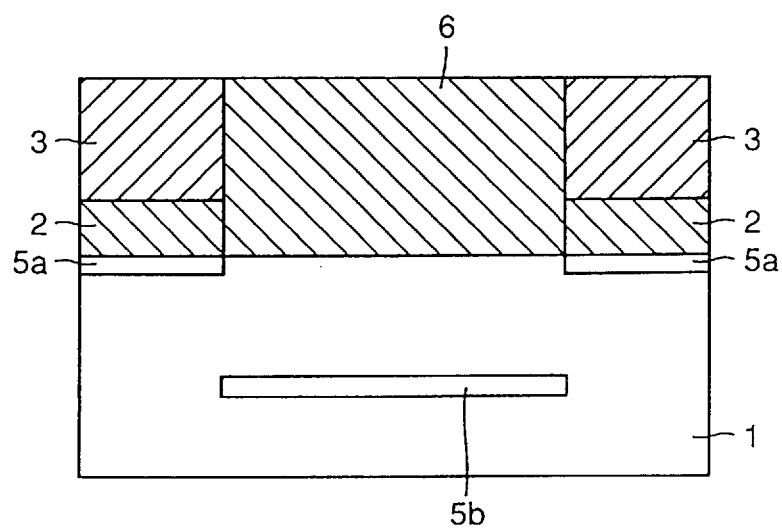

As shown in FIG. 3, third insulating film 6 of about 500 nm in thickness made of a material (e.g., silicon oxide) different from that of second insulating film 3 is formed by the CVD method. Third insulating film 6 is formed to fill transistor opening 4. Thereafter, an upper portion of third insulating film 6 is removed by a polishing method or an etchback method to leave selectively third insulating film 6 in transistor opening 4 as shown in FIG. 4. In the process of polishing third insulating film 6, second insulating film 3 made of a silicon nitride film functions as a stopper, so that it can be flattened easily.

Figure 5:
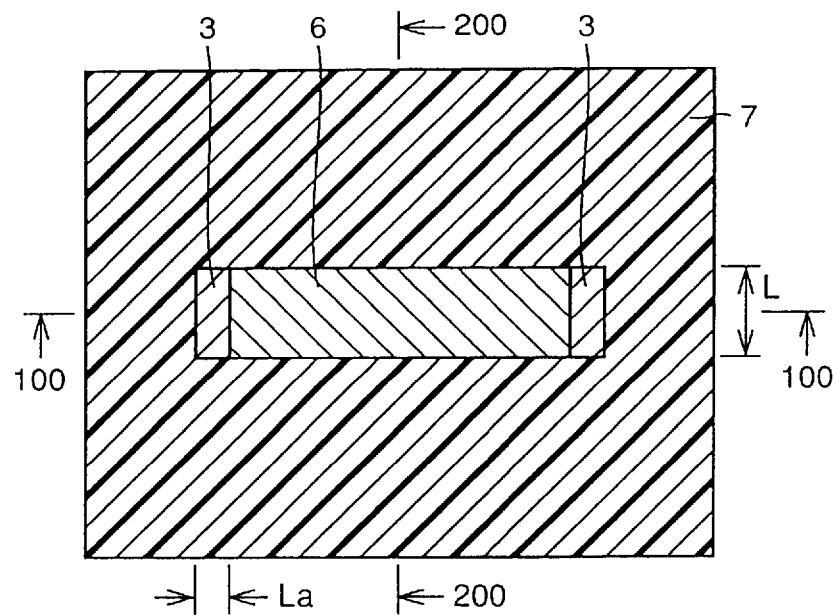

A photoresist 7 forming an etching mask for forming the gate electrode is formed by photolithography. FIG. 5 is a plan showing this step. A pattern of photoresist 7 has a configuration by which an opening for the gate electrode can be formed, and a pattern of the opening for the gate electrode has a length in the direction along line 100—100 longer than that of third insulating film 6 in the same direction. Therefore, third and second insulating films 6 and 3 are partially exposed through the opening in photoresist 7 as shown in FIG. 5. A width of each exposed portion of second insulating film 3 is equal to margin La which is determined taking the alignment accuracy of photolithography into consideration. For example, a width L of the opening of photoresist 7 in the direction along line 200—200 in FIG. 5 is 0.3 $\mu$m. Width L determines and equals a gate length. A length of the gate electrode in the direction along line 100—100 is referred to as the gate width, and a length thereof in the direction along line 200—200 is referred to as the gate length.

Figure 6:
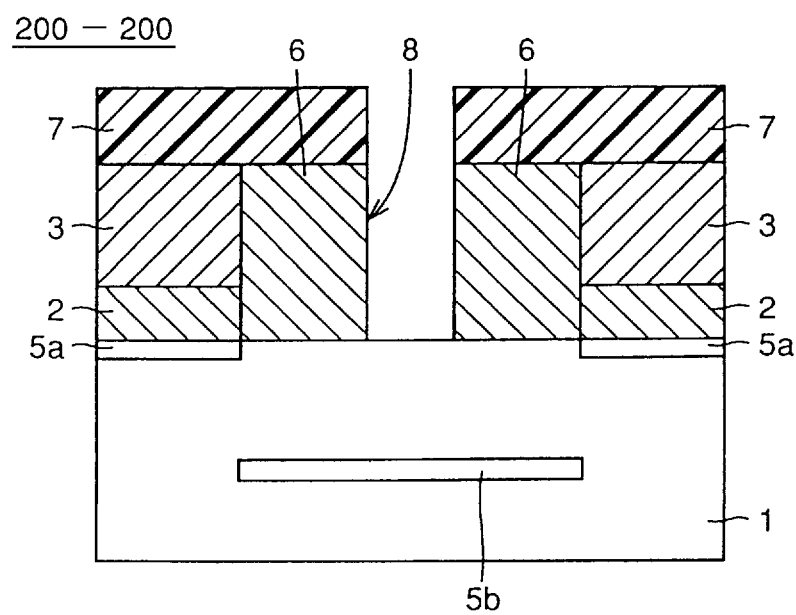

Thereafter, third insulating film 6 is selectively etched using photoresist 7 as a mask, whereby a gate electrode opening 8, i.e., opening for gate electrode is formed as shown in FIG. 6. FIG. 6 is a cross section taken along line 200—200 in FIG. 5. In the step of forming gate electrode opening 8, only third insulating film 6 can be selectively removed even when the etching is performed using photoresist 7 as a mask, because second insulating film 3 (silicon nitride film) is made of the material different from that of third insulating film (silicon oxide film). Thereafter, photoresist 7 is removed.

Figure 7:
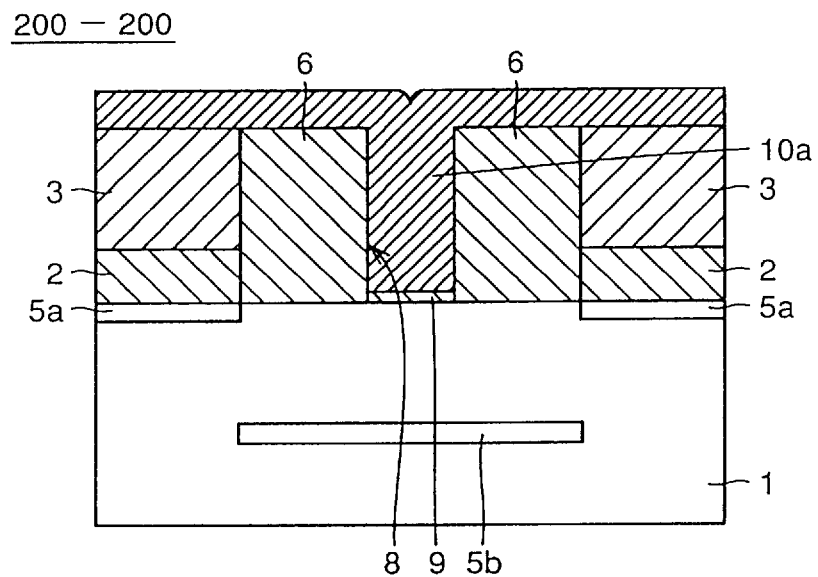

As shown in FIG. 7, gate insulating film 9 of 5 nm in thickness made of, e.g., a silicon oxide film is formed on the main surface of semiconductor substrate 1 in gate electrode opening 8 by the thermal oxidation method or CVD method. When the CVD method is used to form gate insulating film 9, gate insulating film 9 is formed also on the side wall of gate electrode opening 8. However, a portion of gate electrode opening 8 other than the portion for gate electrode is covered with third insulating film 6. Therefore, the resultant structure is substantially equal to the structure in which gate insulating film 9 is selectively formed on the surface of the channel region of the transistor in semiconductor substrate 1.

Figure 8:
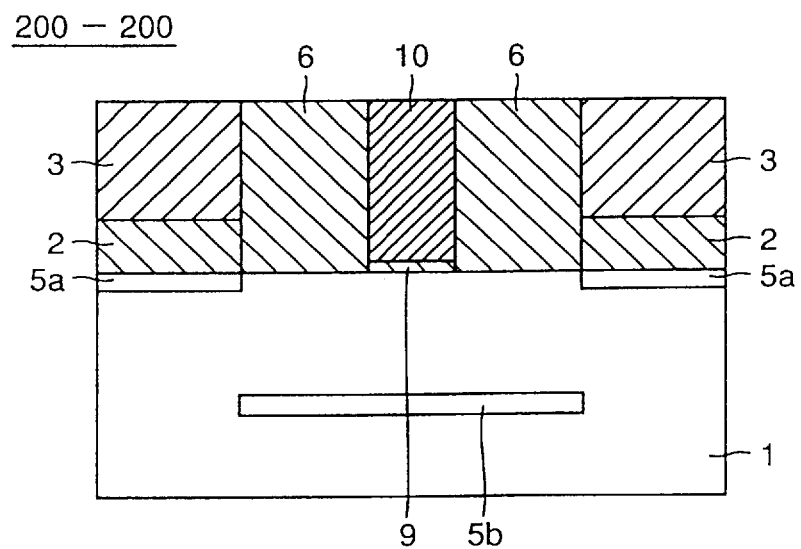

Then, an electrically conductive film 10a of 0.5 μm or more made of, e.g., a polycrystalline silicon layer, a metal silicide layer or a metal nitride film is formed by the CVD method to fill gate electrode opening 8 with conductive film 10a. The upper surface of conductive film 10a is polished or etched back to leave conductive film 10a only in gate electrode opening 8, whereby gate electrode 10 is completed as shown in FIG. 8. In this manner, gate electrode 10 is selectively formed in a self-aligned manner on selectively formed gate insulating film 9. The sizes of gate electrode 10 is determined by the sizes of gate electrode opening 8. In this case, the gate length is 0.3 μm, and the gate width is 0.6 μm. In this step, gate electrode 10 is formed on gate insulating film 9, but gate electrode 10 is not etched owing to use of thin gate insulating film 9 as an etching stopper in contrast to the conventional manufacturing method. Therefore, such a problem does not occur that gate insulating film 9 disappears during the etching and thus the surface of semiconductor substrate 1 is etched.

Figure 9:
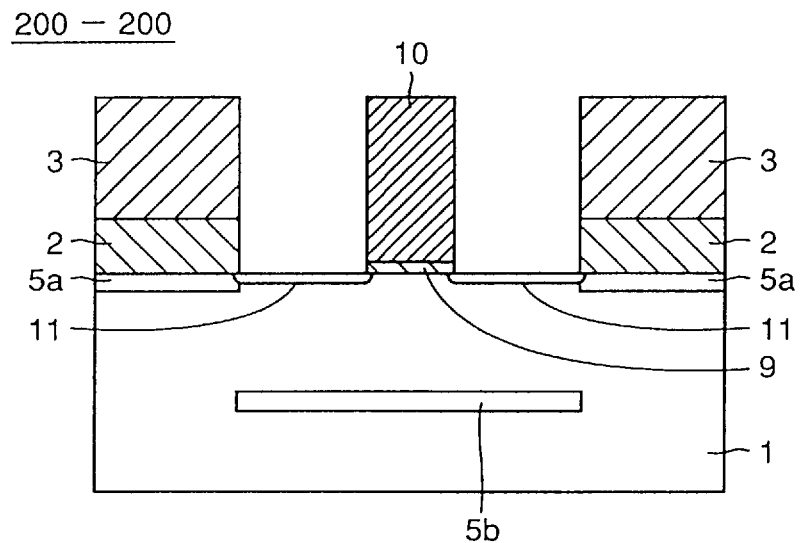

Then, third insulating film 6 is removed using second insulating film 3 as an etching mask, so that a structure shown in FIG. 9 is formed. Using first insulating film 2, second insulating film 3 and gate electrode 10 as a mask, arsenic (As), phosphorus (P) or the like is ion-implanted under the conditions of tens kilo-electron-volt and $1\times10^{13}$–$1\times10^{14}$ cm$^{-2}$ to form lightly doped impurity diffusion layers 11.

Figure 10:
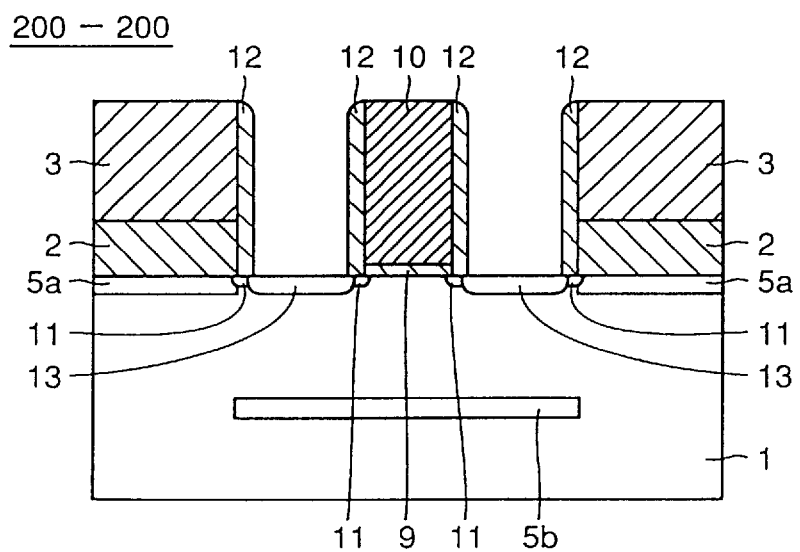
Figure 11:
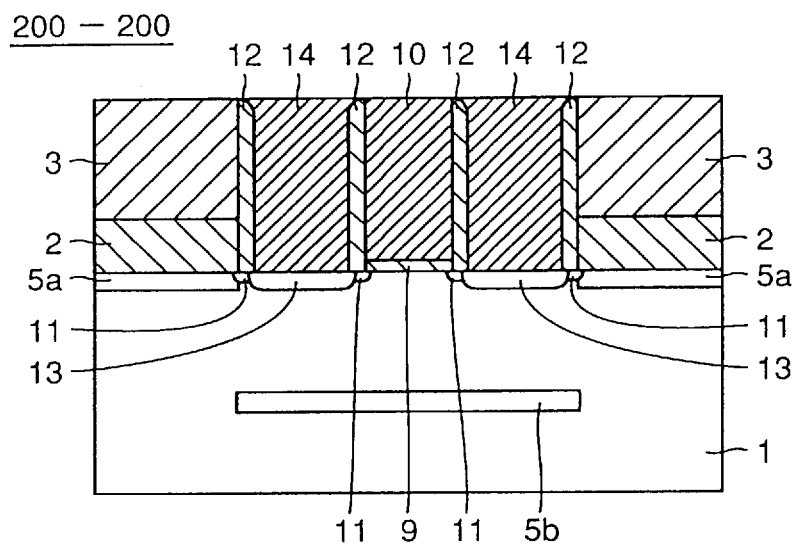

Thereafter, an insulating film (not shown) of 50 nm in thickness made of, e.g., a silicon oxide film is formed by the CVD method, and then this insulating film is etched by the RIE method to form side wall insulating films 12 of a configuration shown in FIG. 10. Thereafter, arsenic (As), phosphorus (P) or the like is ion-implanted under the conditions of tens kilo-electron-volt and $1\times10^{15}$–$1\times10^{16}$ cm$^{-2}$ to form heavily doped impurity diffusion layers 13, using side wall insulating films 12, first insulating film 2, second insulating film 3 and gate electrode 10 as a mask. Lightly doped impurity diffusion regions 11 and heavily doped impurity diffusion layers 13 form source/drain regions having a conventional LDD structure. Thereafter, a manner similar to that of forming gate electrode 10 already described with reference to FIGS. 7 and 8 is executed to form the conductive film (e.g., polycrystalline silicon layer, metal silicide layer or metal nitride film) by the CVD method, and polishing or etchback is performed to form source/drain electrodes 14 which fill portions of transistor opening 4 not occupied by gate electrode 10 as shown in FIG. 11. Gate electrode 10 is electrically isolated from paired source/drain electrodes 14 by side wall insulating films 12. Side wall insulating films 12 and paired source/drain electrodes 14, which are formed after formation of gate electrode 10 are formed in a self-aligned manner, so that photolithography is not required. Therefore, source/drain electrodes 14 of sizes smaller than the limit of photolithography can be formed.

Figure 12:
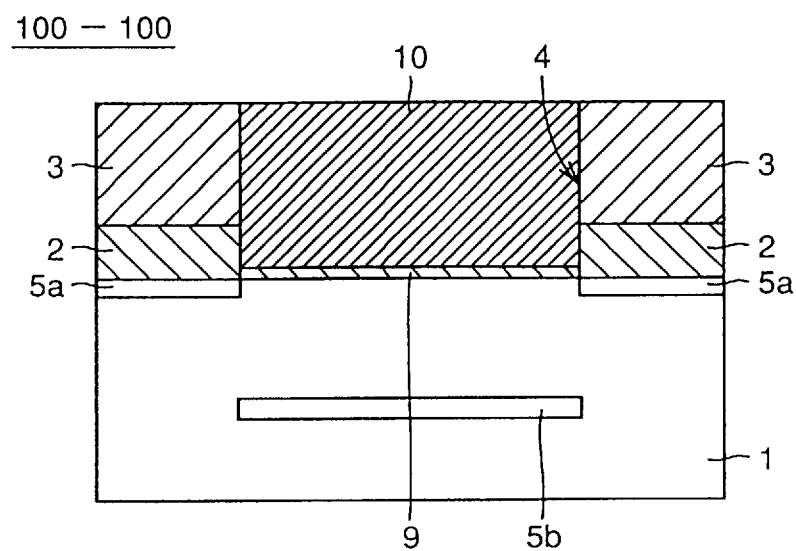

FIG. 12 is a cross sectional view taken along line 100—100 in FIG. 5 and showing the same step as that in FIG. 11. Referring to FIGS. 11 and 12, gate electrode 10 in this embodiment 1 differs from the conventional gate electrode in that it is formed inside transistor opening 4 formed in the element isolating film, so that the end of gate electrode 10 is defined in a self-aligned manner. Therefore, the end of gate electrode 10 does not protrude from the transistor opening 4. Thus, alignment margin La, which is taken into consideration for photoresist 7 in FIG. 5, will be substantially 0 in the finished semiconductor device.

Figure 13:
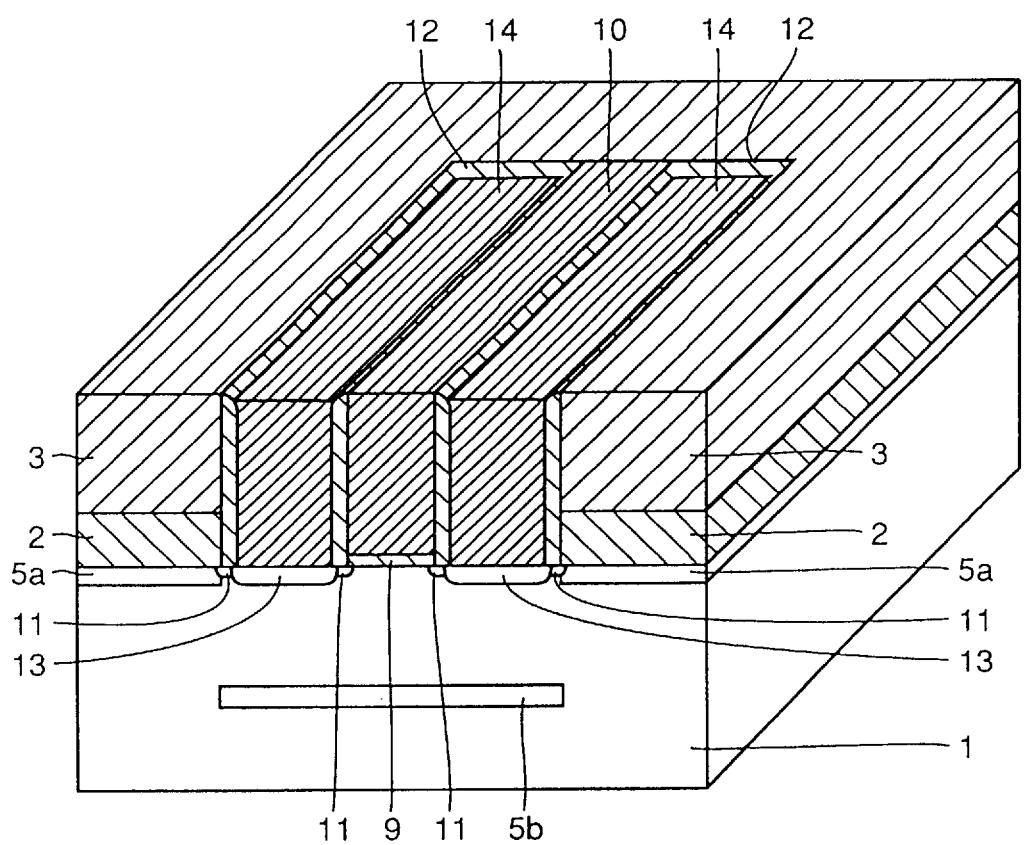
FIG. 13 is a perspective view showing a process of manufacturing a semiconductor device of an embodiment 1 of the invention.
Figure 14:
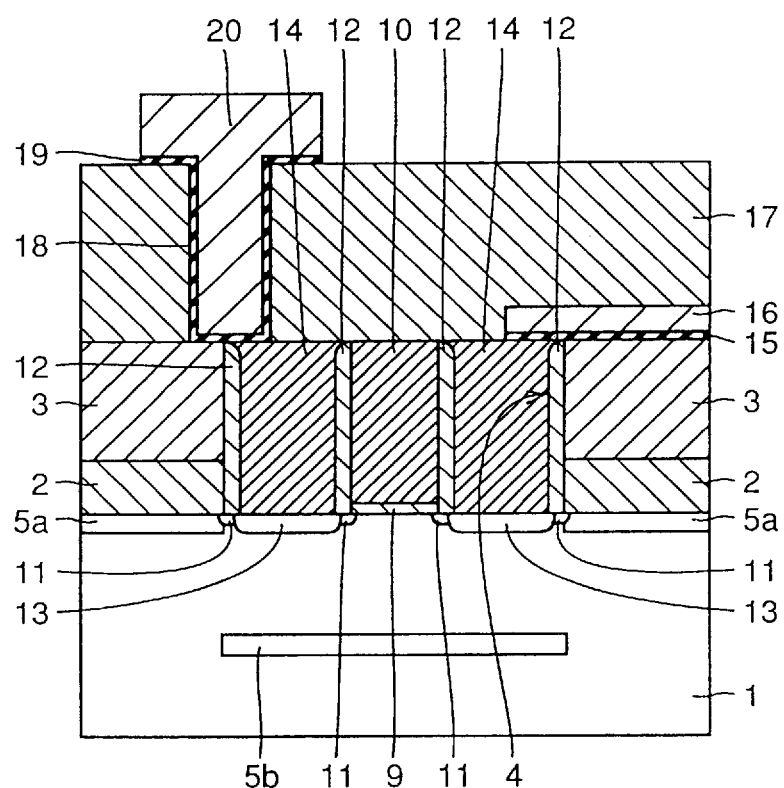
FIG. 14 is a cross sectional view showing a process of manufacturing a semiconductor device of an embodiment 1 of the invention.

FIG. 13 is a perspective view showing the step in FIGS. 11 and 12. In the structure of this embodiment 1 shown in FIG. 13, gate electrode 10 and paired source/drain electrodes 14, which form the transistor, fill the region defined by the element isolating film (2 and 3), and the semiconductor device has a completely flat configuration. According to the steps described above, a major portion of the MISFET is formed. Thereafter, conductive interconnections for supplying appropriate potentials to respective electrodes are formed in a manner similar to that for the conventional semiconductor device.

More specifically, after forming barrier metal 15 of about 100 nm in thickness made of TiN by the CVD method, PVD method or the like as shown in FIG. 14, first interconnection 16 of about 400 nm in thickness made of aluminum alloy is formed on barrier metal 15, e.g., by the PVD or CVD method. First interconnection 16 is connected to gate electrode 10 or one of paired source/drain electrodes 14. In the structure shown in FIG. 14, first interconnection 16 is connected to one of source/drain electrodes 14. After forming interlayer insulating film 17 of about 800 nm in thickness made of, e.g., a silicon oxide film by the CVD method or the like, contact hole 18 is formed. After forming barrier metal 19 in contact hole 18, a second interconnection 20 made of a conductive film such as an aluminum alloy film is formed. Second interconnection 20 is connected to one of the electrodes. In the structure shown in FIG. 14, it is connected to the other of source/drain electrodes 14. As shown in FIG. 14, the end of contact hole 18 is located over second insulating film 3 forming the element isolating film.

In the embodiment 1 described above, ion-implanted layer 5a forming the channel stop layer is formed after forming the element isolating film (2 and 3). However, the invention is not restricted to this, and the element isolating film (2 and 3) may be formed after forming ion-implanted layer 5a functioning as the channel stop layer. More specifically, the element isolating film (2 and 3) shown in FIG. 1 may be formed after ion-implanted layer 5a forming the channel stop layer is formed by ion implantation of, e.g., boron into semiconductor substrate 1 under the conditions of 10–20 keV and $1\times10^{12}$–$1\times10^{13}$ cm$^{-2}$.

As described above, this embodiment 1 employs the element isolating film of a two-layer structure, which is formed of first insulating layer 2 made of the silicon oxide film and second insulating film 3 made of the silicon nitride film. The reason for this is as follows. If a silicon nitride film were in direct contact with semiconductor substrate 1, unnecessary interface level would occur, and thus isolation properties would be impaired. The silicon nitride film is formed as the upper layer by the following reason. In the step of flattening third insulating film 6 by polishing, flattening can be effected more technically easily on such a structure that third insulating film 6 to be polished is formed of the silicon oxide film, and second insulating film 3 forming the polishing stop is formed of the silicon nitride film having a lower polishing rate.

Although the NMISFET has been described as an example of the embodiment, the invention may naturally be applied to a PMISFET. The semiconductor substrate may be an SOI (Silicon On Insulator) substrate. Although the embodiment has been described in connection with the MISFET of the LDD structure, the invention is not restricted to this, and may be applied to an MISFET in which only lightly doped impurity diffusion layers 11 or heavily doped impurity diffusion layers 13 are formed.

Each of source/drain electrodes 14 may be a metal nitride film made of, e.g., TiN or a layered film made of a metal nitride film and a metal silicide film. If a metal silicide layer is formed on heavily doped impurity diffusion layer 13, a thermal processing at a later step (e.g., thermal processing for reflow in the case where interlayer insulating film 17 is made of a BPSG film) may cause diffusion of impurity contained in heavily doped impurity diffusion layers 13 into source/drain electrodes 14, which reduces a concentration of impurity in heavily doped impurity diffusion layers 13. Source/drain electrodes 14 made of metal nitride films can prevent diffusion of impurity. However, it is preferable to form a titanium silicide layer of about 20 nm in thickness at an interface between the metal nitride film and heavily doped impurity diffusion layer 13 so as to prevent increase of a contact resistance between the metal nitride film and heavily doped impurity diffusion layer 13.

Gate electrode 10 and source/drain electrodes 14 may be made of films or layers other than polycrystalline silicon layers, and specifically may be amorphous silicon layers, metal silicide layers (e.g., $TiSi_2$, $MoSi_2$, $WSi_2$, $TaSi_2$, $CoSi_2$, $NiSi_2$, $PtSi_2$ or $PdSi_2$), metal nitride films (e.g., TiN, TaN, WN or MoN), metal film (e.g., W, Mo, Ta, Ni, Ti, Co, Al, Cu) or layered films formed of combination of them. The metal silicide film may be formed by the CVD method or by Salicide method. The conductive film forming each electrode may contain impurity such as P, As or B. These impurity may be added into the conductive film by mixing gases such as $AsH_3$, $PH_3$, $B_2H_6$ containing these elements in the deposition process, or by ion implantation. Lightly and heavily doped impurity diffusion layers 11 and 13 may be formed by diffusion of impurity from the conductive film containing the same. Lightly doped impurity diffusion layer 11 may be formed in such a manner that side wall insulating film 12 made of a PSG film is formed and then phosphorus (P) is diffused from the side wall insulating film 12. Gate insulating film 9 may be a film other than the silicon oxide film, and specifically may be a silicon nitride film or a layered film formed of a silicon nitride film and a silicon oxide film.

In the MISFET of the embodiment 1, gate electrode 10 is isolated from source/drain electrodes 14 by side wall insulating films 12. Side wall insulating film 12 generally has a tapered upper portion. Thus, a portion of side wall insulating film 12 at a higher level has a smaller thickness. Therefore, a higher portion of side wall insulating film 12 may have more insufficient insulating properties.

Figure 15:
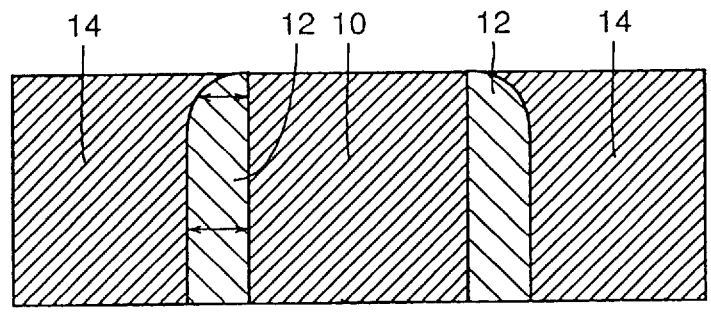
FIGS. 15 to 17 are enlarged cross sectional views showing a process of manufacturing a semiconductor device of an embodiment 1 of the invention.
Figure 16:
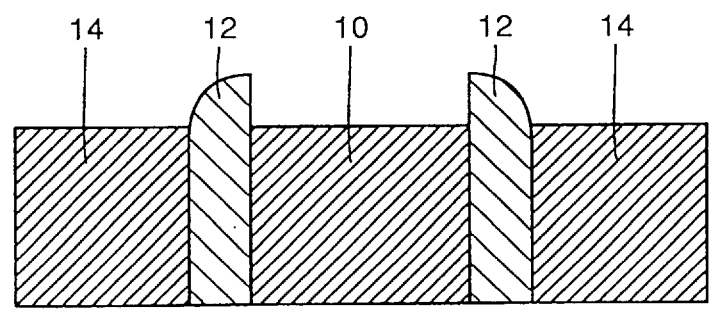
Figure 17:
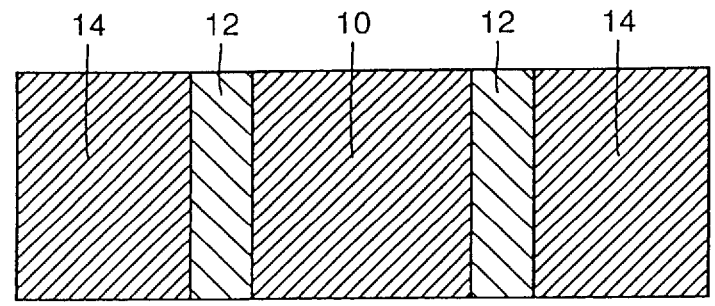

FIG. 15 is a cross sectional view showing, on an enlarge scale, a portion at which gate electrode 10 is isolated from source/drain electrodes 14 by side wall insulating films 12, and which corresponds to the step in FIG. 11. After the step shown in FIGS. 11 and 15, gate electrode 10 and source/drain electrodes 14 may be etched by a thickness corresponding to the thickness of side wall insulating film 12 for ensuring insulation between gate electrode 16 and source/drain electrodes 14 as shown in FIG. 16. Simultaneously, side wall insulating film 12 and second insulating film 3 (see FIG. 11) may be polished and flattened, whereby a structure shown in FIG. 17 is formed. The manufacturing process shown in FIGS. 15 to 17 may be employed. This can further ensure insulation between gate electrode 10 and source/drain electrodes 14.

Since the embodiment 1 does not employ the conventional LOCOS isolation but employs the element isolation film made of two-layered flat insulating film, it is possible to prevent a so-called narrow channel effect, i.e., reduction of the substantial gate width due to a bird's beak which may occur in the case of LOCOS isolation. Since the MISFET in the embodiment 1 has the completely flat structure, such an advantage can also be achieved that patterning for interconnections on the above transistor can be performed easily.

Figure 18:
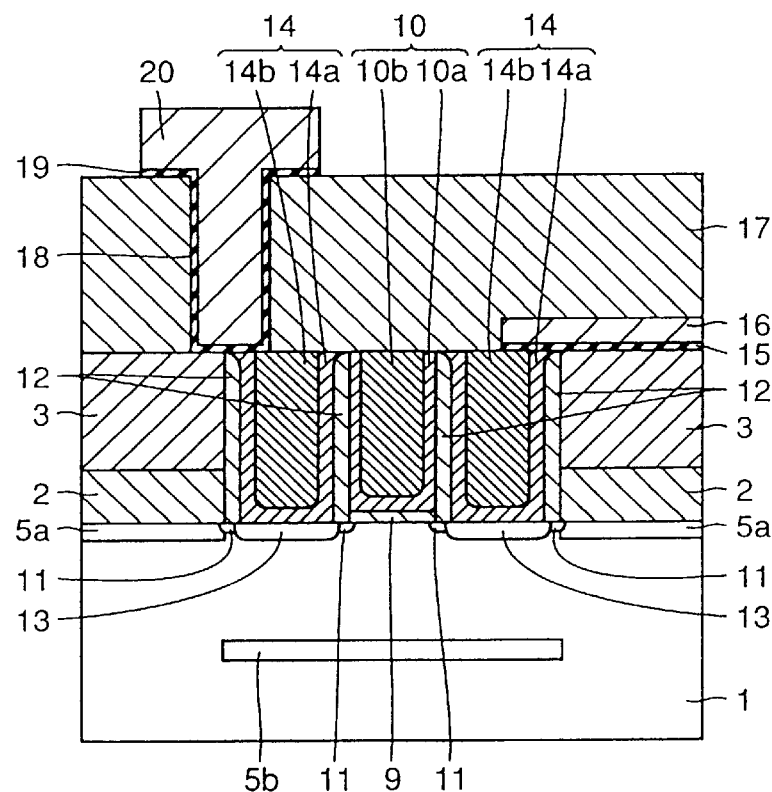
FIG. 18 is a cross sectional view showing a modification of the semiconductor device of the embodiment 1 of the invention.
Figure 19:
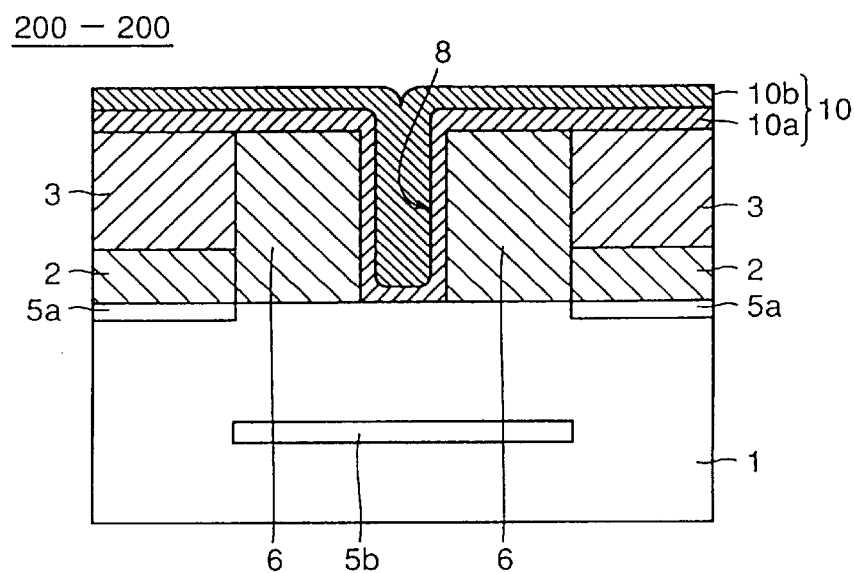
FIGS. 19 to 22 are cross sectional views showing a process of manufacturing the semiconductor device shown in FIG. 18.
Figure 20:
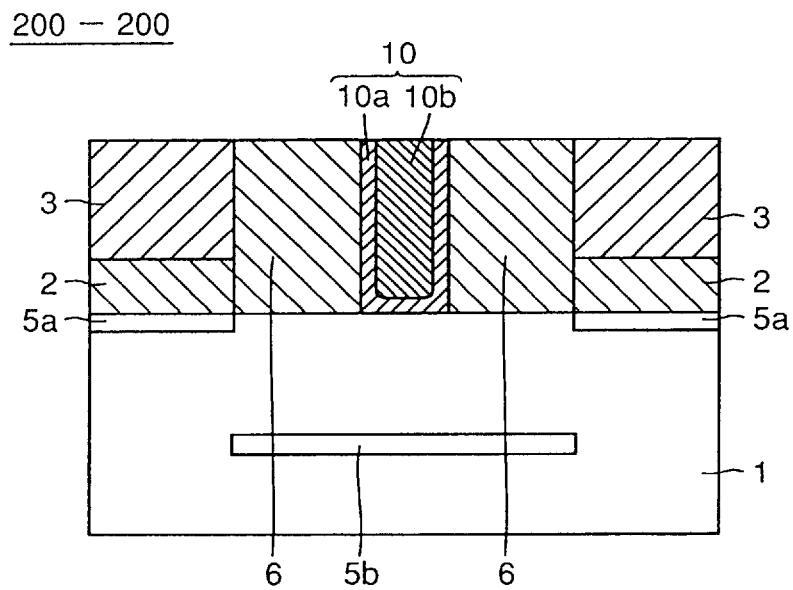
Figure 21:
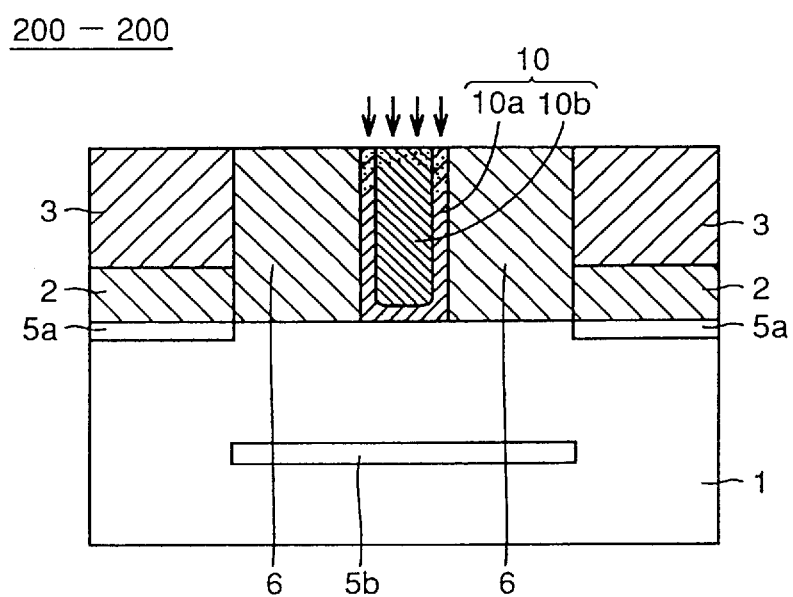
Figure 22:
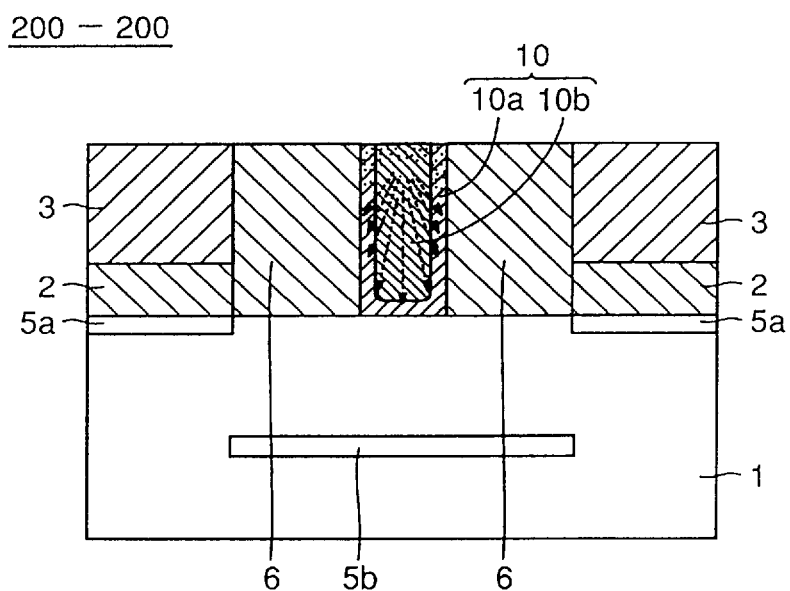

As shown in FIG. 18, gate electrode 10 may be formed of a polycrystalline silicon layer 10a and a metal silicide layer 10b, and each of source/drain electrodes 14 may be formed of a polycrystalline silicon layer 14a and a metal silicide layer 14b. In this case, polycrystalline silicon layers 10a and 14a have U-shaped sections, and metal silicide layers 10b and 14b fill spaces in polycrystalline silicon layers 10a and 14a, respectively. Specific steps for manufacturing gate electrode 10 will now be described below with reference to FIGS. 19 to 22. As shown in FIG. 19, if gate electrode opening 8, i.e., opening for the gate electrode has a width of 0.3 μm (300 nm) in the direction taken along line 200—200, polycrystalline silicon layer 10a of about 50 nm in thickness is formed along the bottom and side surfaces of gate electrode opening 8 and the upper surfaces of third and second insulating films 6 and 3. Metal silicide layer 10b of 100 nm or more in thickness made of, e.g., $WSi_2$ or $TiSi_2$ is formed on polycrystalline silicon layer 10a. Metal silicide layer 10b thus formed has a portion filling a space in the U-shaped portion of polycrystalline silicon layer 10a. Thereafter, CMP (Chemical Mechanical Polishing) or etchback is performed to remove selectively upper portions of metal silicide layer 10b and polycrystalline silicon layer 10a, so that the configuration shown in FIG. 20 is completed. Thereafter, impurity such as (As) or (P) is ion-implanted into polycrystalline silicon layer 10a and metal silicide layer 10b as shown in FIG. 21. Owing to this ion implantation, a larger amount of impurity is implanted into a deeper portion of polycrystalline silicon layer 10a, and thus is distributed as shown in FIG. 22. An impurity diffusion effect in metal silicide layer 10b is good in contrast to the fact that the impurity diffusion effect in polycrystalline silicon layer 10b is not good. Therefore, thermal processing at 800°–850° C. is performed for 20 to 60 minutes, so that impurity implanted into an upper portion of metal silicide layer 10b diffuses uniformly into metal silicide layer 10b and also diffuses into the side and bottom portions of polycrystalline silicon layer 10a, as shown in FIG. 22. Therefore, impurity uniformly diffuses also into polycrystalline silicon layer 10a. Owing to the structure in which gate electrode 10 is formed of U-shaped polycrystalline silicon layer 10a and metal silicide layer 10b filling the space thereof and having a good impurity diffusion effect as described above, impurity can be diffused uniformly into polycrystalline silicon layer 10a. Therefore, it is possible to prevent such a problem that, when a voltage is applied to the gate electrode, the polycrystalline silicon layer is deplete and a Vth of the MISFET unnecessarily increases.

(Embodiment 2)

Figure 23:
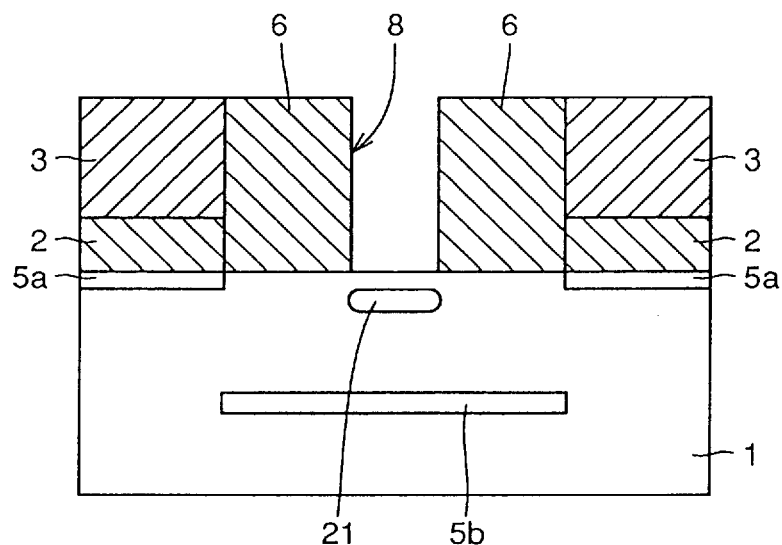
FIG. 23 is a cross sectional view showing a process of manufacturing a semiconductor device of an embodiment 2 of the invention.
Figure 24:
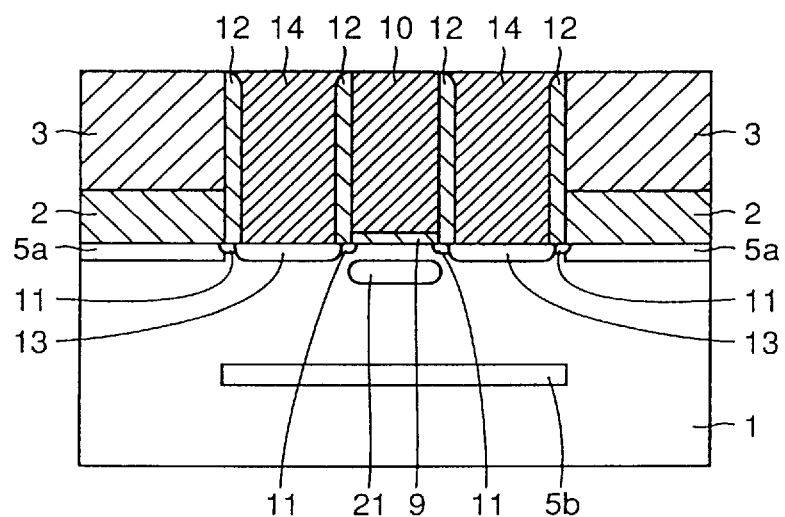
FIG. 24 is a cross sectional view showing the semiconductor device of the embodiment 2 of the invention.

FIGS. 23 and 24 are cross sectional views showing a process of manufacturing a semiconductor device of the embodiment 2 of the invention. Referring first to FIG. 24, the embodiment 2 has such a distinctive structure, in addition to the distinctive structure of the embodiment 1, that an impurity diffusion layer 21, which forms in the channel region a channel doped layer for controlling a threshold voltage of a transistor or a punch-through stop layer for suppressing punch through, is selectively formed only under the gate electrode. A specific manufacturing process is as follows. After the step of the embodiment 1 shown in FIG. 6, boron (B) is ion-implanted under the conditions of 5–30 keV and $1 \times 10^{13} – 1 \times 10^{14}$ $cm^{-2}$, using first, second and third insulating films 2, 3 and 6 as a mask, to form impurity diffusion layer 21 at a position which is 0.1–0.2 μm deep from the surface of semiconductor substrate 1. Impurity diffusion layer 21 is located near the junction regions of heavily doped impurity diffusion layers 13. Since impurity diffusion layer 21 is formed using first, second and third insulating films 2, 3 and 6 as a mask, it is not formed under an element isolating film (2 and 3) nor at source/drain regions.

Thereafter, a process similar to that of the embodiment 1 shown in FIGS. 7 to 13 is performed, whereby the semiconductor device of the embodiment 2 is completed as shown in FIG. 24.

In the conventional manufacturing method, if ion implantation is performed with a mask formed of the element isolating film formed by the LOCOS method, ion-implanted layer 21 is inevitably formed not only at a region immediately under the gate electrode but also at a junction region of the heavily doped impurity diffusion layer. Since the conductivity types of ion-implanted layer 21 and heavily doped impurity diffusion layer 13 are opposite to each other, such a disadvantage arises that a junction breakdown voltage of a portion, at which ion-implanted layer 21 overlaps heavily doped impurity diffusion layer 13, lowers and thus the junction leakage current increases, or that a capacity of a p-n junction increases and thus a responsibility of the device decreases. In contrast to the above, the embodiment 2 includes ion-implanted layer (impurity diffusion layer) 21 which is selectively formed in a self-aligned manner only immediately under gate electrode 10, so that the above disadvantages can be prevented without employing an additional mask of photolithography.

In order to form selectively ion-implanted layer 21 by the conventional manufacturing method, it is necessary to form additionally a photoresist for ion implantation by photolithography before formation of the gate electrode. In this case, since the gate electrode and ion-implanted layer 21 are formed in different photolithographic steps, ion-implanted layer 21 is not formed in a self-aligned manner, so that the gate electrode and ion-implanted layer 21 deviate from each other within a range of an alignment accuracy. For example, ion-implanted layer 21 deviates by about 0.1–0.2 μm toward heavily doped impurity diffusion layer 13. Therefore, the ion implantation is performed with a mask which protrudes 0.2 μm from each end of the gate electrode taking the alignment accuracy into consideration. However, if the width (i.e., thickness) of the gate electrode is small and is in a range from 0.05 to 0.1 μm, ion-implanted layer 21 and heavily doped impurity diffusion layer 13 partially overlap with each other, and deterioration of a junction breakdown voltage and increase of a junction capacity inevitably occur at the overlapped area. In contrast to this, the embodiment 2 can overcome the above problem, because gate electrode 10 and ion-implanted layer 21 can be formed in a self-aligned manner without an additional resist mask. Ion-implanted layer 21 in this embodiment 2 can be applied to respective embodiments to be described below.

(Embodiment 3)

The embodiment 3 allows patterning of a gate electrode into a size smaller than an allowable minimum size of photolithography. Referring to FIGS. 25 to 28, a manufacturing process of the embodiment 3 will be described below.

Figure 25:
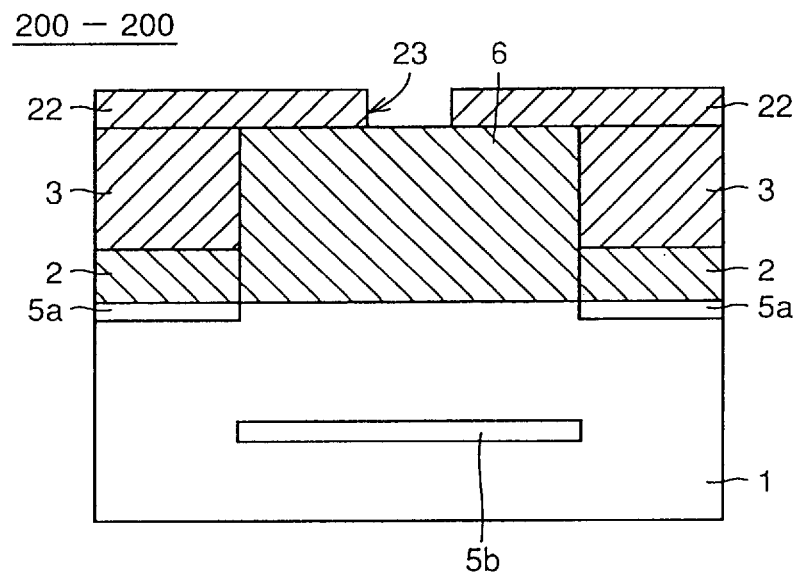
FIGS. 25 to 29 are cross sectional views and a plan showing a process of manufacturing a semiconductor device of an embodiment 3 of the invention.
Figure 26:
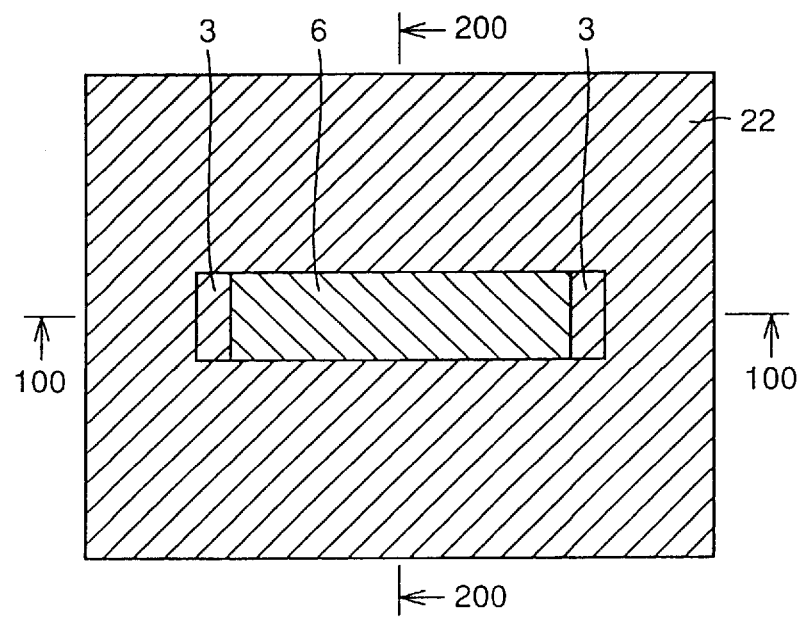

After the step of the embodiment 1 shown in FIG. 4, a step is performed to form an etching mask 22 of about 200 nm in thickness made of, e.g., silicon nitride film, as shown in FIG. 25. An opening pattern 23 for gate electrode is formed by the photolithography and RIE method. FIG. 26 is a plan view corresponding to FIG. 25, and FIG. 27 is a cross sectional view taken along line 200—200 in FIG. 26.

Figure 27:
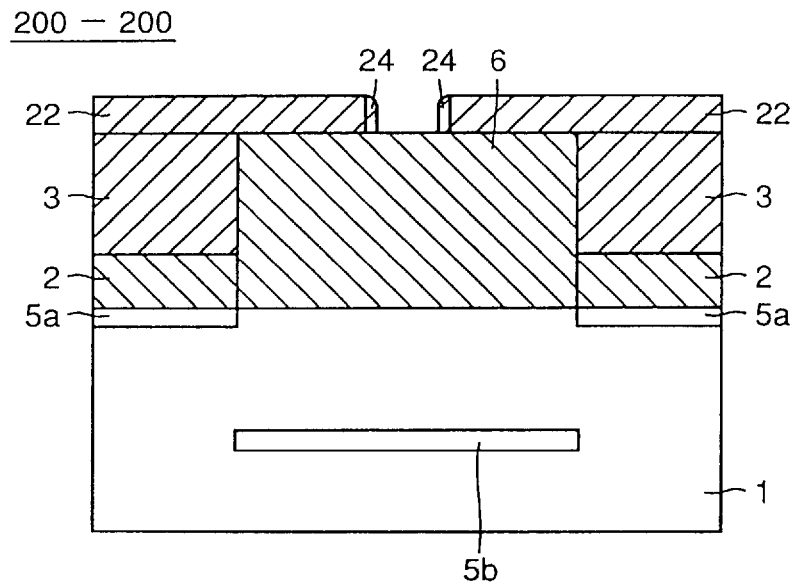
Figure 28:
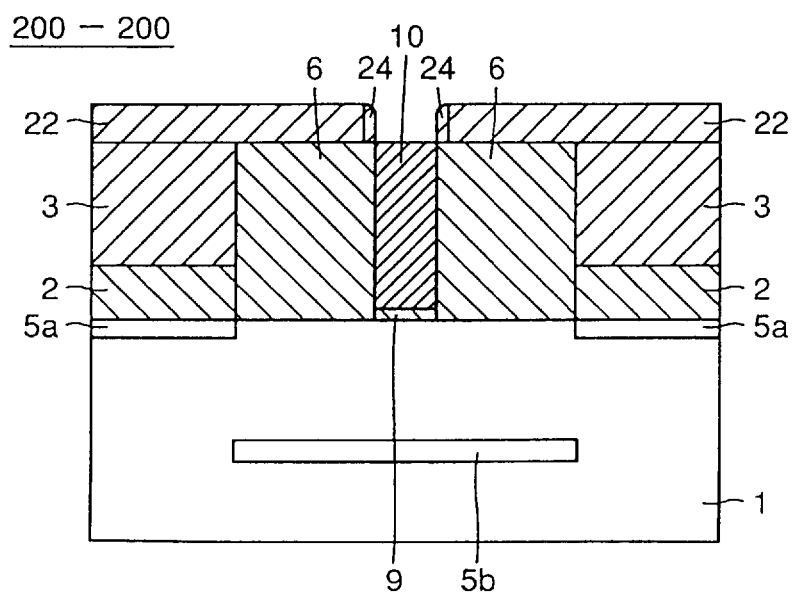

Thereafter, a silicon nitride film (not shown) of about 50 nm in thickness is formed, e.g., by the CVD method, and then a side wall insulating film 24 shown in FIG. 27 is formed by the RIE method. The width of side wall insulating film 24 depends on the thickness of the silicon nitride film before the etching. Side wall insulating films 24 reduce the length of the opening of etching mask 22 along line 200—200 by 100 nm. Third insulating film 6 is etched using etching mask 22 and side wall insulating films 24 as a mask. Thereafter, gate insulating film 9 and gate electrode 10 shown in FIG. 28 are formed by a process similar to that of the embodiment 1 shown in FIGS. 7 and 8. In this process, gate electrode 10 is formed to have an upper surface lower than etching mask 22 and flush with the upper surface of third insulating film 6. More specifically, gate electrode 10 is formed to fill the space, and then is processed by the RIE method to reduce its thickness. Thereafter, polishing is effected to remove etching mask 22 and side wall insulating films 24 made of silicon nitride films. Thereafter, steps similar to those of the embodiment 1 shown in FIGS. 9 to 14 are performed.

Figure 29:
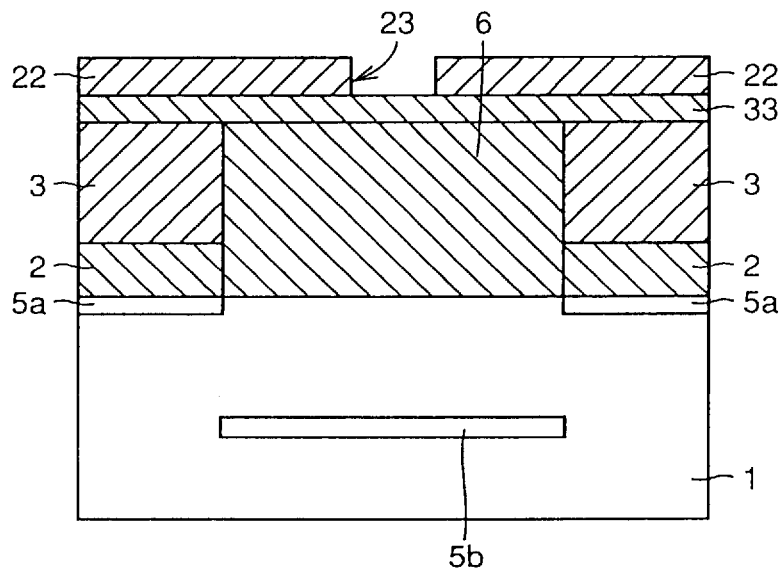

As shown in FIG. 29, a sixth insulating film 33 of about 100 nm in thickness made of, e.g., a silicon oxide film is formed after the step shown in FIG. 4, and etching mask 22 made of a silicon nitride film of about 200 nm in thickness is formed on sixth insulating film 33. Thereafter, an opening pattern 23 for gate electrode may be formed by patterning etching mask 22 using sixth insulating film 33 as an etching stopper. Thereafter, side wall insulating films 24 may be formed similarly to the steps shown in FIGS. 27 and 28, and sixth and third insulating films 33 and 6 may be etched to form gate electrode 10. In this case, since sixth insulating film 33 made of the silicon oxide film exists under etching mask 22 and side wall insulating films 24 made of the silicon nitride films, etching mask 22 and side wall insulating films 24 can be easily removed with hot phosphoric acid.

(Embodiment 4)

Figure 30:
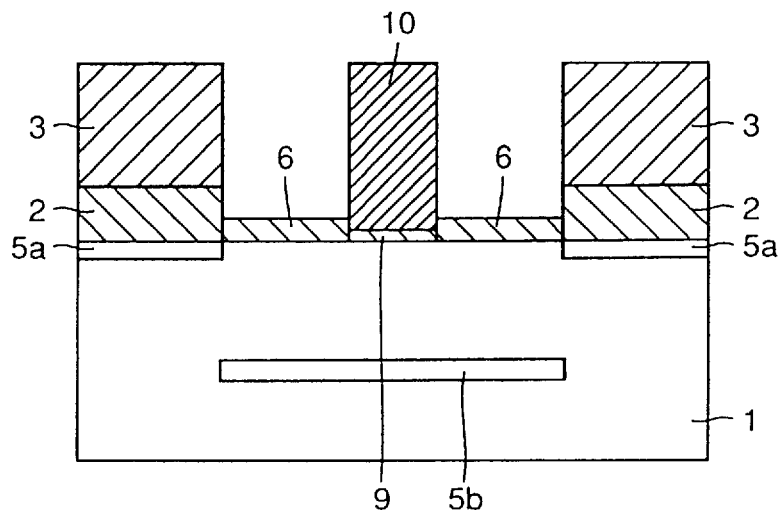
FIG. 30 is a cross sectional view showing a process of manufacturing a semiconductor device of an embodiment 4 of the invention.

When third insulating film 6 is etched and removed after the step of embodiment 1 shown in FIG. 8, exposed gate insulating film 9 may be laterally etched if anisotropy in RIE is insufficient. When gate insulating film 9 is laterally etched, gate electrode 10 is separated or disengaged, if the gate length is short. A method of overcoming this problem will now be described below as a manufacturing process of the embodiment 4 with reference to FIG. 30.

After the step shown in FIG. 8, third insulating film 6 is etched by the RIE method. In this step, third insulating film 6 is not completely removed and a portion having a predetermined thickness is left. Remained third insulating film 6 has a thickness of, e.g., about 20 nm larger than that of gate insulating film 9. Since remained third insulating films 6 covers the side surfaces of gate insulating film 9, gate insulating film 9 is not etched in this step. Thereafter, a manufacturing process similar to that of the embodiment 1 shown in FIGS. 9 to 14 is performed. Remained third insulating films 6 can be removed by the overetching in the step of forming side wall insulating films 12 (see FIG. 10), so that third insulating film 6 does not isolate source/drain electrodes 14 from underlying semiconductor substrate 1.

(Embodiment 5)

The embodiment 5 can simplify the structure of the element isolating film. A manufacturing process of the embodiment 5 will now be described below with reference to FIGS. 31 to 35.

Figure 31:
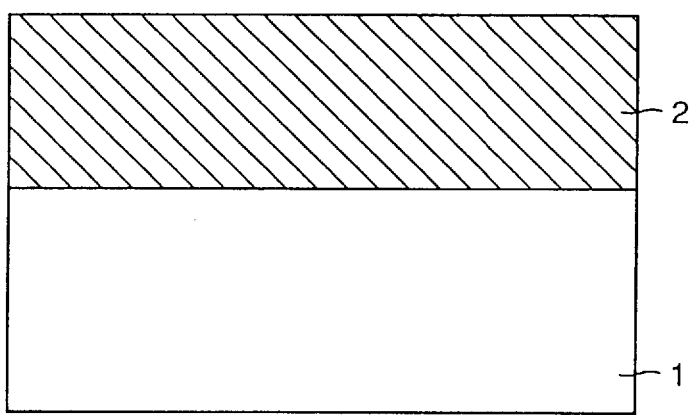
FIGS. 31 to 35 are cross sectional views showing a process of manufacturing a semiconductor device of an embodiment 5 of the invention.
Figure 32:
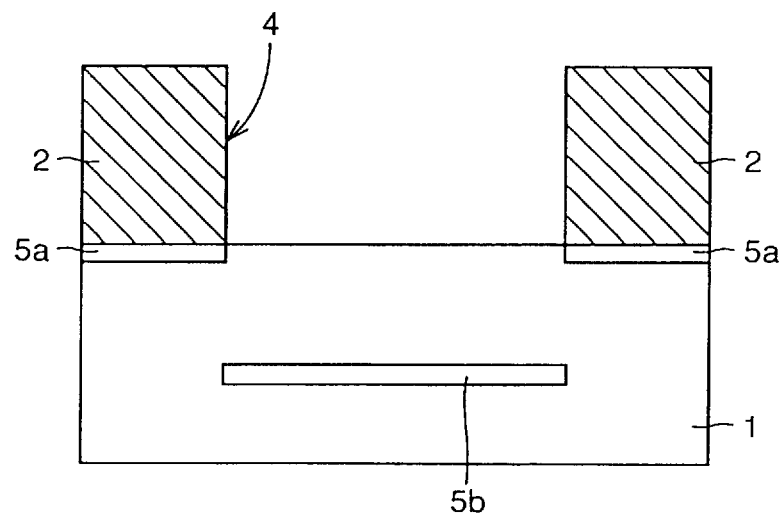
Figure 33:
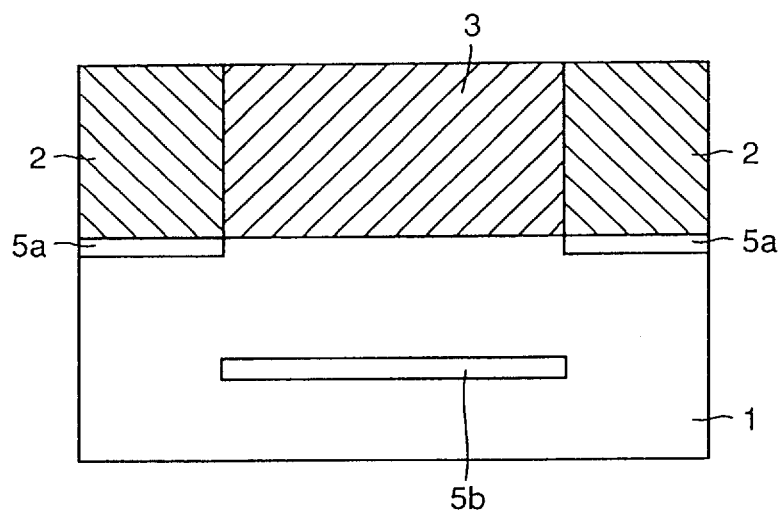

As shown in FIG. 31, first insulating film 2 of about 400 nm in thickness made of, e.g., a silicon oxide film is formed on semiconductor substrate 1 by the CVD method. Transistor opening 4 is formed by photolithography and dry etching as shown in FIG. 32. Ion implantation is performed to form ion-implanted layers 5a and 5b using first insulating film 2 as a mask.

Figure 34:
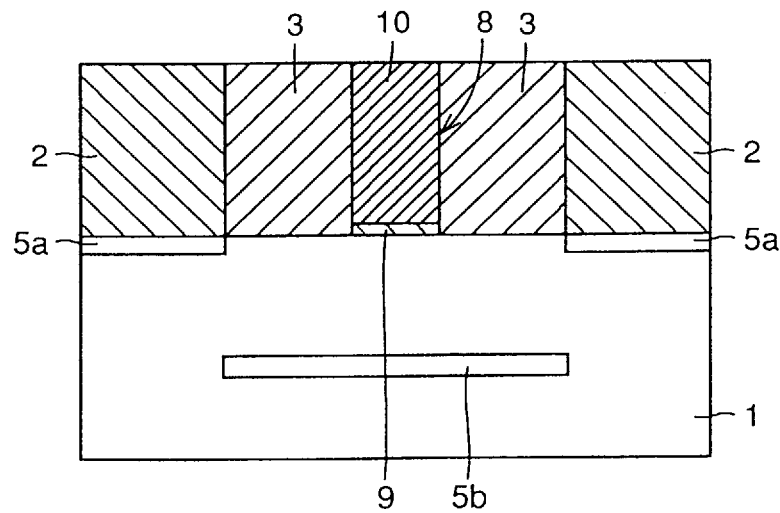

After forming second insulating film 3 of about 500 nm in thickness made of, e.g., a silicon nitride film by the CVD method, polishing or etchback is effected to form second insulating film 3 filling transistor opening 4. A process similar to that of the embodiment 1 shown in FIGS. 5 to 8 is performed to form gate insulating film 9 and gate electrode 10 filling gate electrode opening 8 as shown in FIG. 34.

Figure 35:
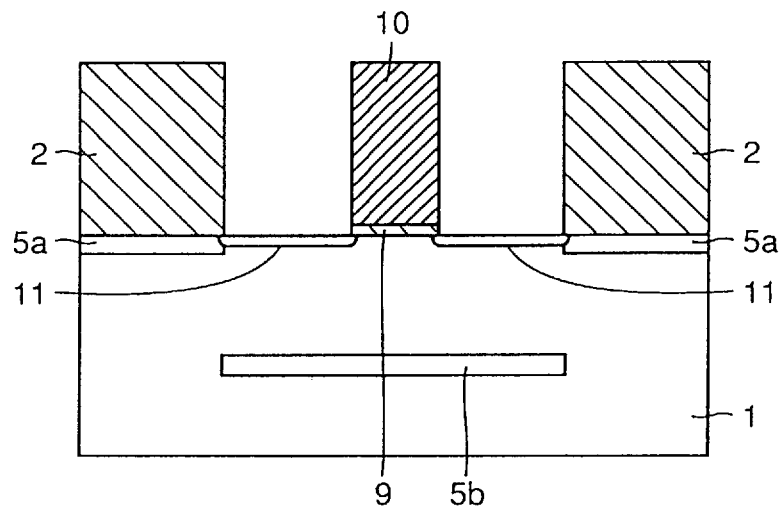

Thereafter, second insulating film 3 is removed with hot phosphoric acid or by dry etching, so that a configuration shown in FIG. 35 is completed. Then, ion implantation is performed to form lightly doped impurity diffusion layers 11 using first insulating film 2 and gate electrode 10 as a mask. Thereafter, steps similar to those of the embodiment 1 shown in FIGS. 10 to 14 are performed to complete the semiconductor device of the embodiment 5.

(Embodiment 6)

In the embodiments 1 to 5 already described, the element isolating film is formed of only the insulating films. In contrast to this, the embodiment 6 employs a conductive film 25 between first and second insulating films 2 and 3 to provide isolation of a field shield structure. A manufacturing process of the embodiment 6 will be described below with reference to FIGS. 36 to 38.

Figure 36:
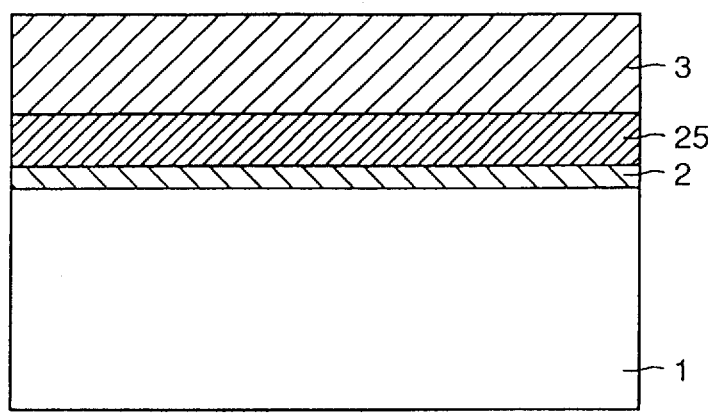
FIGS. 36 to 38 are cross sectional views showing a process of manufacturing a semiconductor device of an embodiment 6 of the invention.

First insulating film 2 of about 20 nm in thickness made of a silicon oxide film is formed on semiconductor substrate 1 by the thermal oxidation or CVD method. Conductive film 25 of about 100 nm in thickness made of a polycrystalline silicon layer is formed on first insulating film 2 by the CVD method. Second insulating film 3 of about 300 nm in thickness made of a silicon nitride film is formed on conductive film 25 by the CVD method as shown in FIG. 36. Thereafter, a manufacturing process similar to that of the embodiment 1 shown in FIGS. 2 to 8 is performed such that the third insulating film (silicon oxide film) made of a material different from that of second insulating film 3 is formed to fill transistor opening 4, gate electrode opening 8 is formed, and then gate insulating film 9 and gate electrode 10 are formed. In this embodiment 6, since conductive film 25 made of the polycrystalline silicon layer is formed at an intermediate position, an etching step for conductive film 25 is additionally required in the etching process for forming transistor opening 4. Except for the above, the process of this embodiment is the same as that of the embodiment 1.

Figure 37:
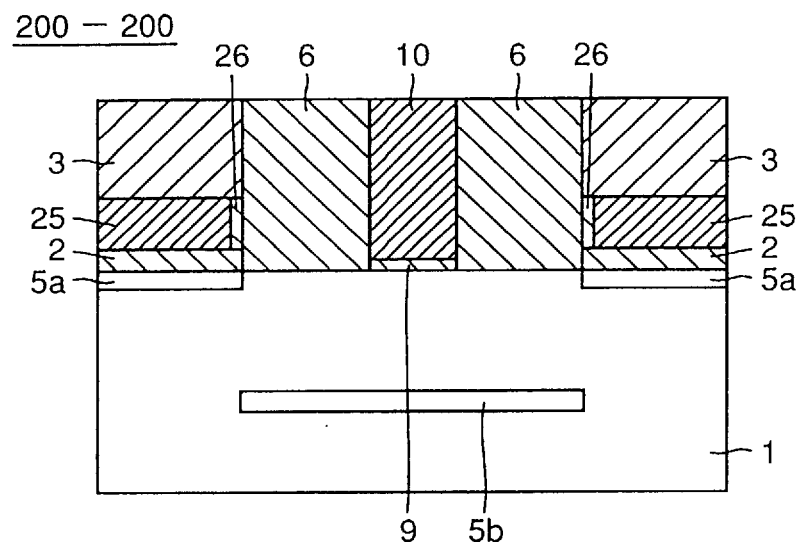
Figure 38:
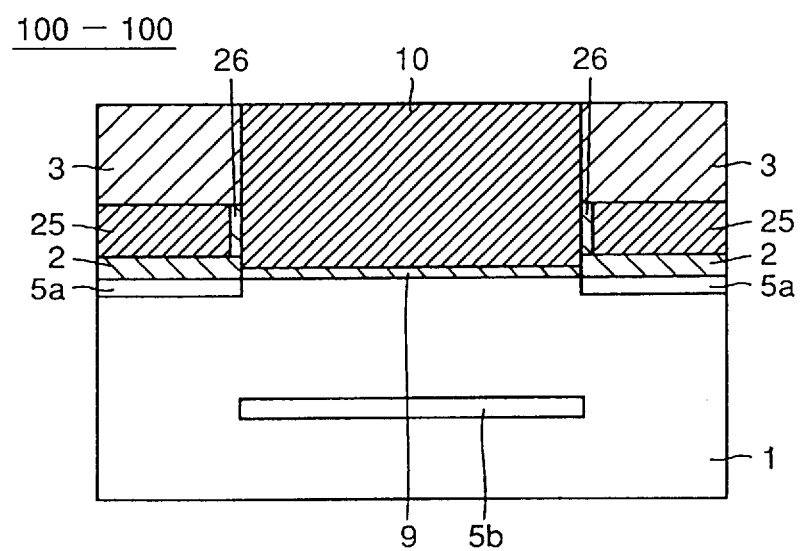

FIG. 37 is a cross sectional view taken along line 200—200, i.e., in the gate length direction, and FIG. 38 is a cross sectional view showing the same step but taken along line 100—100, i.e., in the gate width direction. Referring to FIGS. 37 and 38, these figures show a structure in which gate insulating film 9 is formed by thermal oxidation. The thermal oxidation for forming gate insulating film 9 also oxidizes side surfaces of conductive film 25 made of polycrystalline silicon which are exposed at gate electrode opening 8. Thereby, fourth insulating films 26 are formed at the side surfaces of conductive film 25. Consequently, fourth insulating films 26 electrically isolate conductive film 25 from gate electrode 10 as shown in FIG. 38. Although this embodiment 6 employs the second and third insulating films 3 and 6 made of silicon nitride film and silicon oxide film, respectively, second insulating film 3 may be made of a silicon oxide film and third insulating film 6 may be made of a silicon nitride film according to the invention.

(Embodiment 7)

The embodiment 7 employs isolation of the field shield structure as is done in the embodiment 6. Further, the embodiment 7 differs from the embodiment 6 in that insulating films are additionally formed on side surfaces of conductive film 25.

If conductive film 25 is formed of a polycrystalline silicon layer doped with phosphorus or a metal silicide layer, fourth insulating film 26 having a sufficient insulating breakdown voltage may not be obtained only by oxidation of conductive film 25. Particularly, this tendency is remarkable if gate insulating film 9 has a small thickness of 5 nm or less. In this case, additional insulating films may be formed at side surfaces of conductive film 25. A manufacturing process of the embodiment 7 will be described below with reference to FIGS. 39 to 42.

Figure 39:
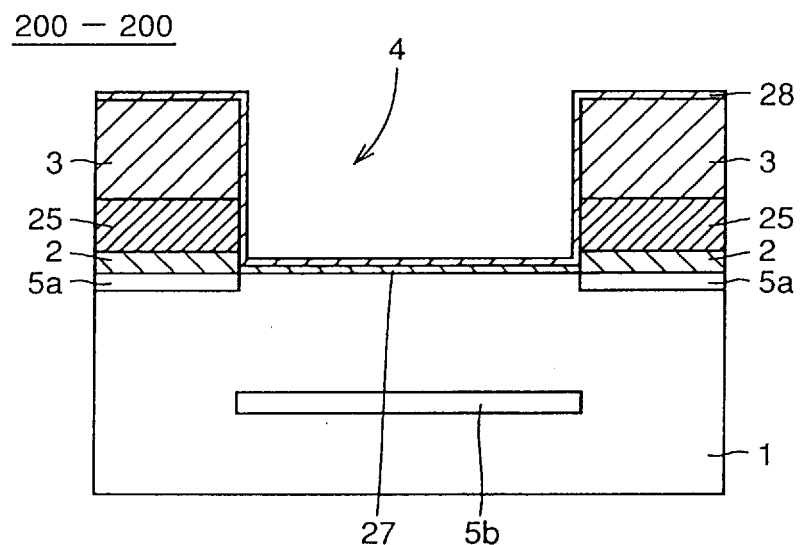
FIGS. 39 to 42 are cross sectional views showing a process of manufacturing a semiconductor device of an embodiment 7 of the invention.
Figure 40:
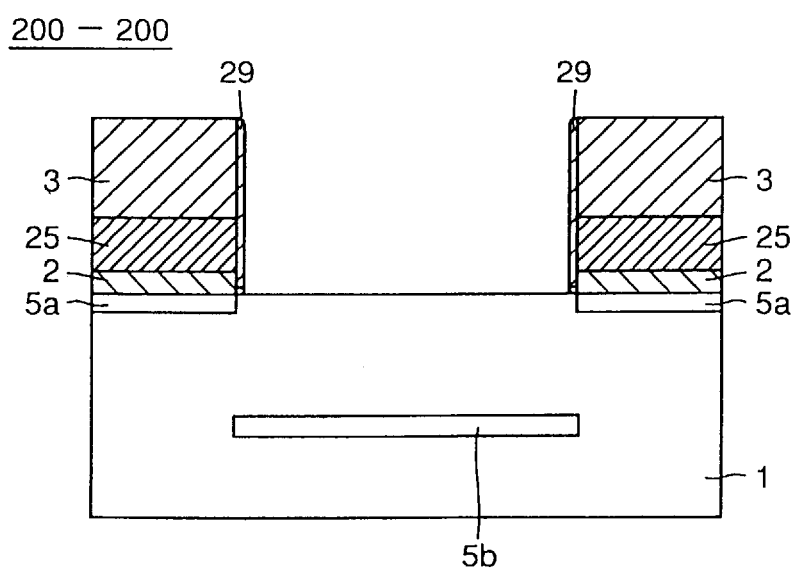

After the step of the embodiment 6 shown in FIG. 36, transistor opening 4 is formed as shown in FIG. 39. Then, thermal oxidation is executed to form a silicon oxide film 27 having a thickness of about 20 nm. The CVD method is executed to form fifth insulating film (silicon nitride film) 28 of the same material as the second insulating film 3. Subsequently, the RIE method is executed to etch fifth insulating film 28, and further thermal oxide film 27 is etched by the RIE method, so that side wall insulating films 29 each made of thermal oxide film 27 and fifth insulating film 28 is completed as shown in FIG. 40. Thereafter, the steps similar to those of the embodiment 1 shown in FIGS. 3 to 12 are executed to form the structure shown in FIGS. 41 and 42.

Figure 41:
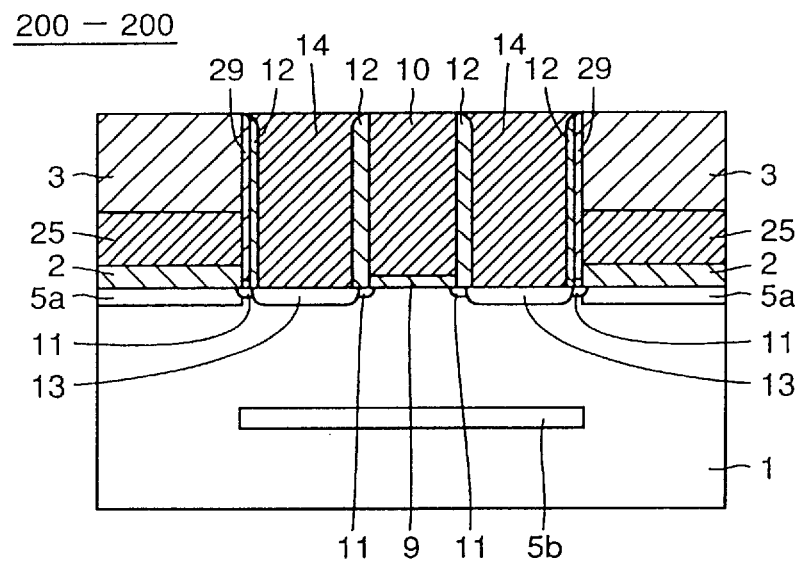
Figure 42:
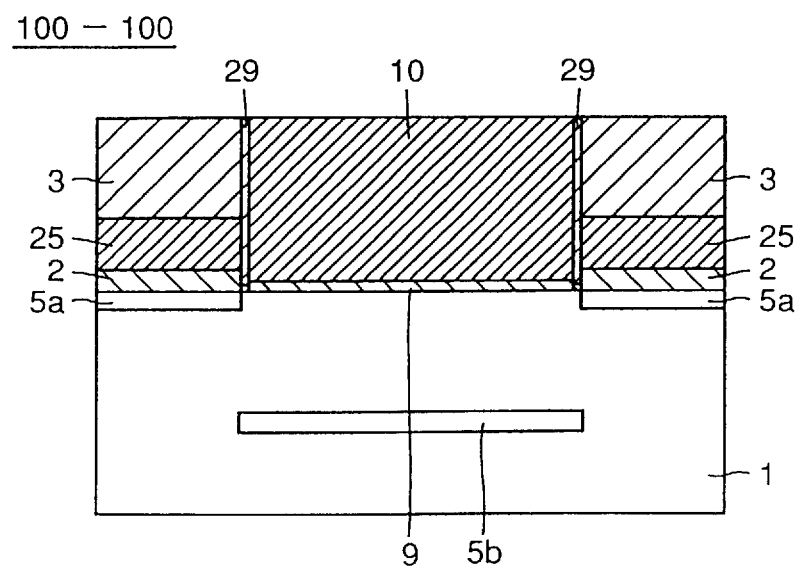

FIG. 42 is a cross sectional view taken in the gate width direction and showing the step in FIG. 41. Referring to FIG. 42, gate electrode 10 and conductive film 25 are insulated from each other by side wall insulating films 29.

As described above, side wall insulating film 29 is formed of the silicon nitride film and the silicon oxide film under the same. The purpose of this structure is to prevent deterioration in reliability. If the silicon nitride film were in direct contact with semiconductor substrate 1, an unnecessary interface level would be formed and thus hot carriers would deteriorate the reliability.

In the embodiment 7, side wall insulating film 29 is formed after forming transistor opening 4. However, the invention is not restricted to this, and side wall insulating film 29 formed of silicon oxide film 27 and silicon nitride film 28 may be formed after formation of gate electrode opening 8.

(Embodiment 8)

The embodiment 8 will be described below in connection with the structure allowing easy formation of a gate electrode interconnection and a process of manufacturing the same. In the embodiment 1, interconnections are connected to the MISFET by the conventional manner as already described with reference to FIG. 14. In this invention, however, gate electrode 10 is isolated from source/drain electrodes 14 by thin side wall insulating films 12, so that gate electrode 10 and source/drain electrode 14 are short-circuited together by the interconnection for gate electrode 10, if the interconnection for gate electrode 10 is deviated by about 100 nm due to misalignment in the photolithography. A manner for preventing this problem will be described below with reference to FIGS. 43 to 51.

Figure 43:
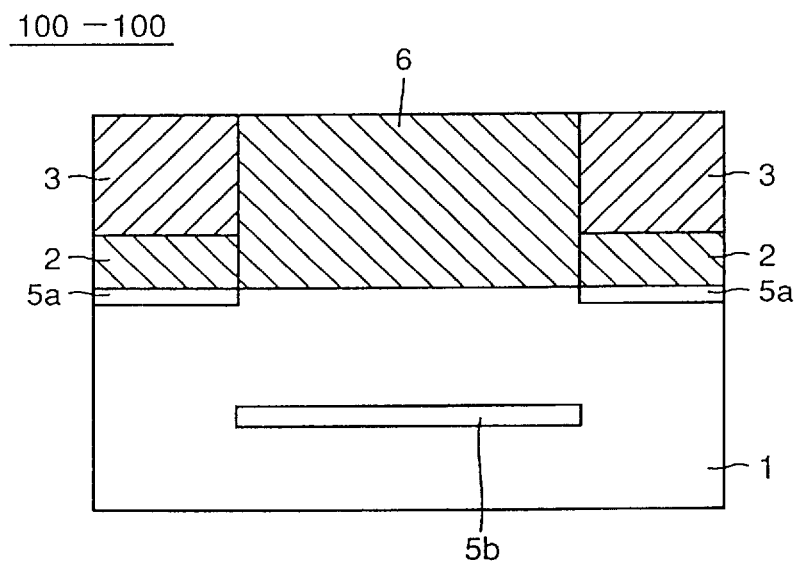
FIG. 43 is a cross sectional view showing a process of manufacturing a semiconductor device of an embodiment 8 of the invention.
Figure 44:
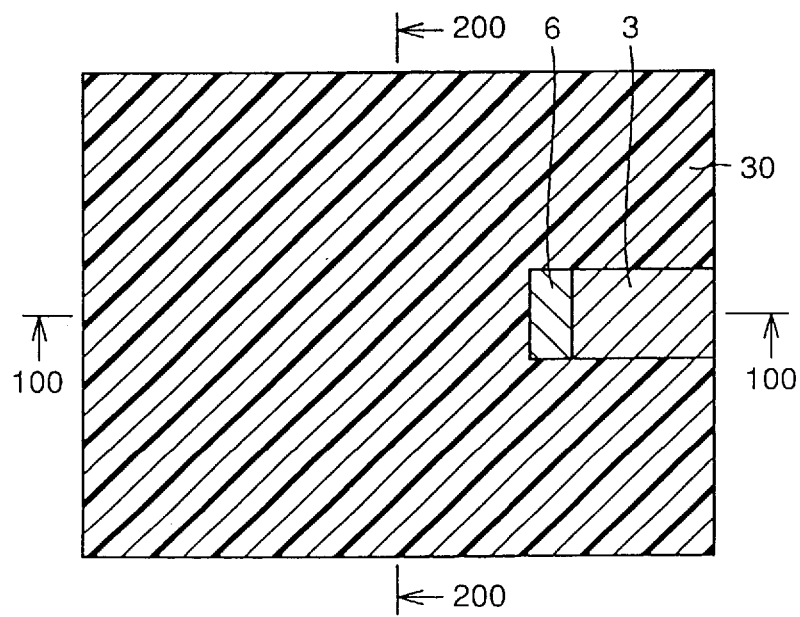
FIG. 44 is a plan view showing a process of manufacturing a semiconductor device of an embodiment 8 of the invention.
Figure 45:
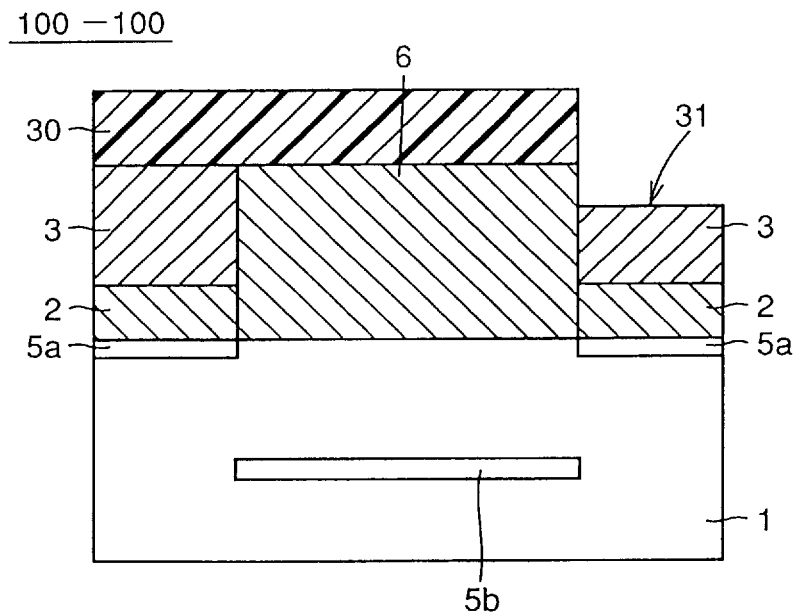
FIGS. 45 to 49 are cross sectional views showing a process of manufacturing a semiconductor device of an embodiment 8 of the invention.

FIG. 43 is a cross sectional view showing a structure after the step of the embodiment 1 shown in FIG. 4. After formation of this structure, a step is performed to form a photoresist 30 for determining a pattern of the interconnection connected to the gate electrode as shown in FIG. 44. Thereafter, an interconnection groove 31, i.e., groove for interconnection is formed as shown in FIG. 45 by etching second insulating film 3 using photoresist 30 as a mask. The etching quantity or depth of the second insulating film 3 is 100 nm. Since second insulating film 3 is 400 nm in thickness, interconnection groove 31 does not extent to first insulating film 2.

Figure 46:
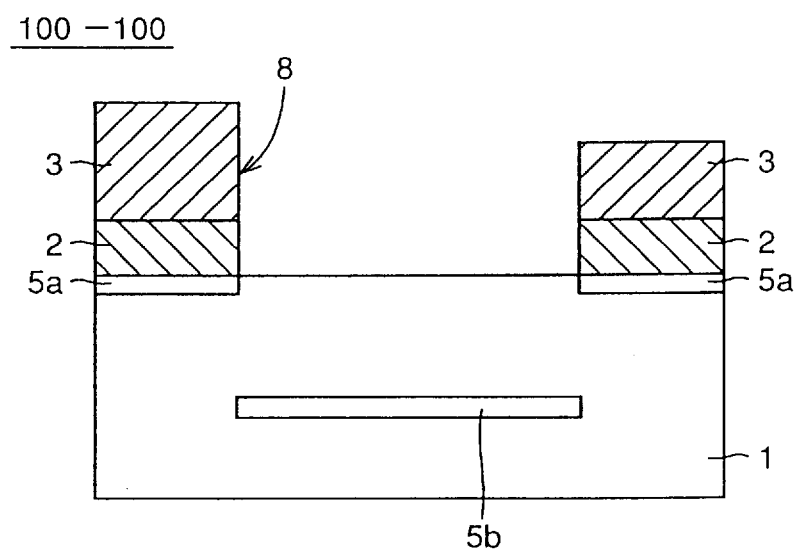
Figure 47:
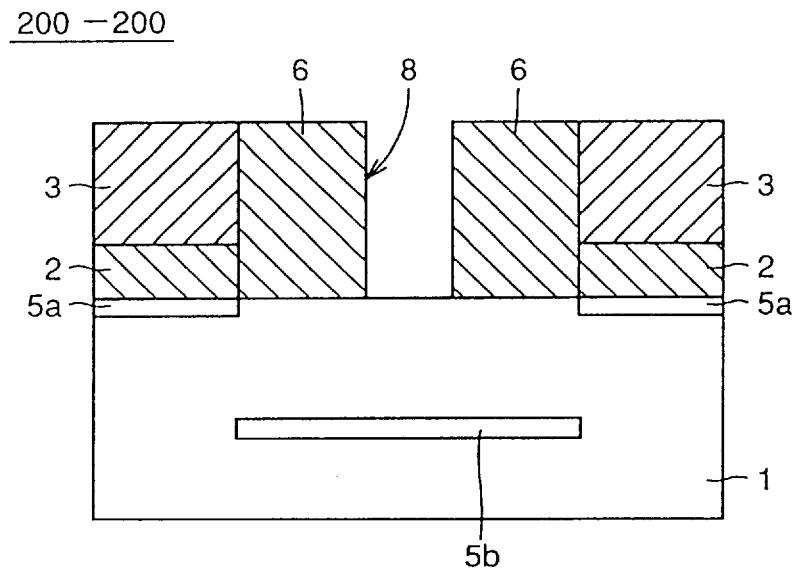
Figure 48:
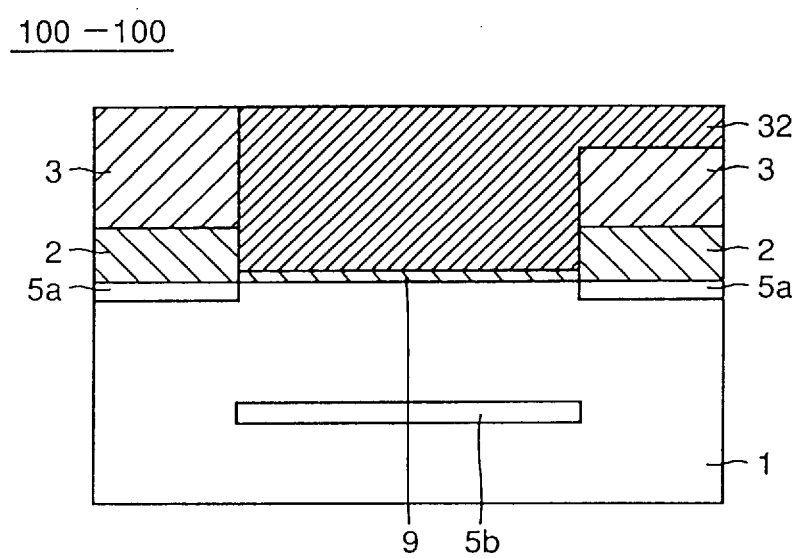
Figure 49:
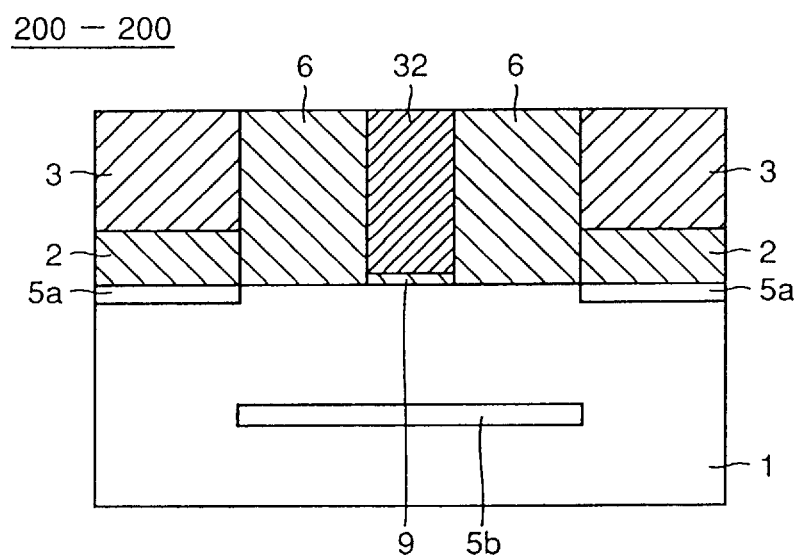

Thereafter, a process similar to that of the embodiment 1 shown in FIGS. 5 and 6 is performed to form gate electrode opening 8 as shown in FIG. 46. FIG. 47 is a cross sectional view taken in the gate length direction (i.e., along line 200—200) and showing the same step as that in FIG. 46. Thereafter, a step similar to that of the embodiment 1 shown in FIG. 8 is performed to form gate insulating film 9 and an interconnection and gate electrode 32, i.e., gate electrode also serving as an interconnection. Interconnection and gate electrode 32 is formed only inside gate electrode opening 8 and interconnection groove 31, for example, by forming a conductive film made of a polycrystalline silicon layer and then polishing or etching back the conductive film as shown in FIG. 48. FIG. 49 is a cross sectional view taken in the gate length direction and showing the step in FIG. 48. A process similar to that of the embodiment 1 shown in FIGS. 9 to 12 is performed to form source/drain electrodes 14.

Figure 50:
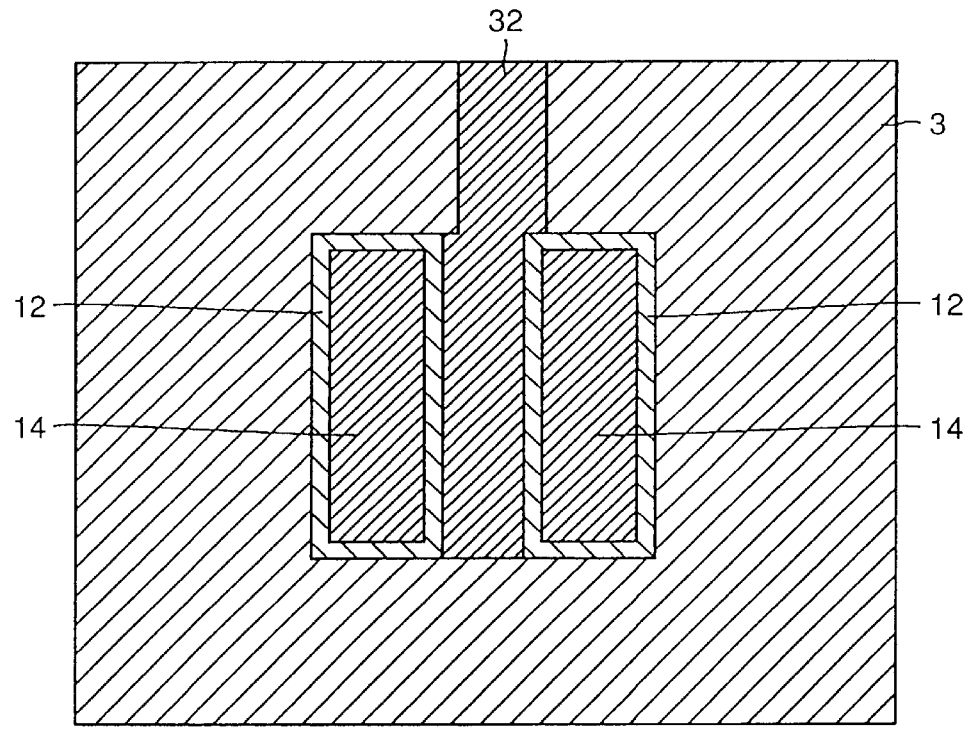
FIGS. 50 and 51 are plan views showing a process of manufacturing a semiconductor device of an embodiment 8 of the invention.

FIG. 50 is a plan view of a semiconductor device after formation of source/drain electrodes 14. Since interconnection groove 31 and gate electrode opening 8 are formed with different masks, misalignment may occur as shown in FIG. 50. Even in this case, a portion of interconnection and gate electrode 32 located in the interconnection groove is not short-circuited to source/drain electrodes 14 owing to existence of side wall insulating film 12. As described above, the embodiment 8 allows simultaneous formation of the interconnection and gate electrode.

Figure 51:
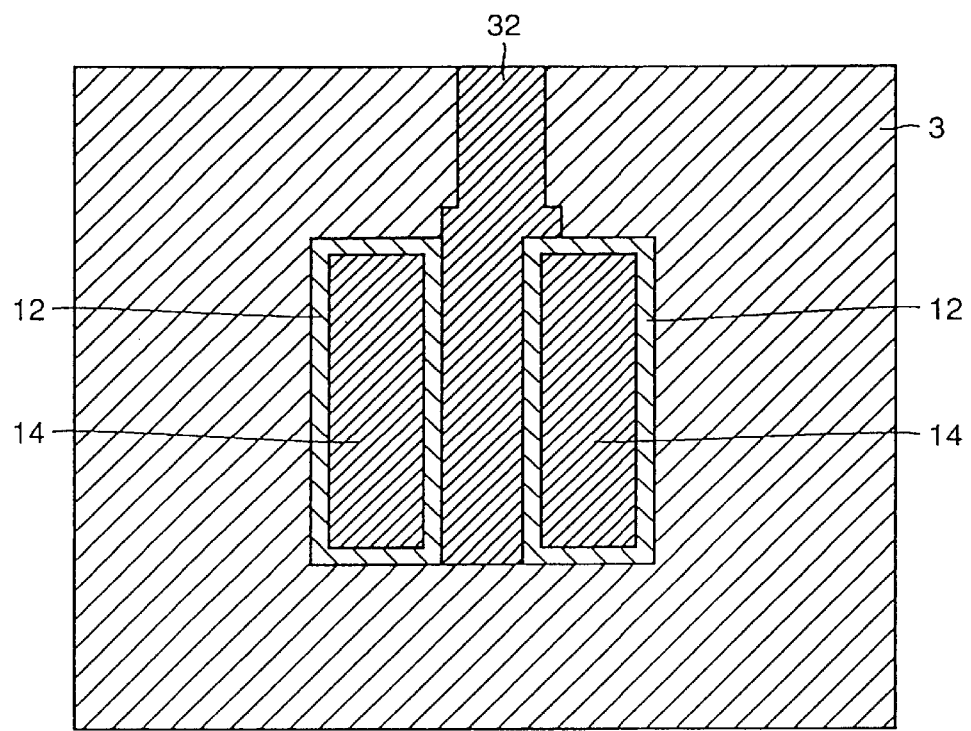

In a modification of the embodiment 8, the interconnection portion may be connected to the gate electrode portion via a wide connection portion so as to increase a contact area between the interconnection portion and the gate electrode portion, as shown in FIG. 51. This reduces a resistance at the connection between them. In this case, the connection portion is wider than the gate portion and the interconnection portion, e.g., by 0.1 μm, which depends on the width of the interconnection portion and the alignment accuracy of photolithography. The interconnection and gate electrode 32 may be provided at its surface with a metal silicide layer formed by a salicide method. The interconnection and gate electrode 32 may be formed of a metal silicide layer, a metal film or a metal nitride film, as already described in connection with gate electrode 10.

(Embodiment 9)

In the embodiment 8 described above, interconnection groove 31 and gate electrode opening 8 are formed with different masks. In this embodiment 9, a common mask is used for forming them. A process of the embodiment 9 will be described below with reference to FIGS. 52 to 55.

Figure 52:
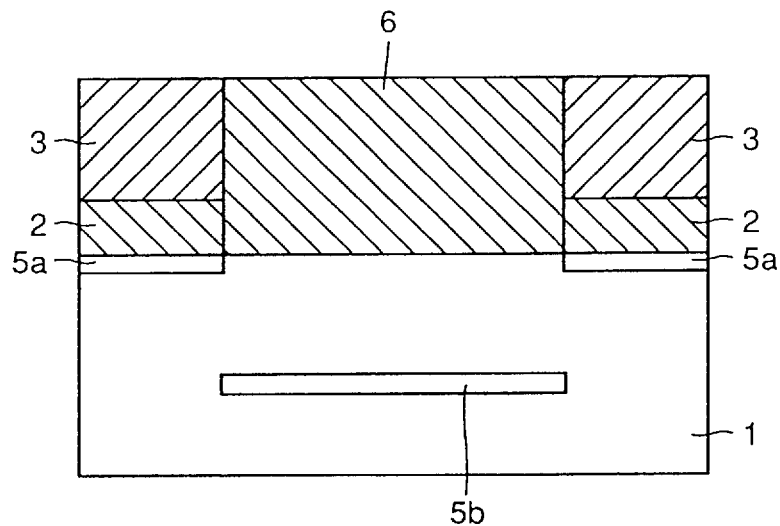
FIG. 52 is a cross sectional view showing a process of manufacturing a semiconductor device of an embodiment 9 of the invention.
Figure 53:
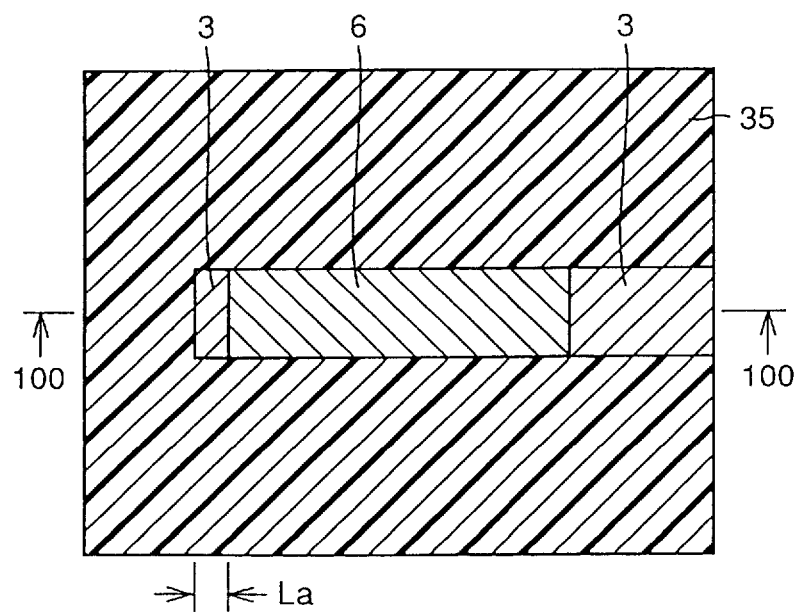
FIG. 53 is a plan view showing a process of manufacturing a semiconductor device of an embodiment 9 of the invention.
Figure 54:
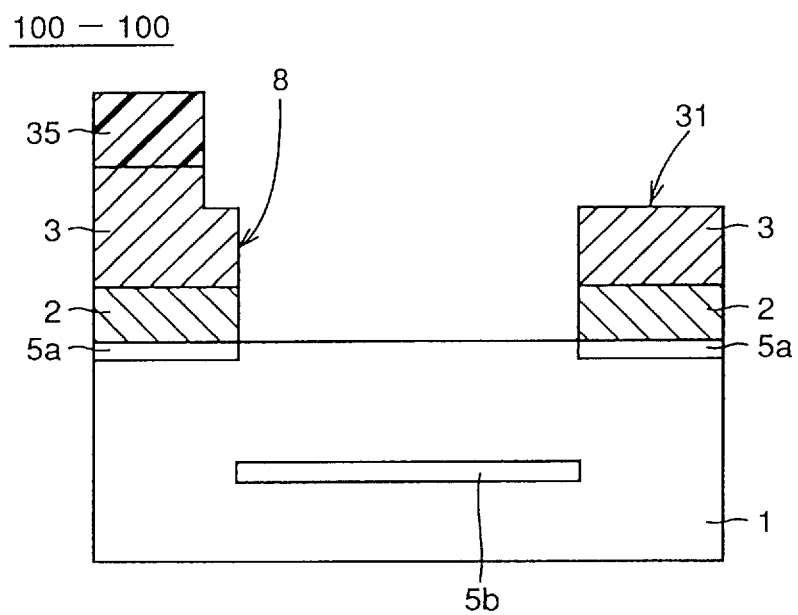
FIGS. 54 and 55 are cross sectional views showing a process of manufacturing a semiconductor device of an embodiment 9 of the invention.

A process similar to that of the embodiment 1 shown in FIGS. 1 to 4 is performed to form a structure shown in FIG. 52. Subsequently, a photoresist 35 shown in FIG. 53 is formed by photolithography. Photoresist 35 has an alignment margin of La taking the alignment accuracy into consideration as is done in the conventional resist pattern for the gate electrode. Using photoresist 35 having the opening pattern as a mask, second insulating film 3 is etched by a predetermined quantity. This etching quantity determines the film thickness of the conductive film for the interconnection portion formed at a later step, and is set to, e.g., 100 nm. Subsequently, third insulating film 6 is etched and removed to form gate electrode opening 8 shown in FIG. 54 using photoresist 35 and second insulating film 3 as a mask. Thereafter, photoresist 35 is removed.

Figure 55:
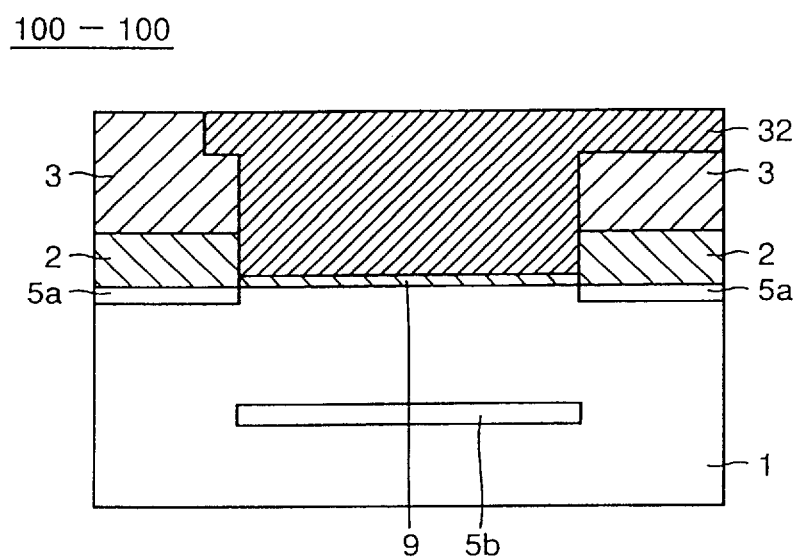

Gate insulating film 9 of 5 nm in thickness made of a silicon oxide film or the like is formed by the thermal oxidation or CVD method as shown in FIG. 55. After forming the conductive film by the CVD method, the conductive film is polished or etched back to form buried interconnection and gate electrode 32 in gate electrode opening 8 and interconnection groove 31. In this embodiment 9, gate electrode 32 is different from that of the embodiment 8 in that alignment margin La cannot be set to 0, but required masks can be smaller in number than those of the embodiment 8.

(Embodiment 10)

The embodiment 10 also relates to a structure and a method relating to simultaneous formation of the gate electrode and the interconnection. The manufacturing process of the embodiment 10 will be described below with reference to FIGS. 56 to 61.

Figure 56:
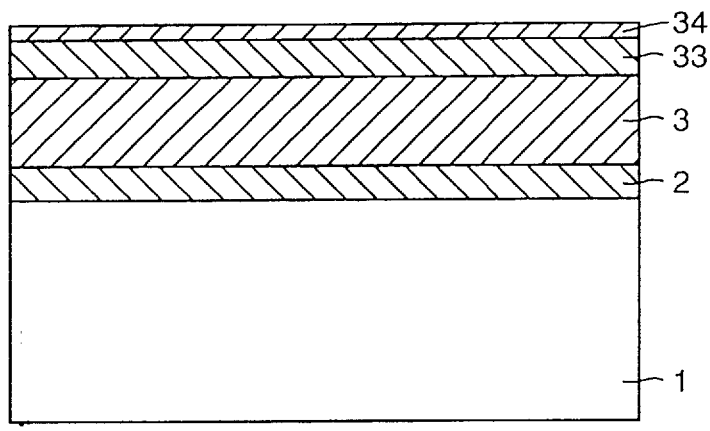
FIGS. 56 and 57 are cross sectional views showing a process of manufacturing a semiconductor device of an embodiment 10 of the invention.
Figure 57:
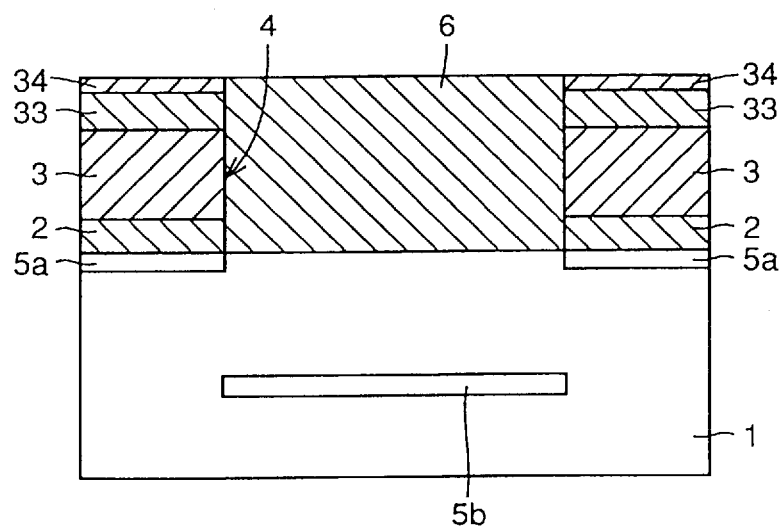
Figure 58:
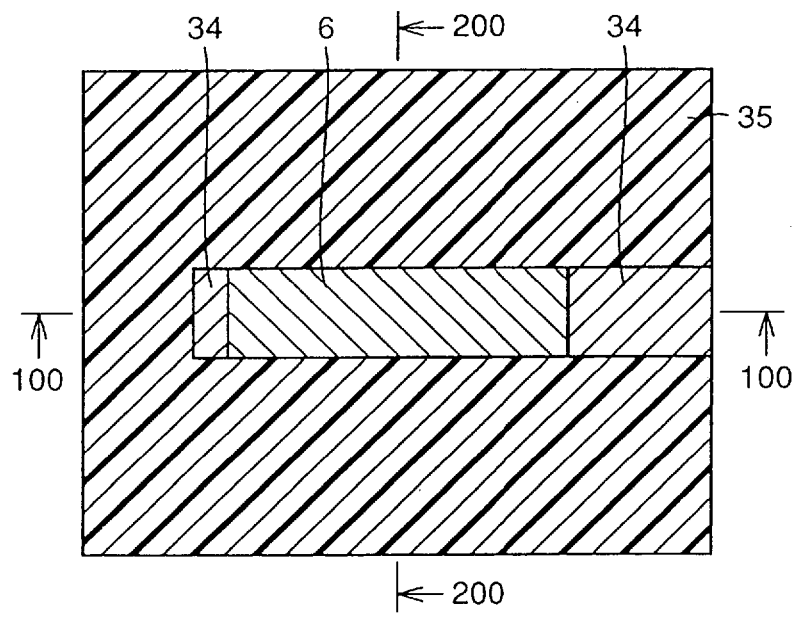
FIG. 58 is a plan view showing a process of manufacturing a semiconductor device of an embodiment 10 of the invention.

Referring to FIG. 56, first insulating film 2 of about 20 nm in thickness made of a silicon oxide film is formed on semiconductor substrate 1 by the thermal oxidation or CVD method. Second insulating film 3 of about 250 nm in thickness made of a silicon nitride film is formed on first insulating film 2 by the CVD method. A sixth insulating film 33 of about 150 nm in thickness made of a material (silicon oxide) different from that of second insulating film 3 is formed on second insulating film 3. A seventh insulating film 34 of about 50 nm in thickness made of a material (silicon nitride) different from that of sixth insulating film 33 is formed on sixth insulating film 33. Then, steps similar to those of the embodiment 1 shown in FIGS. 2 to 4 are performed to form third insulating film 6 filling transistor opening 4 as shown in FIG. 57. Then, photoresist 35 for defining a pattern of the gate electrode and the interconnection connected thereto is formed as shown in FIG. 58. This pattern for photoresist 35 has a configuration which is determined taking alignment margin La in the gate width direction into consideration.

Figure 59:
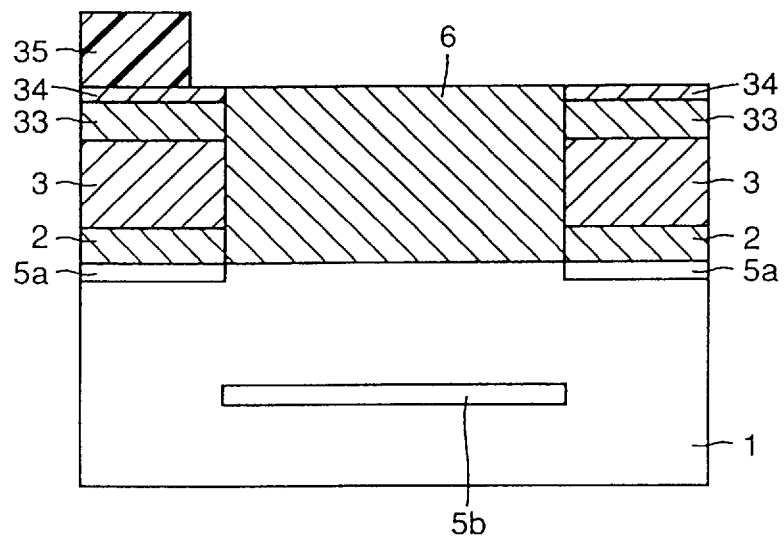
FIGS. 59 to 61 are cross sectional view showing a process of manufacturing a semiconductor device of an embodiment 10 of the invention.
Figure 60:
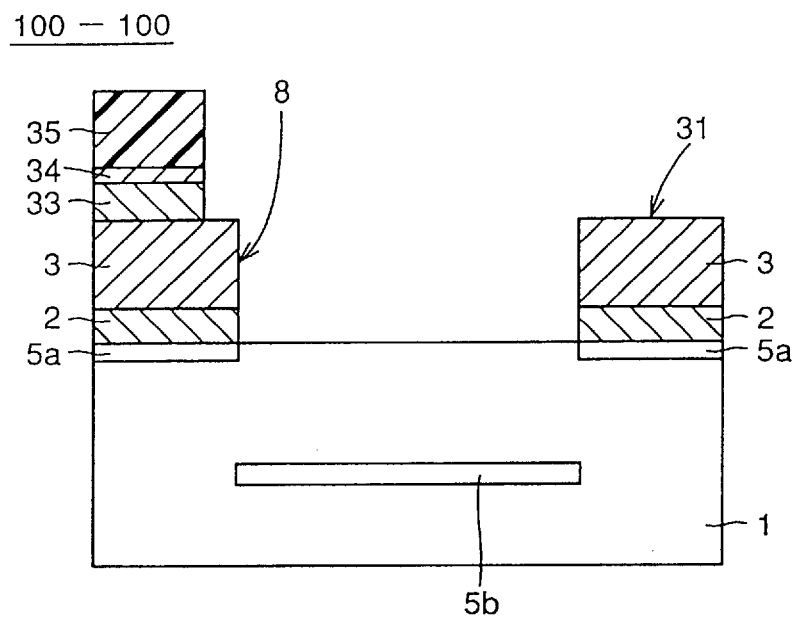

FIG. 59 is a cross sectional view taken along line 100—100 and showing the step in FIG. 58. Seventh insulating film 34 is etched using photoresist 35 shown in FIG. 59 as a mask, and further sixth and third insulating films 33 and 6 are etched using photoresist 35 and seventh insulating film 34 as a mask. Thereby, interconnection groove 31 and gate electrode opening 8 are simultaneously formed as shown in FIG. 60. Thereafter, photoresist 35 is removed by ashing.

Figure 61:
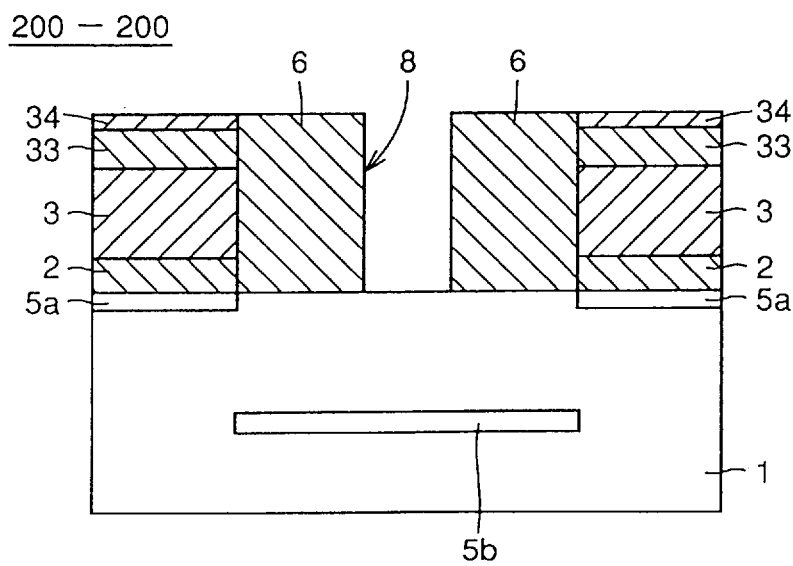

FIG. 61 is a cross sectional view in the gate length direction and showing the step in FIG. 60. After this step, a process similar to that of the embodiment 8 shown in FIGS. 48 and 49 is performed to form interconnection and gate electrode 32, and subsequently, steps similar to those of the embodiment 1 shown in FIGS. 9 to 12 are performed to complete the transistor. In this case, the interconnection portion has a thickness equal to the sum of thicknesses of sixth and seventh insulating films 33 and 34. Therefore, the thickness of the interconnection portion can be controlled easily by controlling the film thicknesses of sixth and seventh insulating films 33 and 34. Consequently, it is possible to prevent variation in the thickness of the interconnection portion, which may be caused depending on the etching conditions in the embodiment 9, and the uniformity in the interconnection resistance can be improved.

(Embodiment 11)

This embodiment 11 likewise relates to a structure and a method relating to simultaneous and integral formation of the gate electrode and the interconnection. The manufacturing process of the embodiment 11 will be described below with reference to FIGS. 62 to 70.

Figure 62:
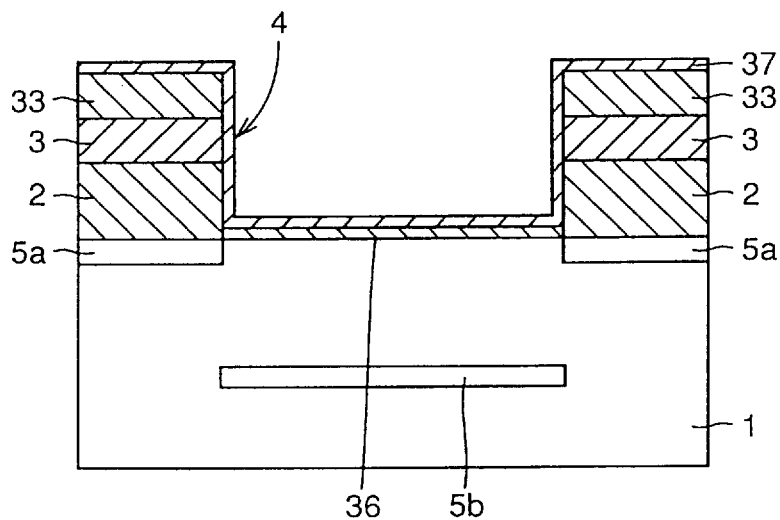
FIGS. 62 and 63 are cross sectional views showing a process of manufacturing a semiconductor device of an embodiment 11 of the invention.
Figure 63:
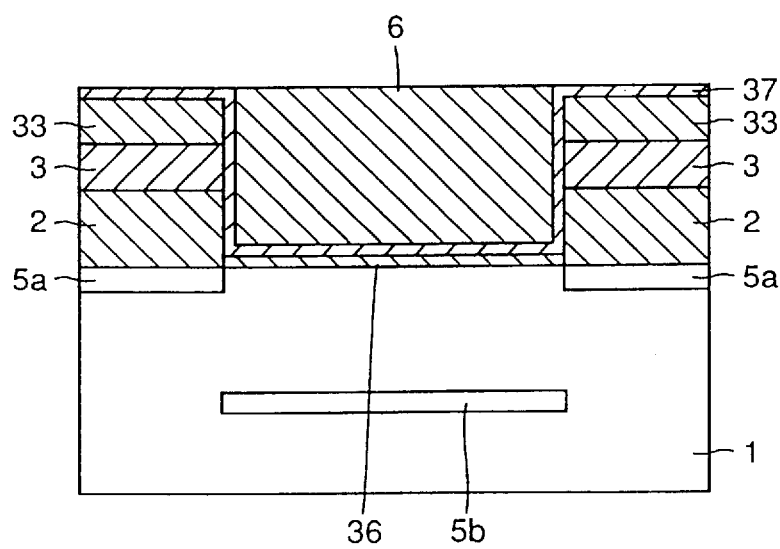

As shown in FIG. 62, the CVD method is performed to form successively on semiconductor substrate 1 first insulating film 2 of about 400 nm in thickness made of a silicon oxide film, second insulating film (silicon nitride film of 100 nm in thickness) 3 having a material different that of first insulating film, and sixth insulating film (silicon oxide film of 100 nm in thickness) 33 having a material different from that of second insulating film 3. Transistor opening 4 is formed by the photolithography and dry etching. Thereafter, ion-implanted layers 5a and 5b are formed similarly to the embodiment 1. An underlying oxide film 36 of about 20 nm in thickness is formed by the thermal oxidation. An eighth insulating film (silicon nitride film) 37 of about 50 nm in thickness made of a material different from that of sixth insulating film 33 is formed by the CVD method. Thereafter, a process similar to that of the embodiment 1 shown in FIGS. 3 and 4 is performed to form third insulating film 6 as shown in FIG. 63.

Figure 64:
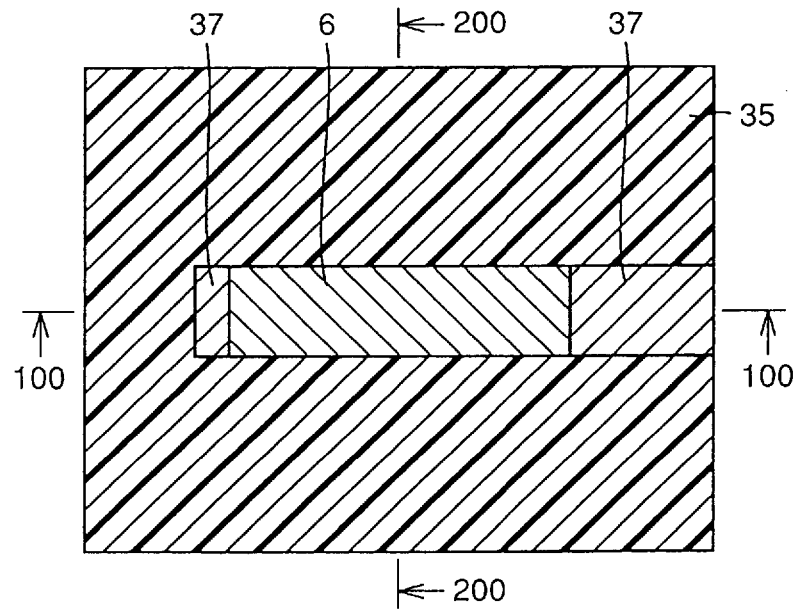
FIG. 64 is a plan view showing a process of manufacturing a semiconductor device of an embodiment 11 of the invention.
Figure 65:
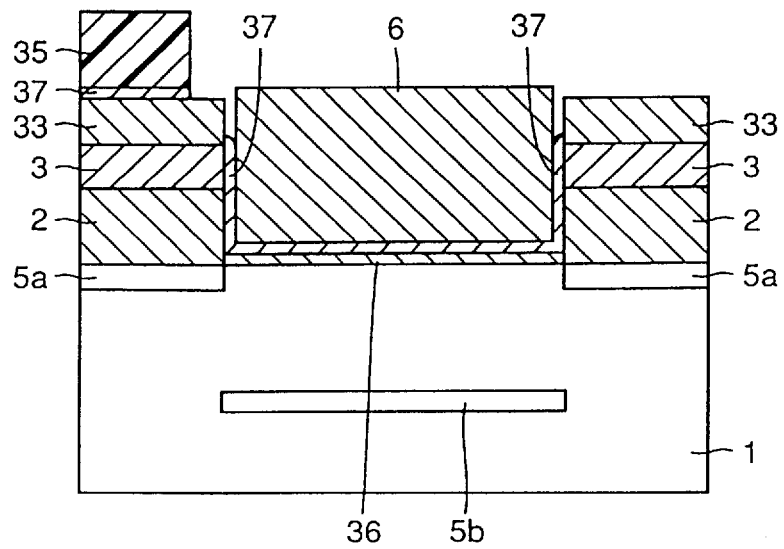
FIGS. 65 to 70 are cross sectional views showing a process of manufacturing a semiconductor device of an embodiment 11 of the invention.

Similarly to the manufacturing process of the embodiment 10 in FIG. 58, photoresist 35 defining the pattern for the gate electrode and the interconnection connected thereto is formed as shown in FIG. 64. Using photoresist 35 as an etching mask, eighth insulating film 37 is etched to form interconnection groove 31 as shown in FIG. 65. In this etching, eighth insulating film 37 is overetched by 50 nm.

Thereafter, sixth and third insulating films 33 and 6 are etched by the RIE method using photoresist 35 and eighth insulating film 37 as well as second insulating film 3 as a mask. Further, eighth insulating film 37 and underlying oxide film 36 located in the transistor opening are etched by the RIE method using photoresist 35 as well as underlying eighth and second insulating films 37 and 3 as a mask. Then, photoresist 35 is removed by the ashing method to form a structure shown in FIG. 66.

Figure 66:
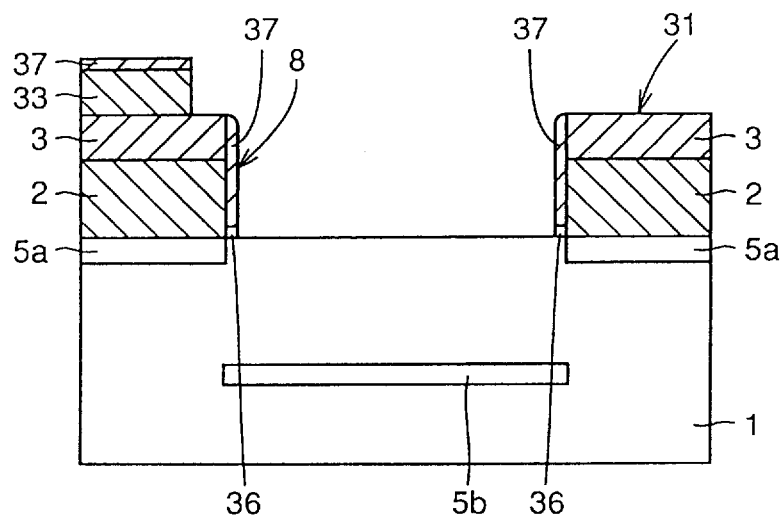
Figure 67:
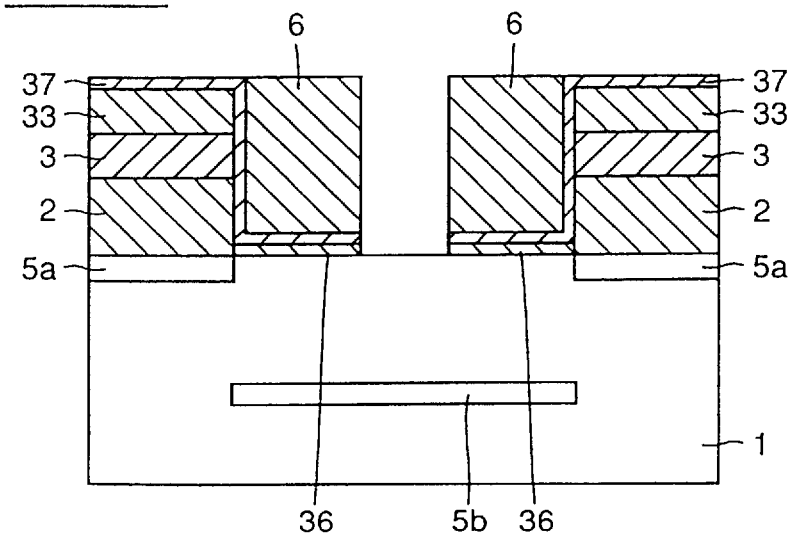

The portions from which third insulating film 6 and sixth insulating film 33 are removed form gate electrode opening 8 and interconnection groove 31, respectively. Side wall films made of insulating films 37 are formed on side surfaces of transistor opening 4. Eighth insulating film 37 located in transistor opening 4 does not exist at a position higher than the upper surface of second insulating film 3, and thus a configuration shown in FIG. 66 is formed, because eighth insulating film 37 in transistor opening 4 was etched by 50 nm in the former step and is etched by at least 50 nm in this step. FIG. 67 is a cross sectional view in the gate length direction showing the step in FIG. 66.

Figure 68:
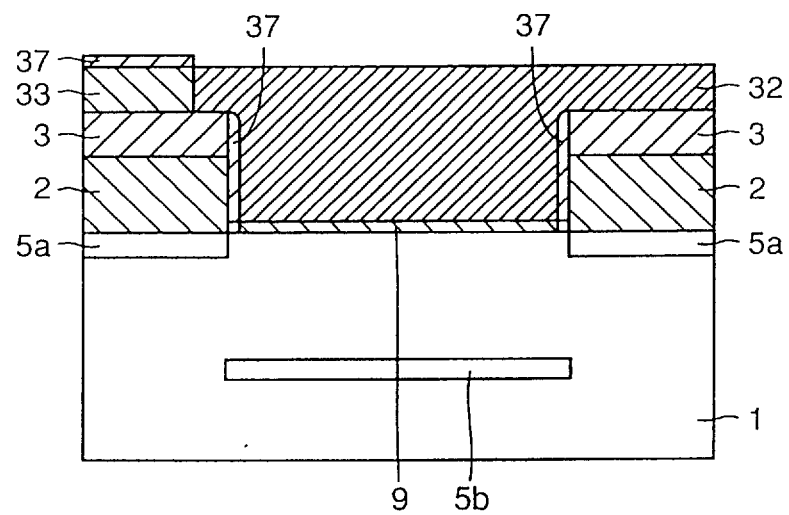
Figure 69:
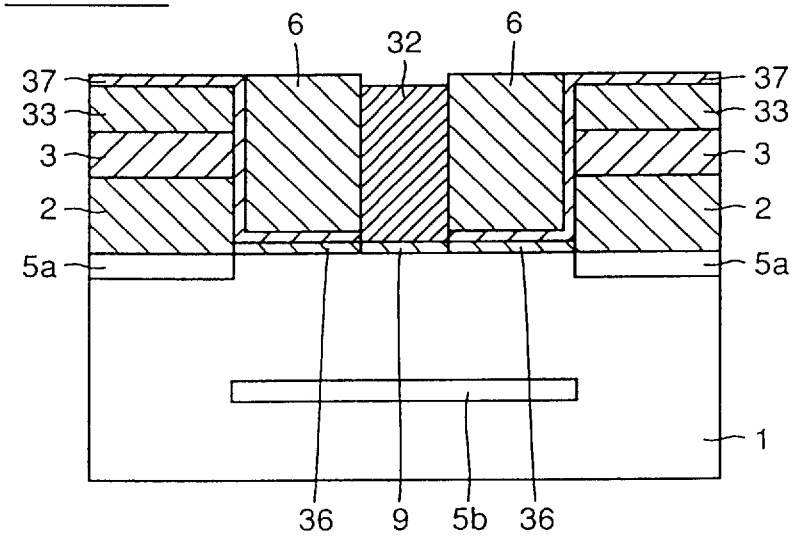

Thereafter, the thermal oxidation or CVD method is performed to form gate insulating film 9 shown in FIG. 68. After forming the conductive film by the CVD method, the conductive film is polished or etched back. Thereby, the conductive film located on eighth insulating film 37 is removed, and further the conductive film is etched back by a thickness equal to that of eighth insulating film 37. As a result, the surface of conductive film 32 is substantially flush with the surface of second insulating film 3. The conductive film thus formed fills gate electrode opening 8 and interconnection groove 31 to form interconnection and gate electrode 32. FIG. 69 is a cross sectional view in the gate length direction and showing the step in FIG. 68.

Figure 70:
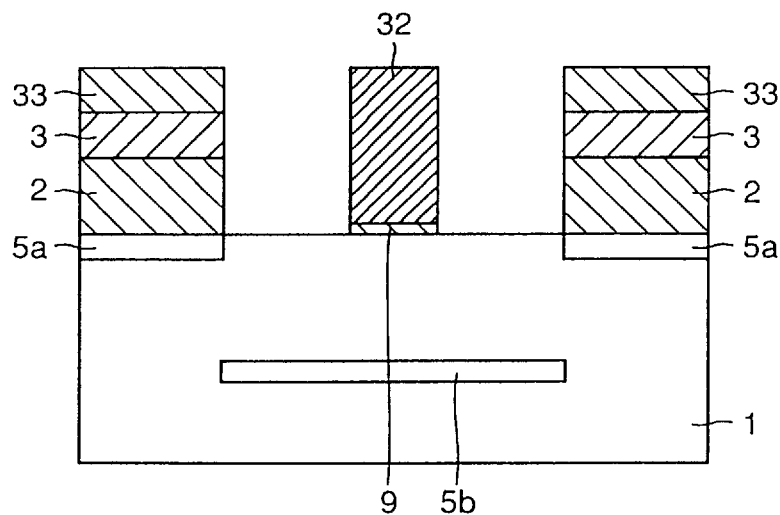

Thereafter, third insulating film 6 is removed by the RIE method, and then eighth insulating film 37 is removed the RIE method. Further, underlying oxide film 36 is removed. Thereby, a configuration shown in FIG. 70 is formed. Subsequent steps are similar to those of the embodiment 1 shown in FIGS. 9 to 12.

Underlying oxide film (thermal oxide film) 36 may be removed simultaneously with the etching of side wall insulating film 12 to be formed later. In the step shown in FIG. 70, side wall insulating film 12 may be formed without removing eighth insulating film 37, after removing third insulating film 6. In this case, eighth insulating film 37 and thermal oxide film 36 may be subsequently etched and removed by the RIE method for making contact between source/drain electrodes 14 and heavily doped impurity diffusion layers 13 formed at the surface of semiconductor substrate 1.

In this embodiment 11, since gate insulating film 9 is surrounded by thermal oxide film 36 and eighth insulating film 37, gate insulating film 9 is not laterally etched and removed in the step of removing third insulating film 6.

(Embodiment 12)

The gate electrode and interconnection may be simultaneously formed by the following method. Referring to FIGS. 71 to 77, the manufacturing process of the embodiment 12 will be described below.

Figure 71:
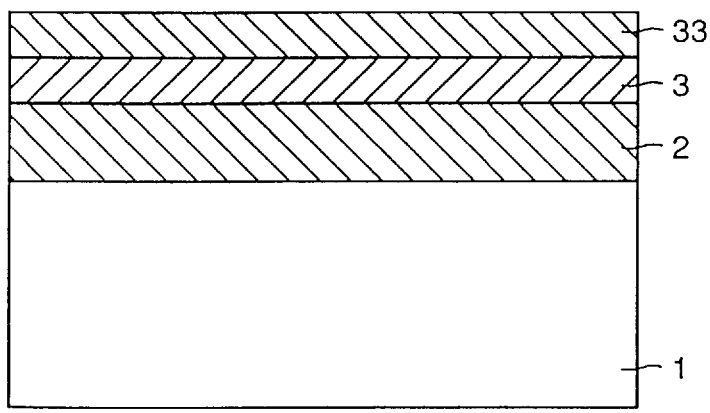
FIGS. 71 to 77 are cross sectional views showing a process of manufacturing a semiconductor device of an embodiment 12 of the invention.

As shown in FIG. 71, first insulating film 2 of about 200 nm in thickness made of a silicon oxide film is formed on semiconductor substrate 1 by the thermal oxidation or CVD method. Second insulating film (silicon nitride film) 3 of about 100 nm in thickness made of a material different from that of first insulating film 2 is formed by the CVD method. Sixth insulating film (silicon oxide film) 33 of about 100 nm in thickness made of a material different from that of second insulating film 3 is formed by the CVD method.

Figure 72:
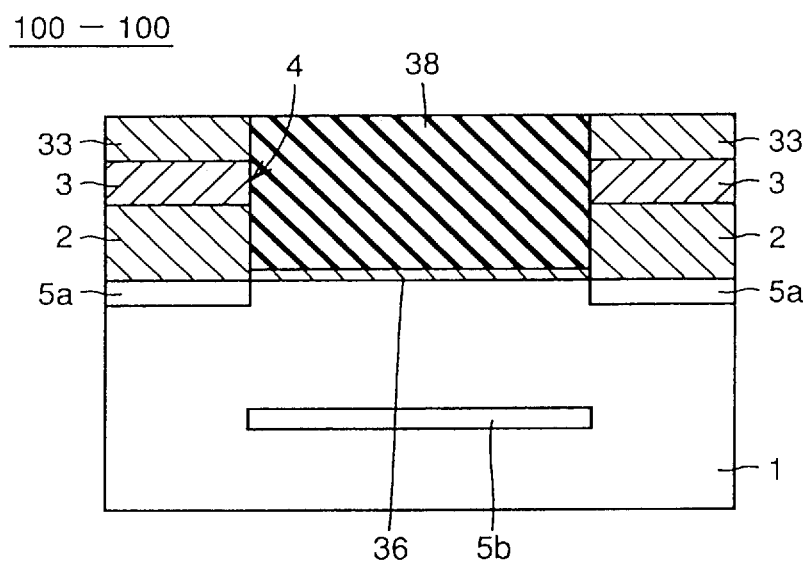

Thereafter, transistor opening 4 shown in FIG. 72 is formed by the photolithography and etching technique. Underlying oxide film 36 of about 20 nm made of a non-doped silicon oxide film is formed by the thermal oxidation and CVD method. Then, a PSG film (silicon oxide film doped with phosphorus) 38 of about 500 nm in thickness which fills transistor opening 4 is formed by the CVD method, and then is polished or etched back. Thereby, PSG film 38 of a configuration shown in FIG. 72 is formed.

Figure 73:
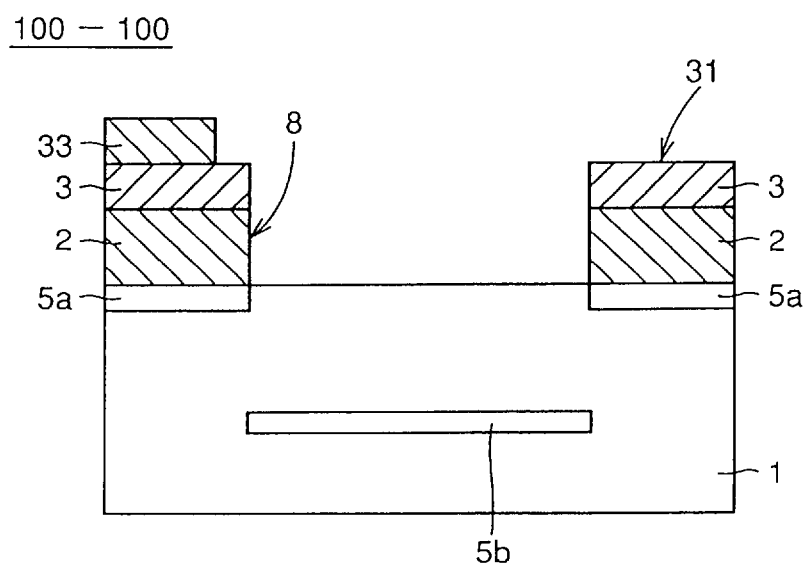
Figure 74:
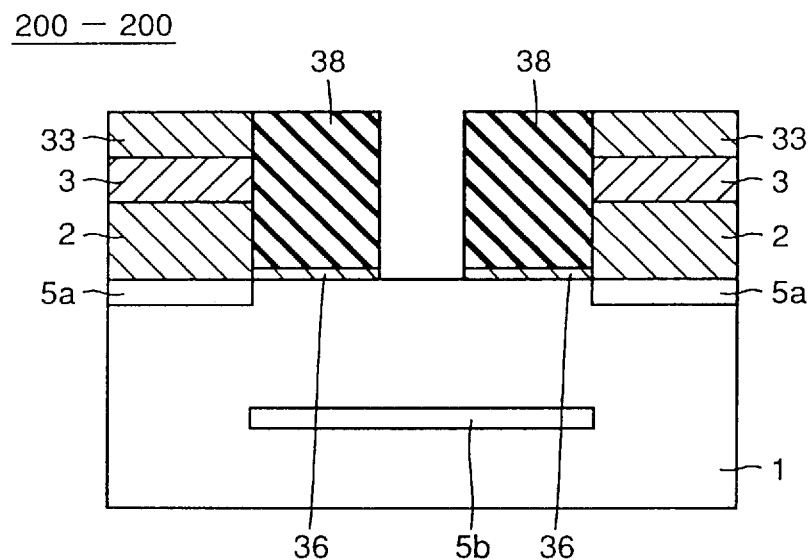

Then, sixth insulating film 33 and PSG film 38 are etched using a photoresist of a pattern configuration similar to that in the manufacturing process of the embodiment 10 shown in FIG. 58. Thereby, gate opening 8 and interconnection groove 31 shown in FIG. 73 are formed. FIG. 74 shows a section in the gate length direction in the step shown in FIG. 73.

Figure 75:
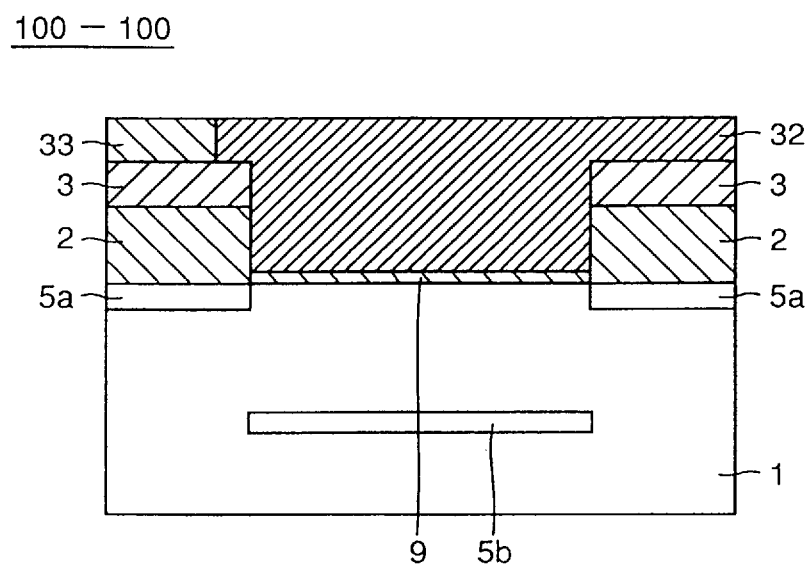
Figure 76:
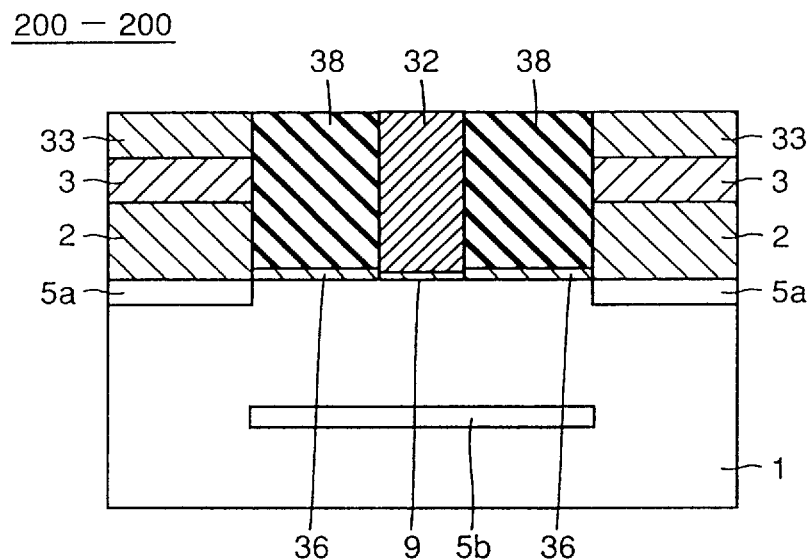

Then, as shown in FIG. 75, gate insulating film 9 of about 5 nm in thickness made of a silicon oxide film is formed by the thermal oxidation or CVD method. A conductive film of about 500 nm in thickness made of a polycrystalline silicon layer is formed, and subsequently polished or etched back to fill the gate electrode opening and interconnection groove 31 with the conductive film. In this manner, interconnection and gate electrode 32 is formed. FIG. 76 shows a section in the gate length direction in the step shown in FIG. 75.

Figure 77:
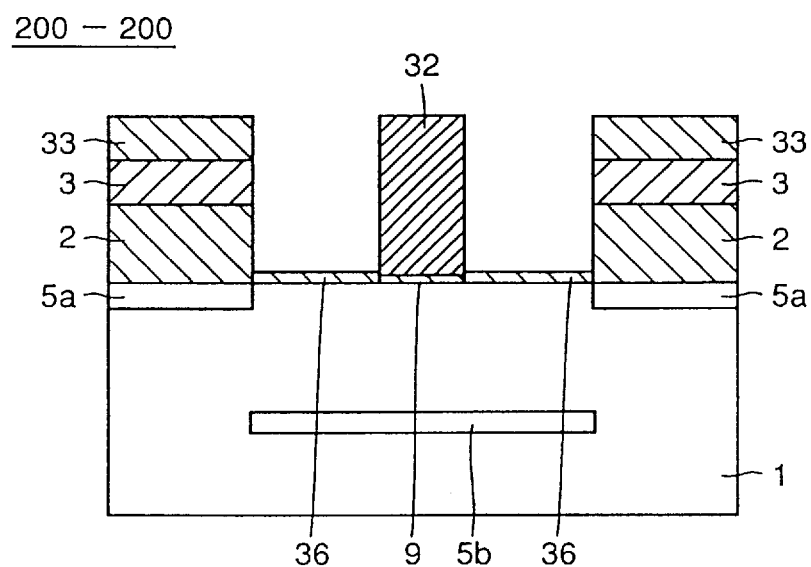

Thereafter, PSG film 38 is selectively removed with a vapor of HF to form a configuration shown in FIG. 77. Subsequent steps are similar to those of the embodiment 1 shown in FIGS. 9 to 12.

In this embodiment 12, since the interconnection portion of the interconnection and gate electrode 32 has a film thickness equal to that of sixth insulating film 33, the thickness of the interconnection portion can be easily controlled with a good reproducibility by controlling the thickness of sixth insulating film 33. The manufacturing process of the embodiment 12 is simpler than that of the embodiment 11.

(Embodiment 13)

According to the embodiment 13, it is possible to set alignment margin La at the gate end to 0 and to form the gate electrode and the interconnection without positional deviation between them. A manufacturing method will now be described below with reference to FIGS. 78 to 93.

Figure 78:
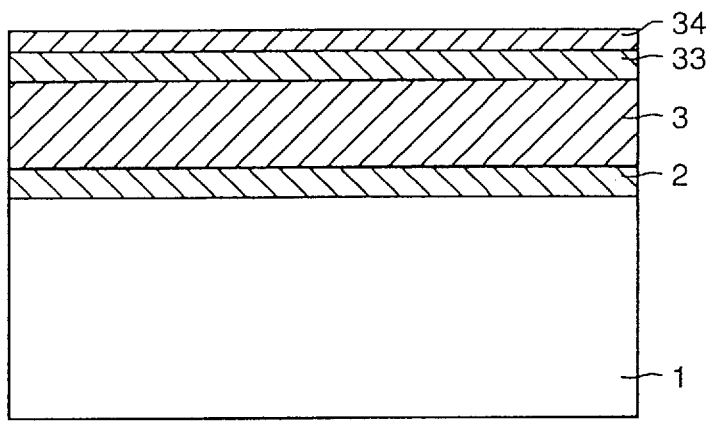
FIGS. 78 and 79 are cross sectional views showing a process of manufacturing a semiconductor device of an embodiment 13 of the invention.
Figure 79:
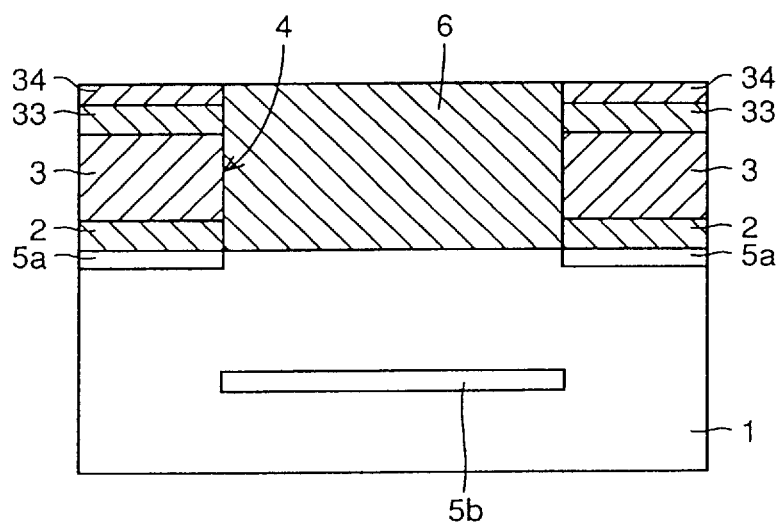
Figure 80:
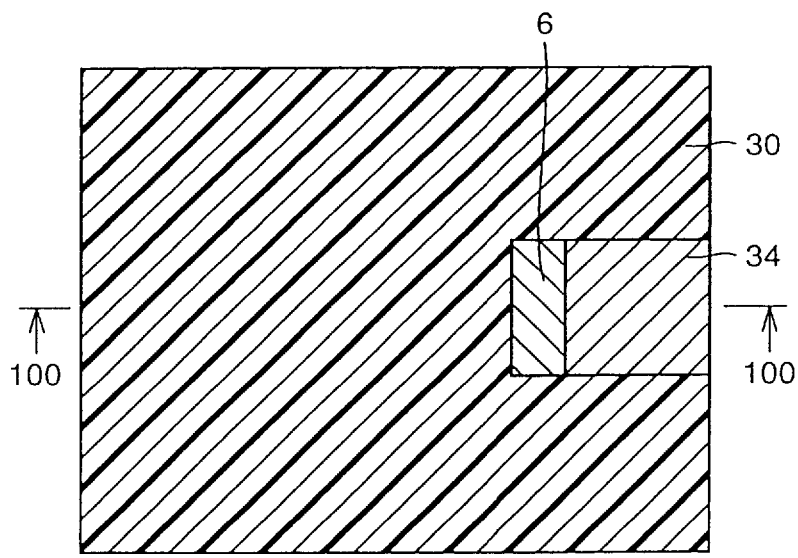
FIG. 80 is a plan view showing a process of manufacturing a semiconductor device of an embodiment 13 of the invention.

As shown in FIG. 78, first insulating film 2 of about 20 nm in thickness made of a silicon oxide film is formed on semiconductor substrate 1, and second insulating film 3 of about 250 nm in thickness made of a silicon nitride film is formed on first insulating film 2. Sixth insulating film 33 of about 100 nm in thickness made of a silicon oxide film is formed thereon, and seventh insulating film 34 of about 50 nm in thickness made of a silicon nitride film is formed on sixth insulating film 33. Thereafter, transistor opening 4 shown in FIG. 79 is formed, and then third insulating film 6 made of a silicon oxide film is formed to fill transistor opening 4.

Figure 81:
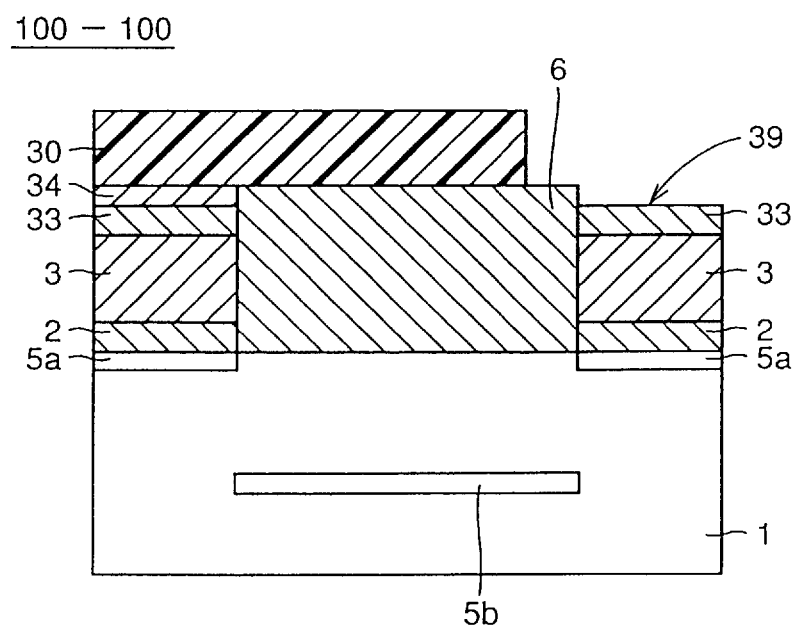
FIG. 81 is a cross sectional view showing a process of manufacturing a semiconductor device of an embodiment 13 of the invention.

A subsequent step is performed to form photoresist 30 having a patterned opening which covers a region for forming the interconnection connected to the gate electrode but is wider than this region by an amount depending on the alignment accuracy of photolithography. Using photoresist 30 as a mask, seventh insulating film 34 is etched to form a first interconnection groove 39 as shown in FIG. 81. FIG. 81 is a cross sectional view taken along line 100—100 in FIG. 80. Thereafter, photoresist 30 is removed.

Figure 82:
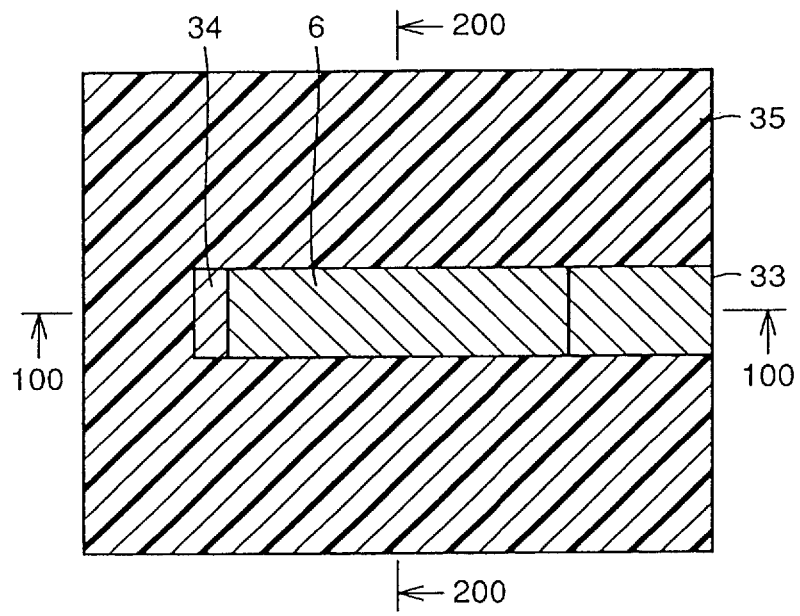
FIG. 82 is a plan view showing a process of manufacturing a semiconductor device of an embodiment 13 of the invention.
Figure 83:
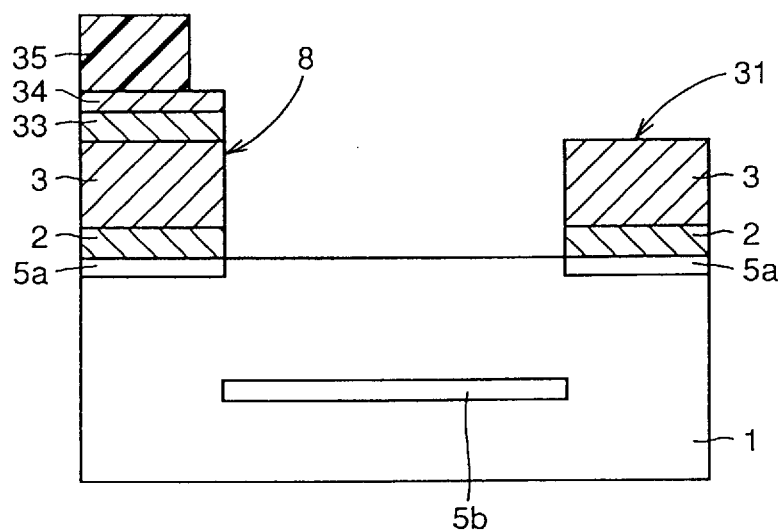
FIG. 83 is a cross sectional views showing a process of manufacturing a semiconductor device of an embodiment 13 of the invention.
Figure 84:
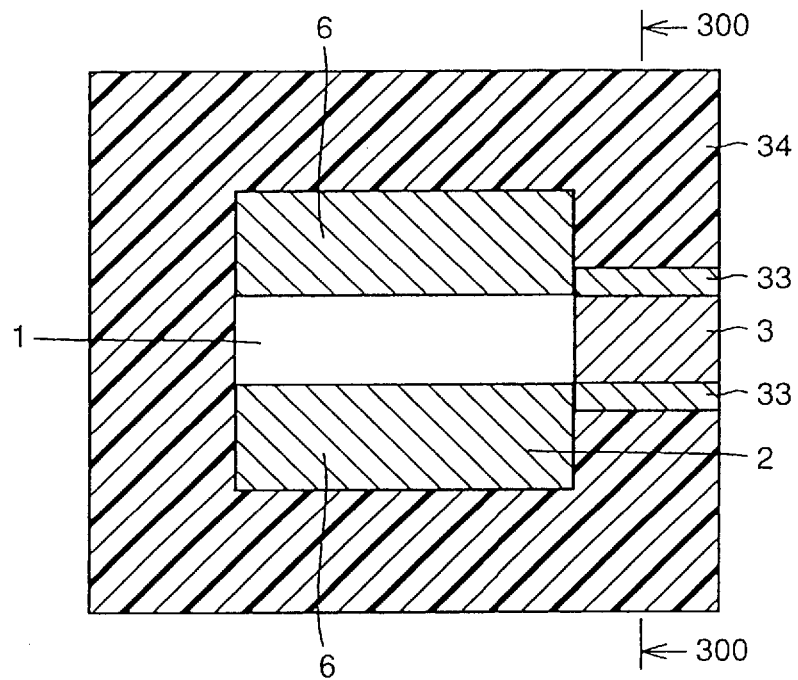
FIG. 84 is a plan view showing a process of manufacturing a semiconductor device of an embodiment 13 of the invention.
Figure 85:
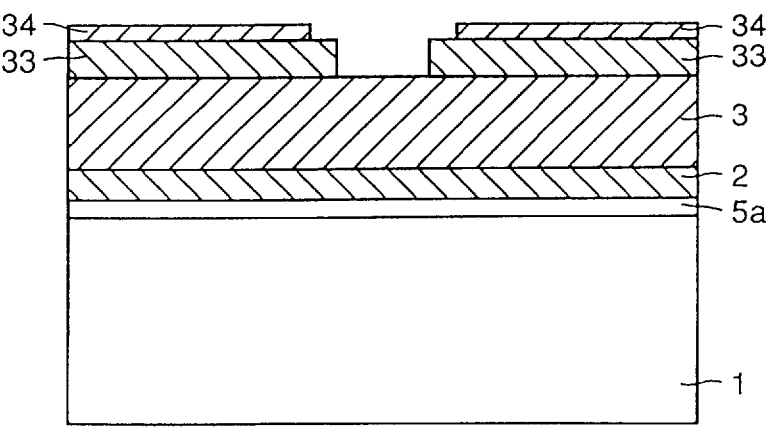
FIGS. 85 to 93 are cross sectional views and a plan showing a process of manufacturing a semiconductor device of an embodiment 13 of the invention.
Figure 86:
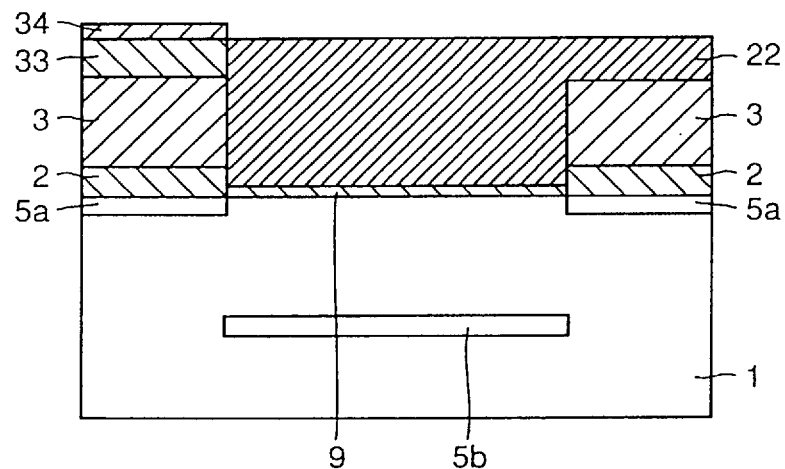

As shown in FIG. 82, photoresist 35 for forming the gate electrode and interconnection is formed. Using photoresist 35 and second insulating film 3 as a mask, third and sixth insulating films 6 and 33 are etched to form gate electrode opening 8 and second interconnection groove 31 as shown in FIG. 83. FIG. 84 is a plan view showing the step in FIG. 83. FIG. 85 is a cross sectional view taken along line 300—300 in FIG. 84.

Figure 87:
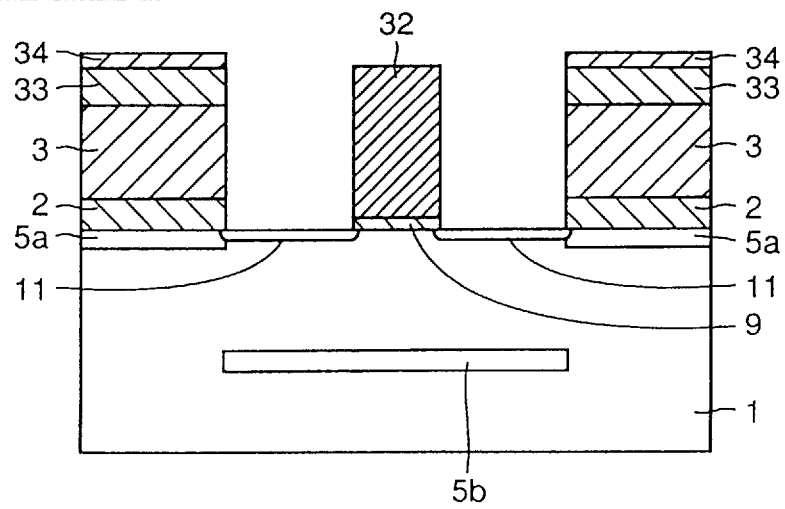
Figure 88:
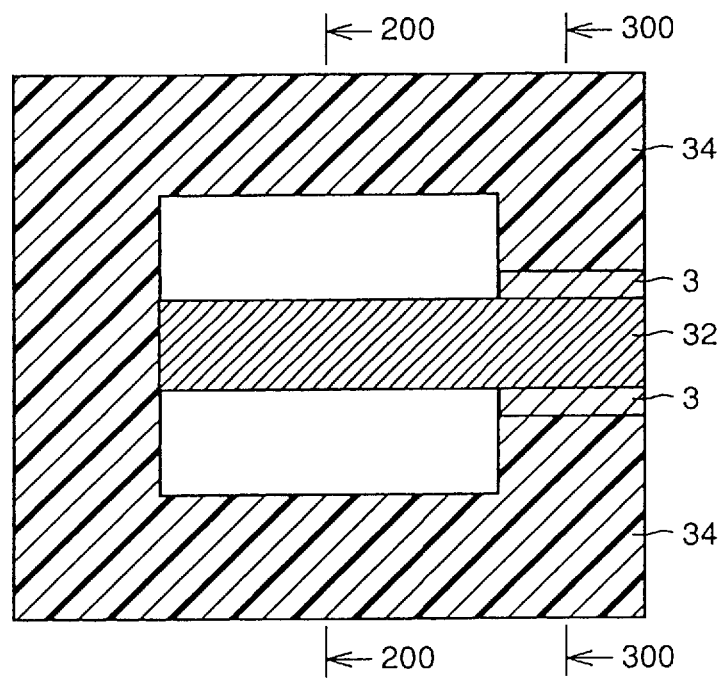
Figure 89:
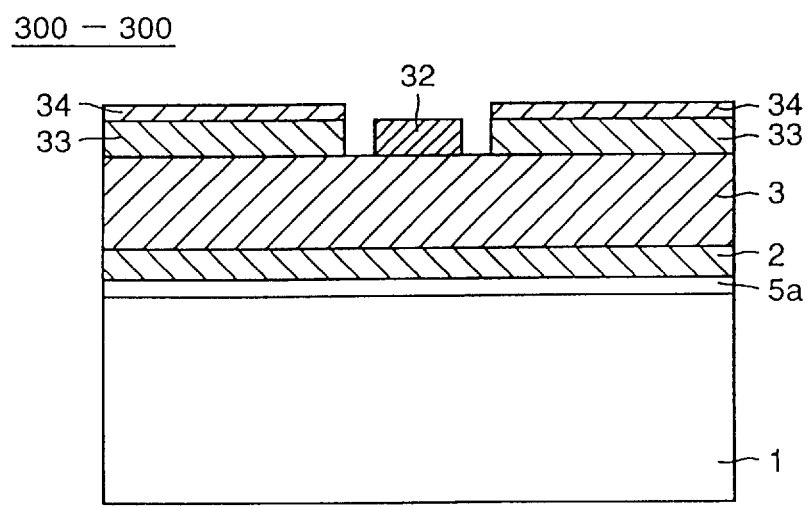

A step similar to that of the embodiment 12 shown in FIG. 75 is performed to form gate insulating film 9 as well as interconnection and gate electrode 32. Etchback is effected to reduce the film thickness of interconnection and gate electrode 32 by an amount corresponding to the thickness of seventh insulating film 34. Thereafter, third insulating film 6 filling transistor opening 4 is etched, and then lightly doped impurity diffusion layers 11 are formed as shown in FIG. 87. FIG. 88 is a plan view showing the step in FIG. 87. FIG. 89 is a cross sectional view taken along line 300—300 in FIG. 88. As shown in FIGS. 88 and 89, predetermined spaces are formed between interconnection and gate electrode 32 and sixth insulating film 33.

Figure 90:
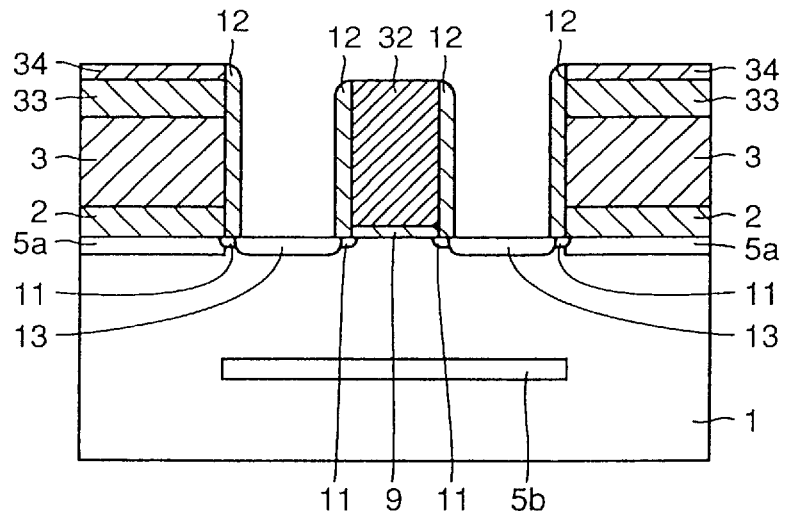
Figure 91:
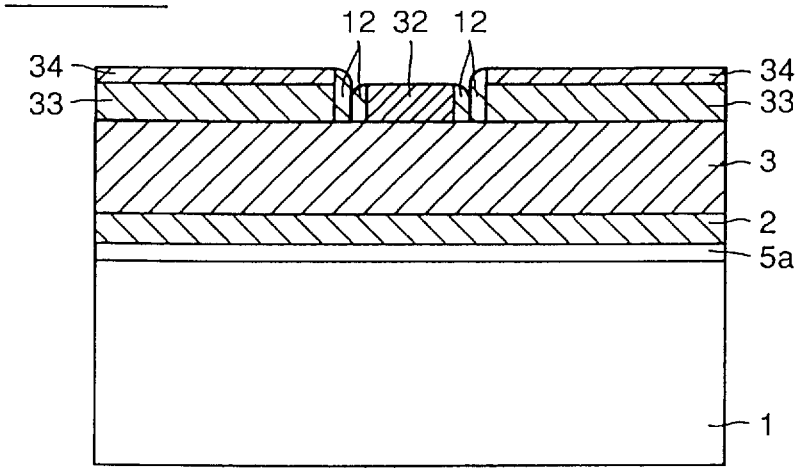

As shown in FIG. 90, after forming side wall insulating films 12, heavily doped impurity diffusion layers 13 are formed. The step in FIG. 90 is also shown in FIG. 91 which is a cross sectional view taken along line 300—300. Referring to FIG. 91, side wall insulating films 12 fill spaces between interconnection and gate electrode 32 and sixth insulating film 33.

Figure 92:
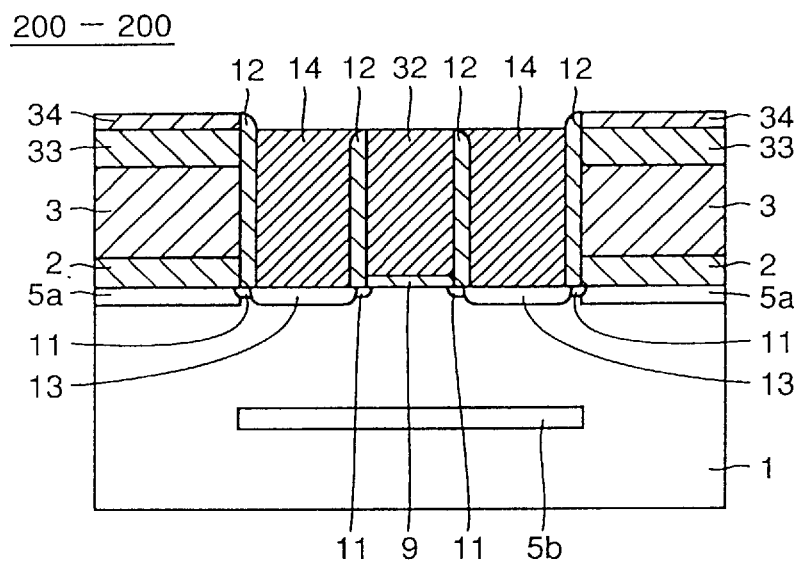
Figure 93:
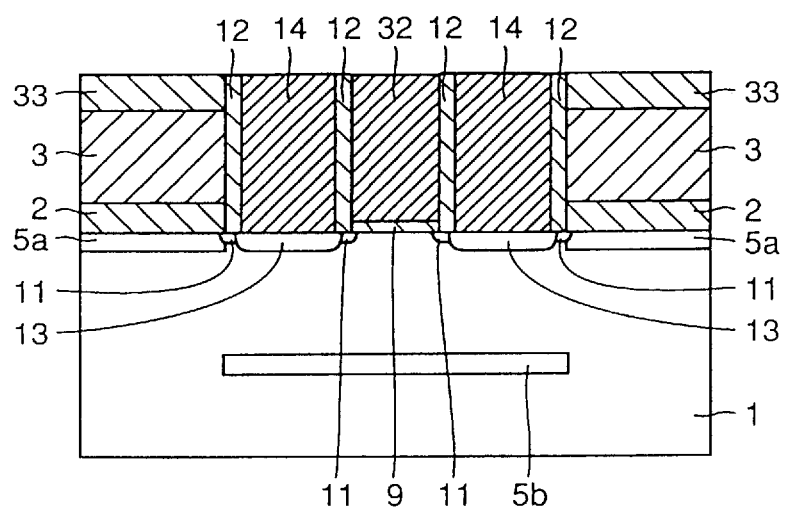

Thereafter, source/drain electrodes 14 are formed as shown in FIG. 92. After removing seventh insulating film 34 by dry etching or with hot phosphoric acid, side wall insulating films 12 are polished to flatten the same. Thereby, the whole supper surface becomes flat as shown in FIG. 93.

(Embodiment 14)

The embodiment 14 relates to an interconnection structure connected to source/drain electrode and a method for the same. In the embodiment 13 described before, the interconnection which is formed simultaneously with the gate electrode is isolated from source/drain electrode 14 by side wall insulating film 12. In an actual device, interconnections connected to source/drain electrodes must be provided. A method of manufacturing such interconnections will be described below with reference to FIGS. 94 to 99.

Figure 94:
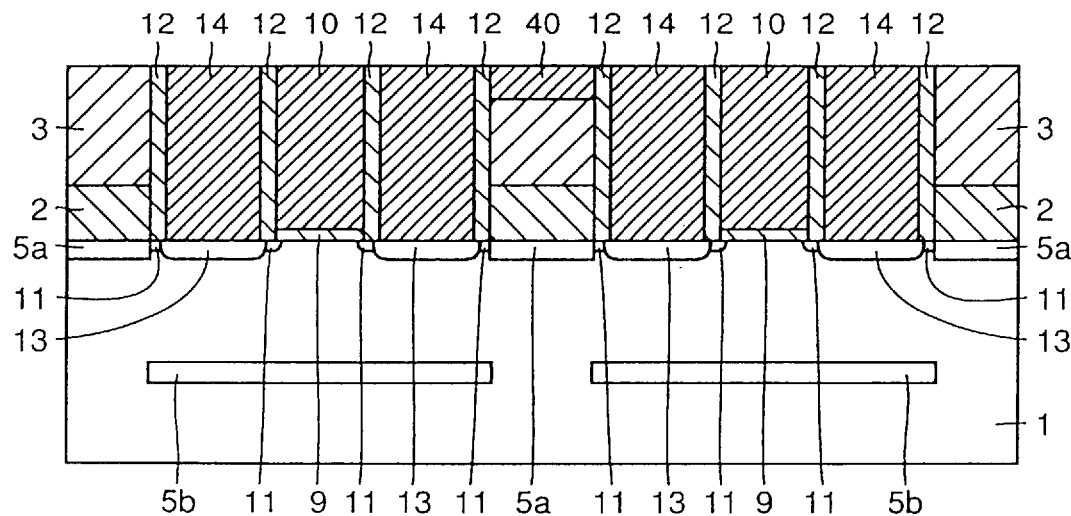
FIG. 94 is a cross sectional view showing a process of manufacturing a semiconductor device of an embodiment 14 of the invention.
Figure 95:
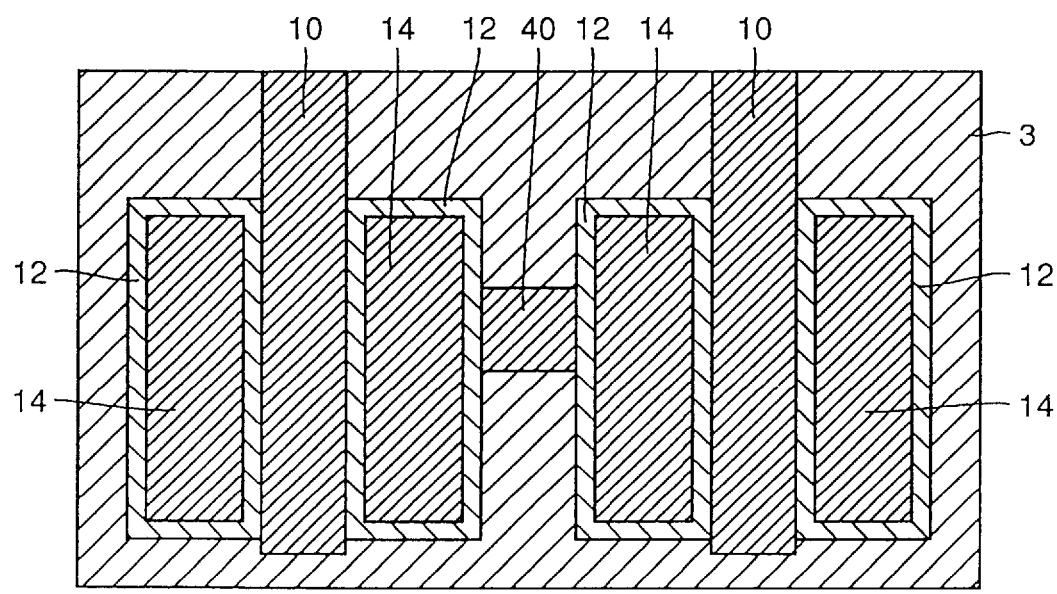
FIGS. 95 and 96 are plan views showing a process of manufacturing a semiconductor device of an embodiment 14 of the invention.

In a structure provided with two neighboring transistors shown in FIG. 94, an interconnection 40 is formed between source/drain electrodes 14 of the neighboring transistors. Interconnection 40 is formed, for example, simultaneously with buried interconnection and gate electrode 32 formed in the step of the embodiment 9 shown in FIG. 55. Interconnection 40 is isolated from source/drain electrodes 14 by side wall insulating films 12. FIG. 95 is a plan view showing the step in FIG. 94.

Figure 96:
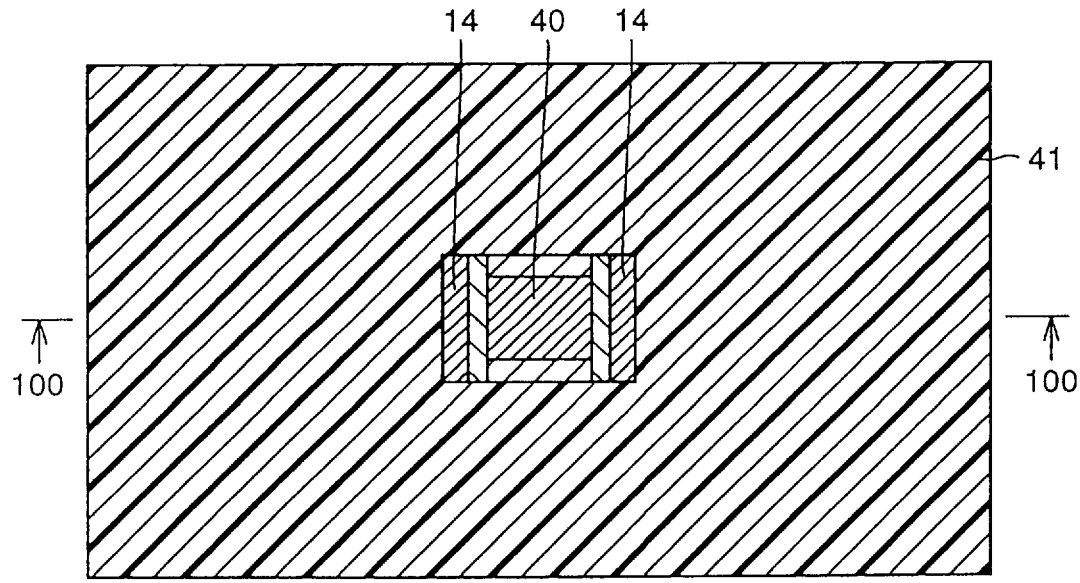
Figure 97:
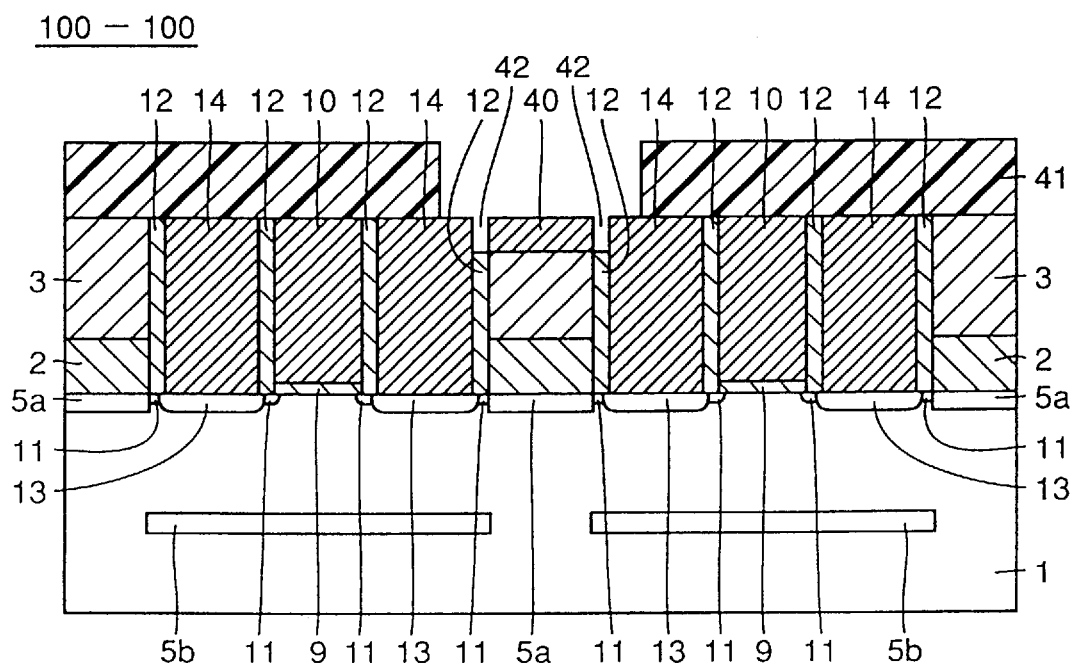
FIGS. 97 to 99 are cross sectional views and a plan showing a process of manufacturing a semiconductor device of an embodiment 14 of the invention.

A subsequent step is performed to form a photoresist 41 which partially exposes side wall insulating films 12 insulating interconnection 40 from source/drain electrodes 14, as shown in FIG. 96. Using photoresist 41 as a mask, upper portions of side wall insulating films 12 are etched by about 200 nm to remove only the upper portions of side wall insulating films 12. Thereby, connection grooves 42 are formed between interconnection 40 and source/drain electrodes 14 as shown in FIG. 97. In this case, side wall insulating films 12 are etched to remove only their upper portions, and this etching is not performed to an extent exposing the surface of semiconductor substrate 1.

Figure 98:
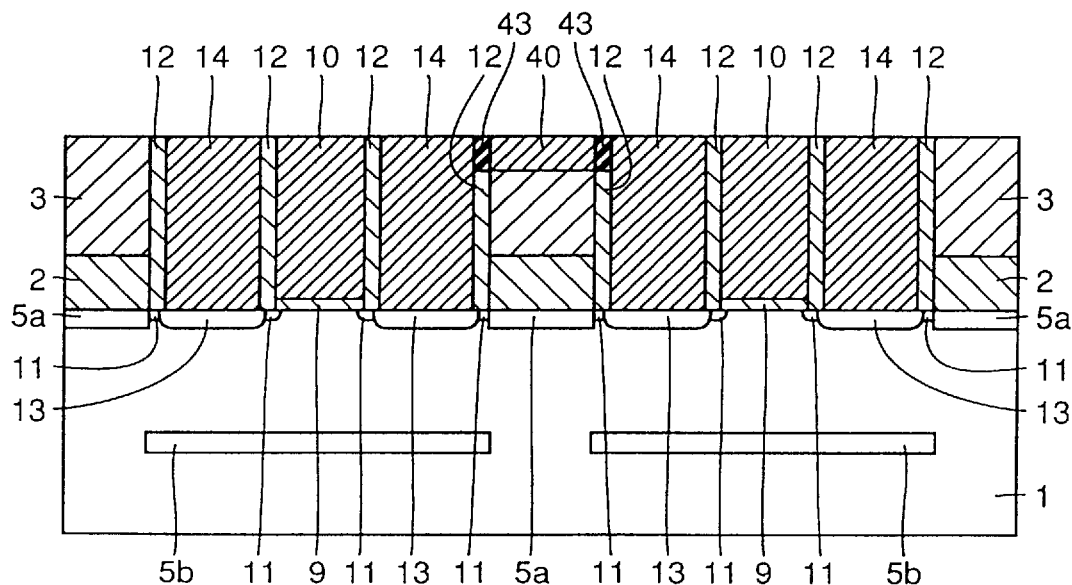
Figure 99:
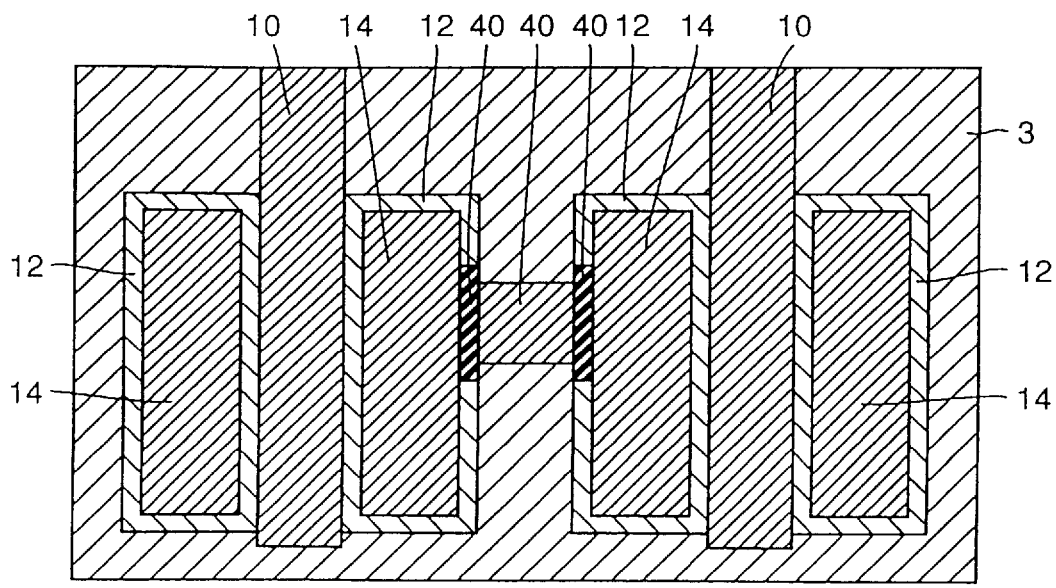

Then, a conductive film of about 100 nm in thickness made of a polycrystalline silicon layer is formed to fill connection grooves 42 by the CVD method or the like, and then is polished or etched back to form connection conductive films 43 as shown in FIG. 98. FIG. 99 is a plan view showing the step shown in FIG. 98. As shown in FIGS. 98 and 99, interconnection 40 is electrically connected to source/drain electrodes 14 via connection conductive films 43. Connection conductive film 43 may be an amorphous silicon layer, a metal layer, a metal silicide layer or a metal nitride film.

In the case where interconnection 40 made of a metal silicide layer is arranged for connecting a PMISFET and an NMISFET, impurities of different conductivity types may mutually diffuse due to thermal treatment such as reflow for an interlayer film after formation of transistors, and consequently transistor characteristics may vary. For preventing this, connection conductive films 43 may be made of a barrier metal such as TiN, whereby connection conductive film 43 can prevent diffusion of impurities, and thus the above problem can be avoided.

(Embodiment 15)

The embodiment 15 relates to a structure and a manufacturing method for reducing a contact resistance in a structure in which an interconnection is connected to a source/drain electrode through a contact hole. Referring to FIG. 100 to 104, a manufacturing process of the embodiment 15 will be described below.

Figure 100:
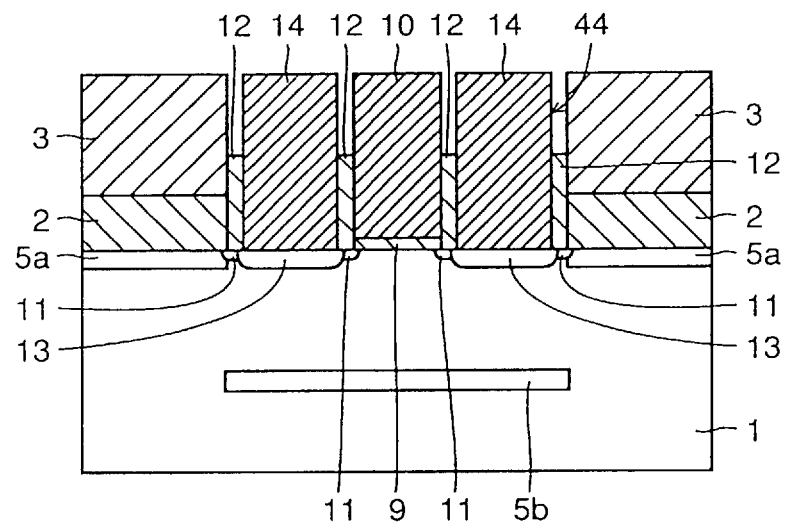
FIGS. 100 to 104 are cross sectional views showing a process of manufacturing a semiconductor device of an embodiment 15 of the invention.
Figure 101:
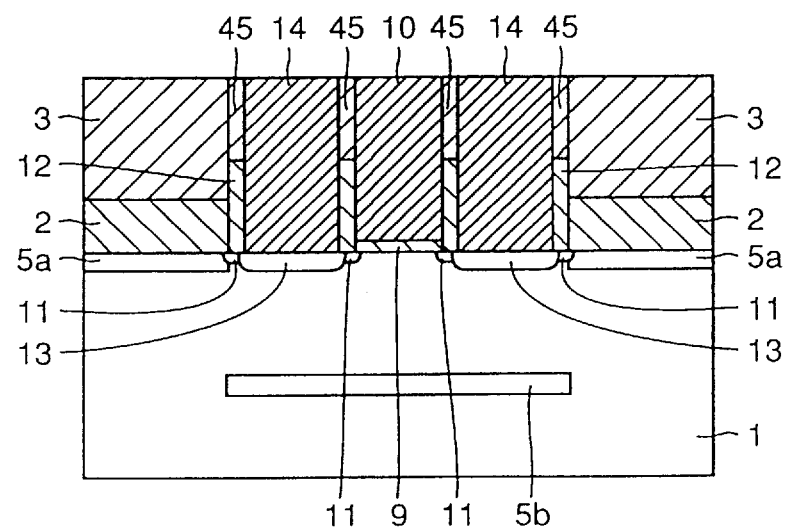

After the manufacturing process of the embodiment 1 shown in FIG. 11, side wall insulating films 12 are etched back to remove their upper portions, so that grooves 44 are formed as shown in FIG. 100. As shown in FIG. 101, the CVD method is performed to form a ninth insulating film 45 of about 100 nm in thickness made of the same material (silicon nitride) as second insulating film 3 as shown in FIG.

101, and they are polished or etched back to form ninth insulating films 45 filling grooves 44.

Figure 102:
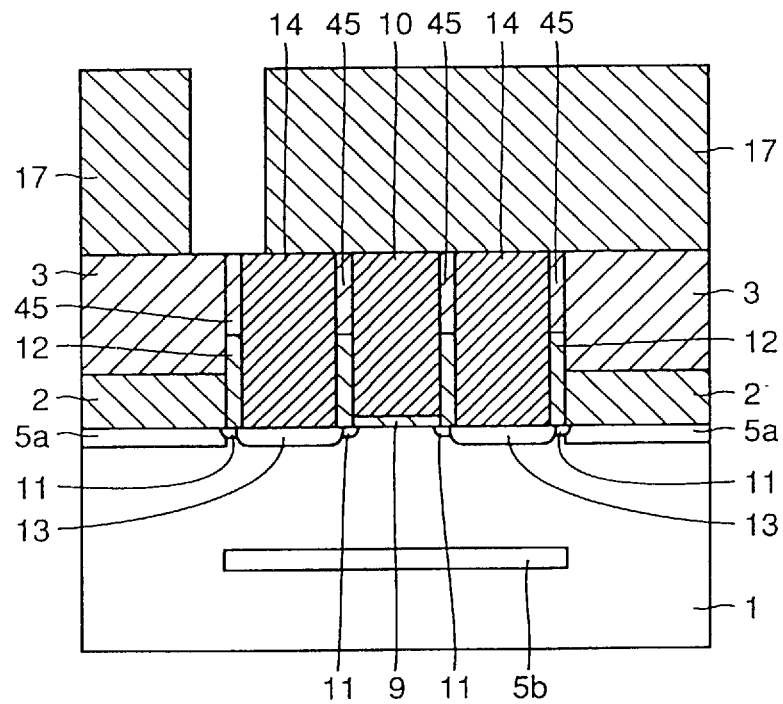
Figure 103:
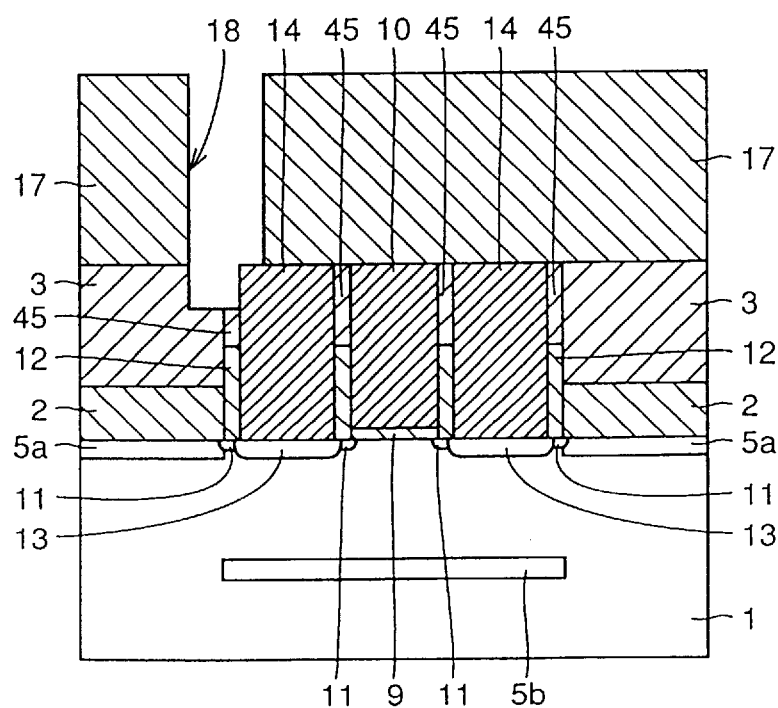

As shown in FIG. 102, the CVD method is performed to form an interlayer insulating film 17 of about 1000 nm in thickness made of a silicon oxide film, and then contact hole 18 is formed by photolithography and etching technique. The etching for forming contact hole 18 is effected on interlayer insulating film 17 using second and ninth insulating films 3 and 45 as an etching stopper. Second and ninth insulating films 3 and 45 are then etched to form contact hole 18 having a configuration shown in FIG. 103. The etching quantities of second and ninth insulating films 3 and 45 are about 200 nm, so that contact hole 18 formed by the etching of second and ninth insulating films 3 and 45 does not reach the surface of semiconductor substrate 1.

Figure 104:
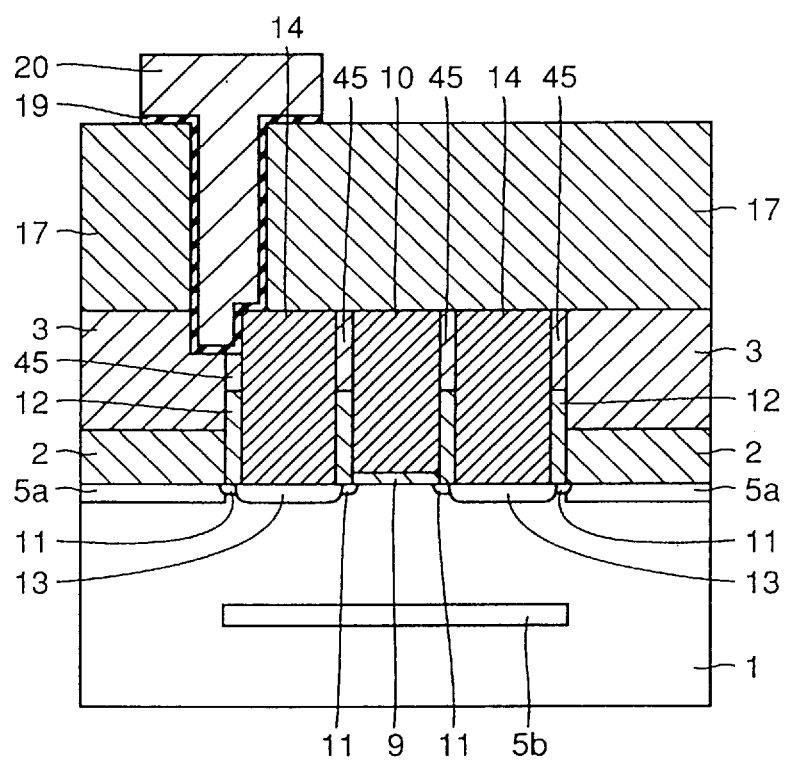

As shown in FIG. 104, a barrier metal of about 50 nm in thickness made of TiN is formed by the CVD or PVD method, and an aluminum alloy layer is formed thereon by the CVD or PVD method. The barrier metal layer and aluminum alloy layer are patterned by the photolithography and dry etching technique to form barrier metal layer 19 and second interconnection 20 as shown in FIG. 104. Second interconnection 20 is in contact with the upper and side surfaces of source/drain electrode 14. Since second interconnection 20 is in contact with not only the upper surface of source/drain electrode 14 but also the side surface thereof, a contact area between second interconnection 20 and source/drain electrodes 14 can be large, so that the contact resistance can be small. In this embodiment 15, interlayer insulating film 17 is etched using second and ninth insulating films 3 and 45 as an etching stopper, and then only second and ninth insulating films 3 and 45 are etched, so that the etching quantities of them can be controlled easily as compared with the case where these insulating films are etched simultaneously.

(Embodiment 16)

This embodiment 16 also relates to a structure and a manufacturing method reducing a connection resistance in a structure, in which an interconnection is connected to a source/drain electrode through a contact hole. Referring to FIGS. 105 to 113, a manufacturing process of the embodiment 16 will be described below.

Figure 105:
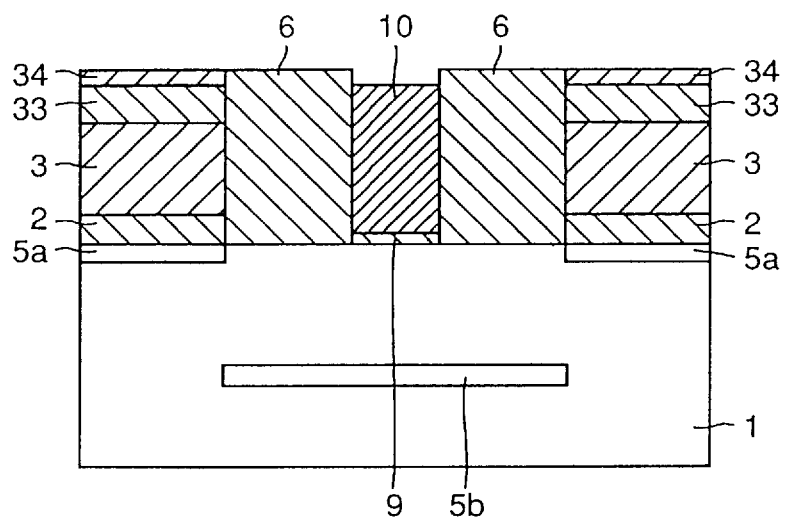
FIGS. 105 to 113 are cross sectional views showing a process of manufacturing a semiconductor device of an embodiment 16 of the invention.
Figure 106:
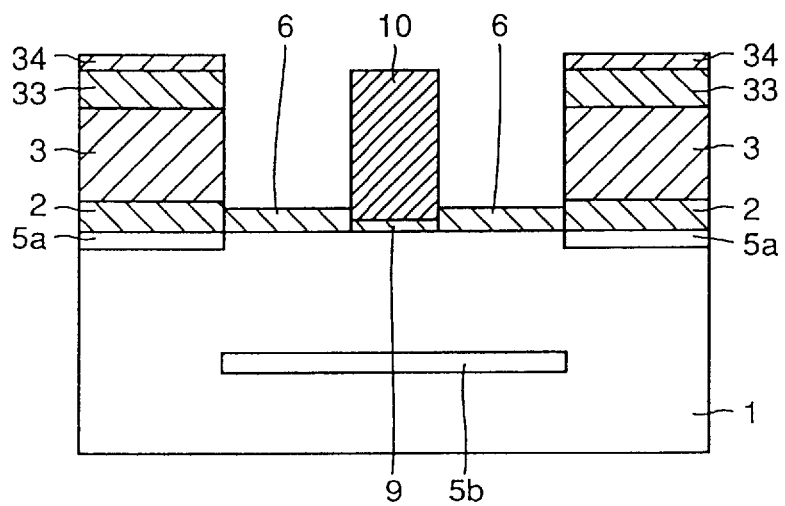
Figure 107:
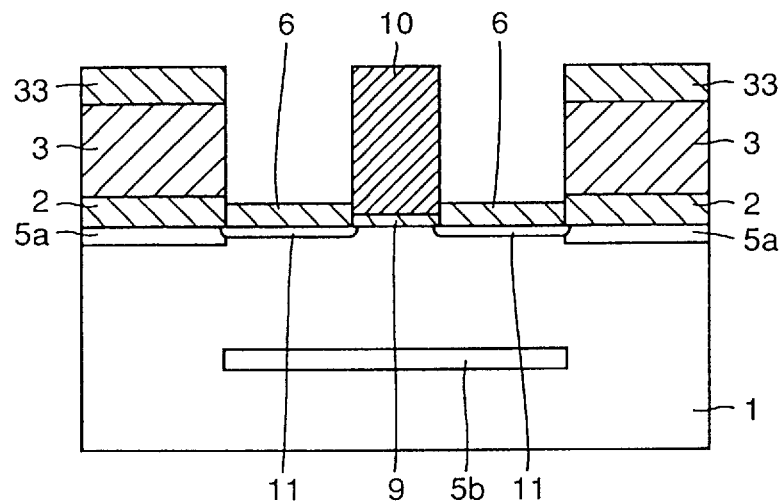

After the process of the embodiment 10 shown in FIG. 61, gate insulating film 9 and gate electrode 10 are formed as shown in FIG. 105. Gate electrode 10 is etched back to have a surface which is lower than the surface of seventh insulating film (silicon nitride film) 34 and is substantially at the same level as the upper surface of sixth insulating film (silicon oxide film) 33. Thereafter, third insulating film 6 is etched back to reduce the thickness of third insulating film 6 to about 20 nm as shown in FIG. 106. Thereafter, lightly doped impurity diffusion layers 11 are formed as shown in FIG. 107.

Figure 108:
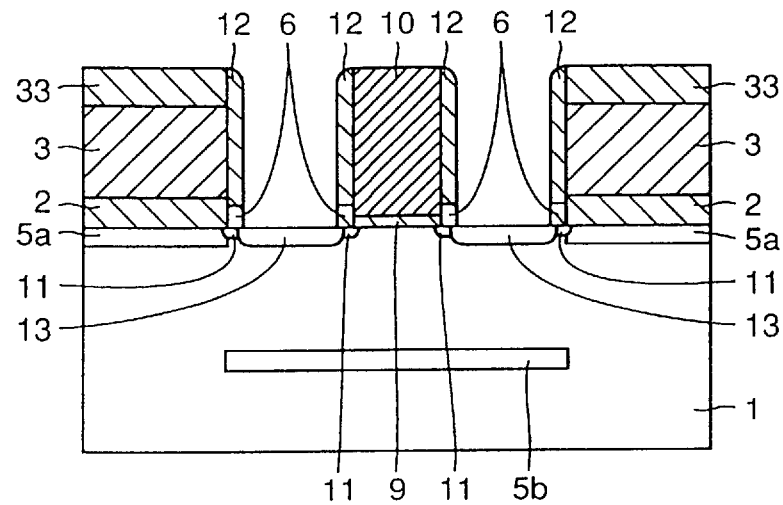

Then, the CVD method and etchback method is performed to form side wall insulating films 12 of about 50 nm in thickness made of the same material (silicon nitride) as that of second insulating film 3, as shown in FIG. 108. Since third insulating films 6 made of the silicon oxide films exist under the silicon nitride films, i.e., side wall insulating films 12 are not in direct contact with silicon substrate 1. If silicon were in direct contact with the silicon nitride film, an interface level would occur, which would impair the reliability of the transistors. The embodiment can prevent this problem. Then, using side wall insulating films 12 as a mask, impurity is ion-implanted to form heavily doped impurity diffusion layers 13.

Figure 109:
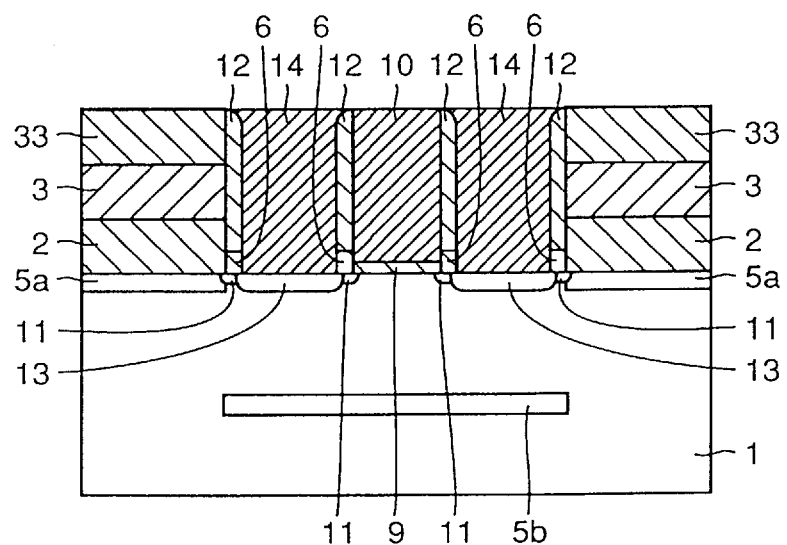
Figure 110:
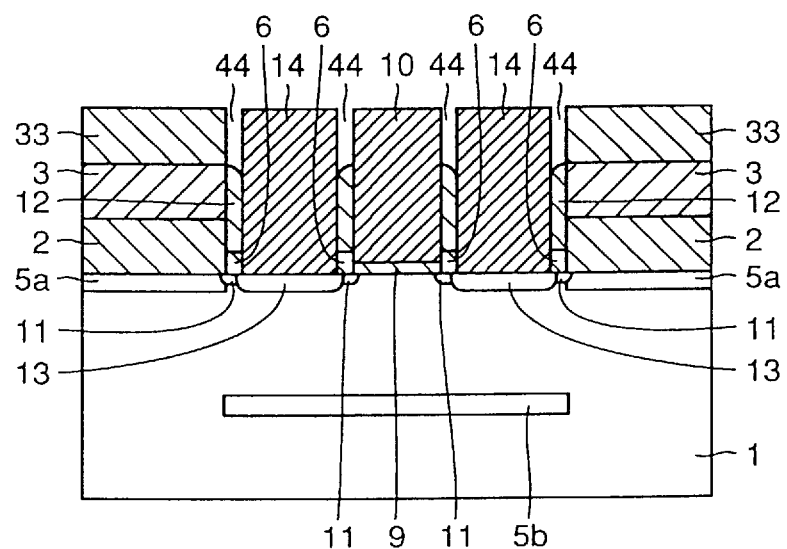
Figure 111:
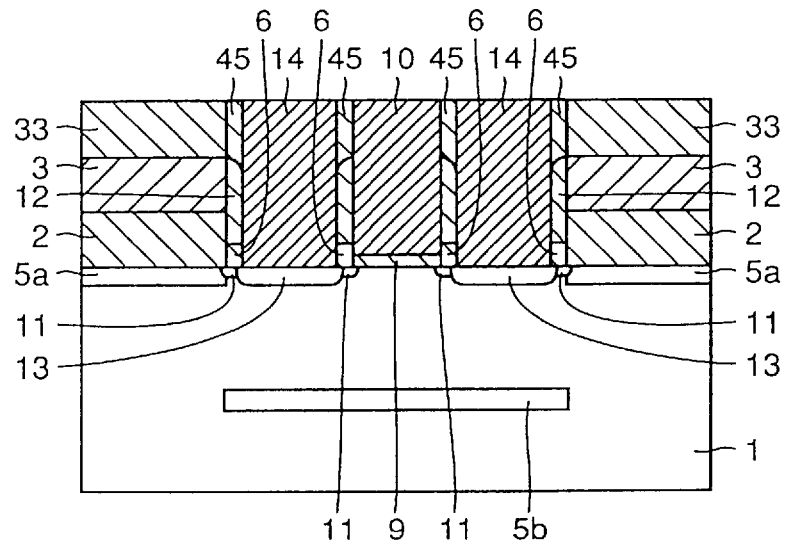

After forming the conductive film by the CVD method, the upper surface of the conductive film is polished or etched back to form source/drain electrodes 14 as shown in FIG. 109. Thereafter, upper portions of side wall insulating films 12 are etched back by a depth of 150 nm, so that grooves 44 are formed as shown in FIG. 110. Thereafter, ninth insulating film 45 made of the same material as sixth insulating film 33 is formed by the CVD method, and is polished or etched back to form ninth insulating films 45 filling grooves 44 as shown in FIG. 111.

Figure 112:
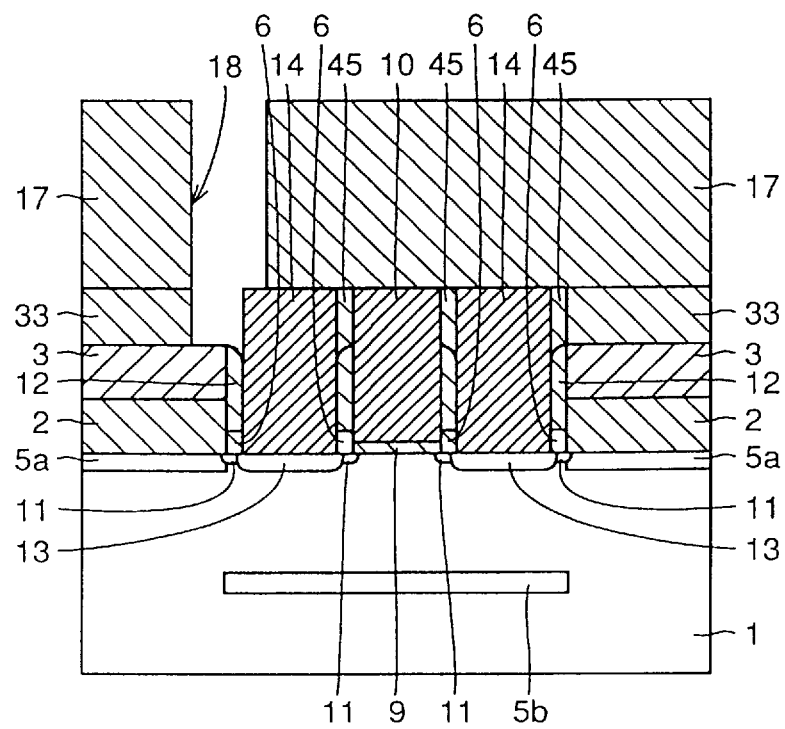
Figure 113:
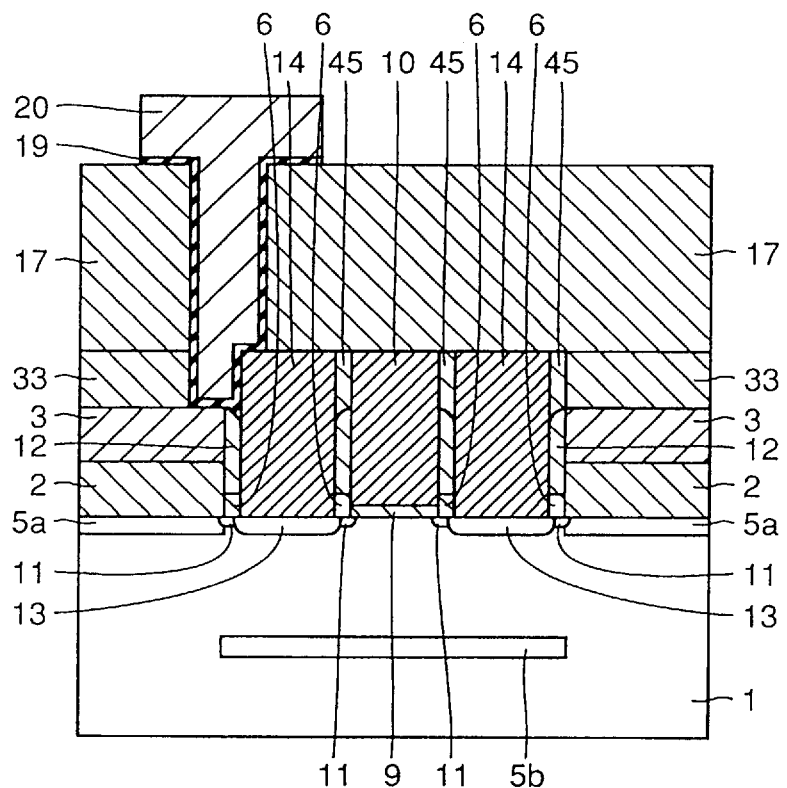

As shown in FIG. 112, the CVD method is performed to form interlayer insulating film (silicon oxide film) 17 of about 1000 nm in thickness made of the same material as sixth insulating film 33, and then a predetermined region of interlayer insulating film 17 is etched to form contact hole 18 using second insulating film 3 and side wall insulating film 12 as well as source/drain electrode 14 as an etching stopper. The etching for forming contact hole 18 can be effected continuously on the interlayer insulating film 17, sixth insulating film 6 and ninth insulating film 45, because these films are made of the same kind of material. This simplifies the manufacturing process. Thereafter, barrier metal layer 19 and second interconnection 20 filling contact hole 18 are formed. In this embodiment, ninth insulating films 45 are arranged only inside grooves 44. However, the step in FIG. 111 may be eliminated, and grooves 44 may be filled with interlayer insulating film 17.

(Embodiment 17)

This embodiment 17 relates to a structure and a manufacturing method which allow simultaneous formation of a gate electrode and an interconnection film connected thereto, similarly to the embodiments 9–12. A manufacturing process of the embodiment 17 will be described below with reference to FIGS. 114 to 124.

Figure 114:
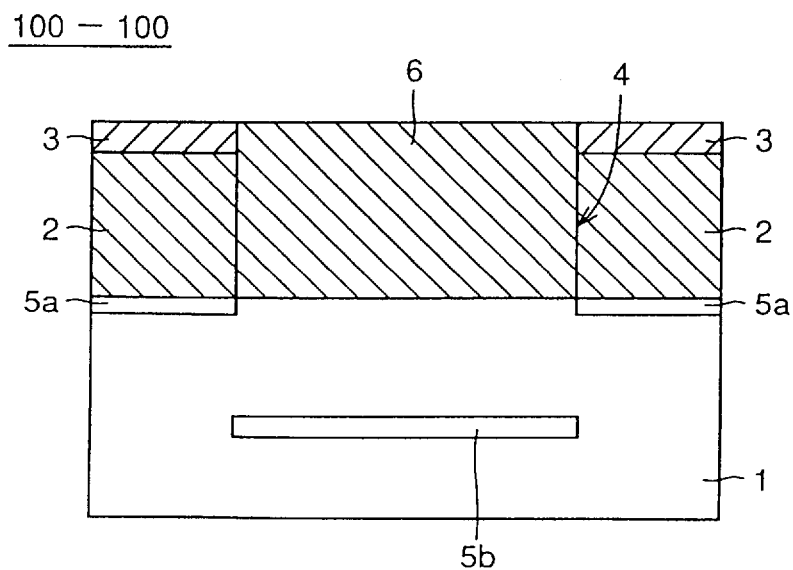
FIG. 114 is a cross sectional view showing a process of manufacturing a semiconductor device of an embodiment 17 of the invention.

First insulating film 2 of about 500 nm in thickness made of a silicon oxide film is formed on semiconductor substrate 1 by the CVD method, and second insulating film 3 of about 150 nm in thickness made of a silicon nitride film is formed thereon by the CVD method. Thereafter, transistor opening 4 is formed. Then, ion implantation is performed to form ion-implanted layers 5a and 5b. Third insulating film 6 made of a silicon oxide film is formed by the CVD method, and then is polished or etched back to form third insulating film 6 inside transistor opening as shown in FIG. 114. These steps are similar to those of the embodiment 1 shown in FIGS. 1 to 4.

Figure 116:
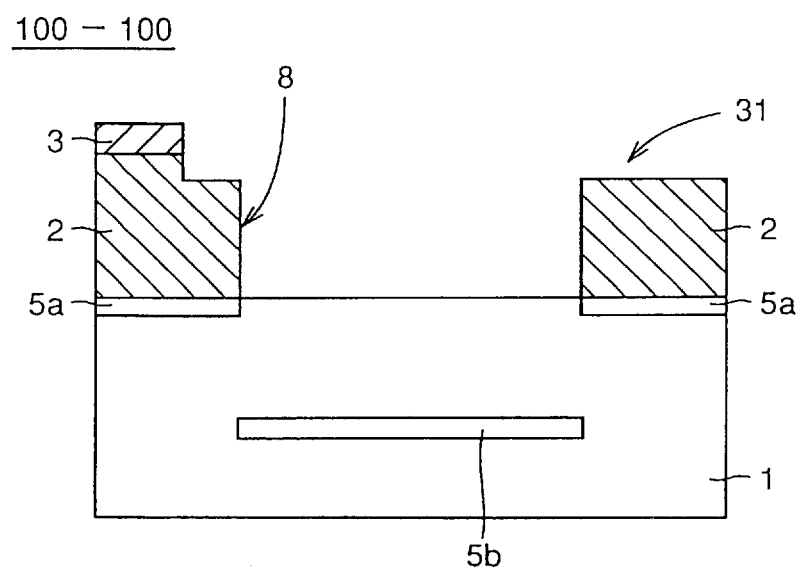
FIGS. 116 to 124 are cross sectional view showing a process of manufacturing a semiconductor device of an embodiment 17 of the invention.

A step similar to that of the embodiment 9 shown in FIG. 53 using photolithography is performed to form photoresist 35 which defines a pattern for forming the gate electrode and the interconnection. Using photoresist 35 as a mask, third insulating film 6 is etched. In this case, a selectivity ratio of etching between the silicon nitride film and silicon oxide film may be controlled appropriately, whereby second insulating film 3 can also be etched. Thus, by setting the selectivity ratio of electing to a low value, e.g., of about 3, third and second insulating films 6 and 3 can be simultaneously etched in this step. An example in which the selectivity ratio is 3 will be described below. Third insulating film 6 of about 500 nm in thickness made of a silicon oxide film is completely removed by the overetching of 10%. Under this condition, second insulating film 3 of about 150 nm in thickness made of the silicon nitride film is completely etched, and first insulating film (silicon oxide film) under second insulating film 3 is etched by about 100 nm. In this manner, gate electrode opening 8 and interconnection groove 31 shown in FIG. 116 are formed. In the process of etching the silicon oxide film using the silicon nitride film as a mask, an intended selectivity ratio of etching can be achieved easily, for example, under the conditions of a $CH_4$ flow rate of 24 sccm/min, a pressure of 1.33 Pa, high-frequency power of 150W and an $H_2$ flow rate variable between 5 and 25 sccm/min. The selectivity ratio of etching is not restricted to 3, and may be appropriately selected in accordance with the thicknesses of second and third insulating films 3 and 6. Etching steps of different selectivity ratios may be appropriately used in combination.

Figure 115:
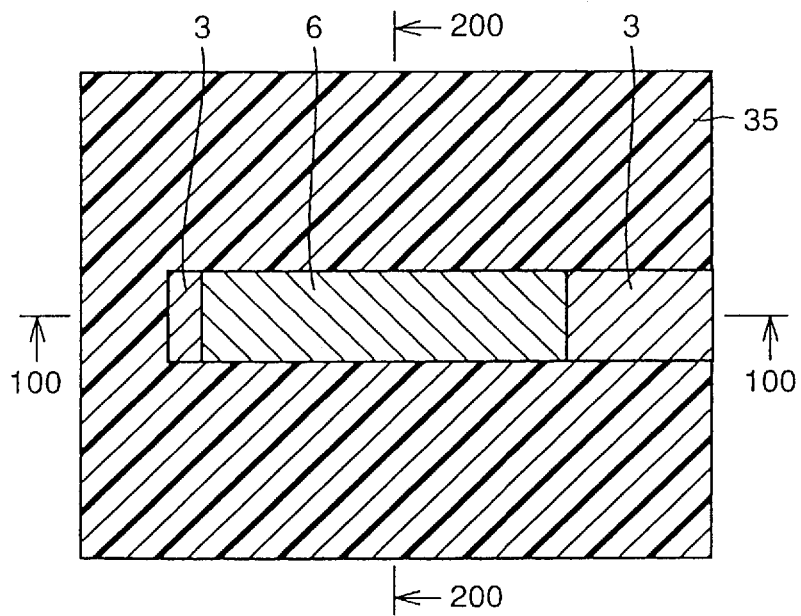
FIG. 115 is a plan view showing a process of manufacturing a semiconductor device of an embodiment 17 of the invention.
Figure 117:
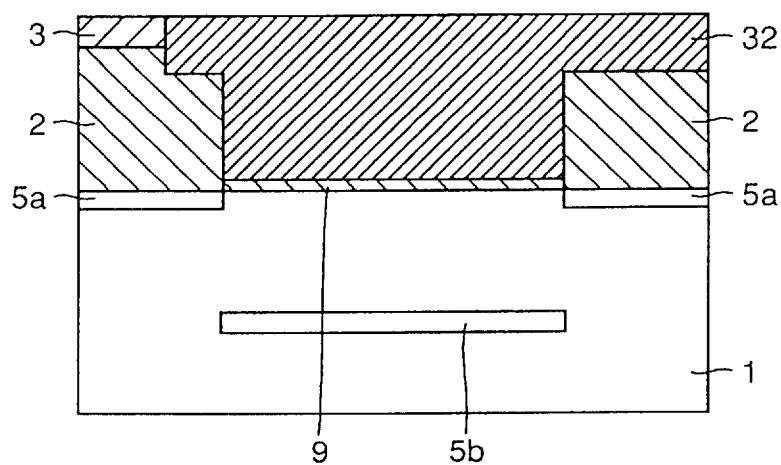
Figure 118:
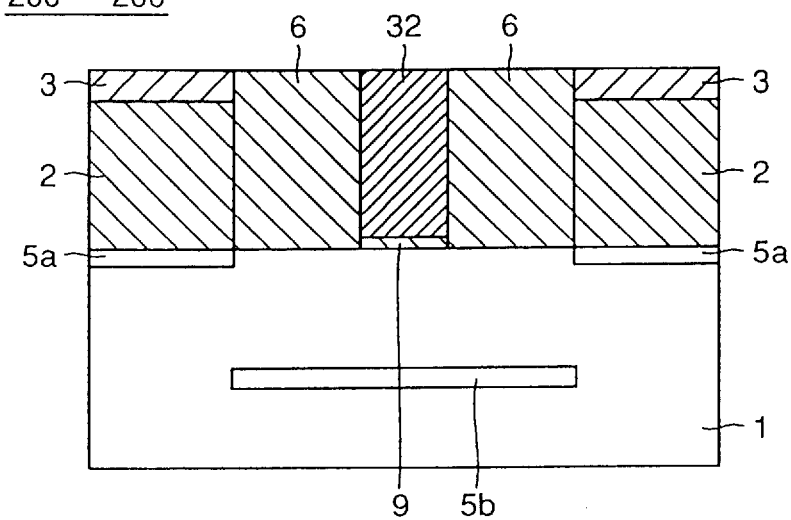

A process similar to that of the embodiment 9 shown in FIG. 55 is performed to form gate insulating film 9 and buried interconnection and gate electrode 32 as shown in FIG. 117. More specifically, gate insulating film 9 is formed by the thermal oxidation or CVD method. After forming the conductive film by the CVD method, it is polished or etched back to form buried interconnection and gate electrode 32 filling gate electrode opening 8 and interconnection groove 31. FIG. 117 is a cross sectional view taken along line 100—100 in FIG. 115, and FIG. 118 is a cross sectional view taken along line 200—200 in FIG. 115.

Figure 119:
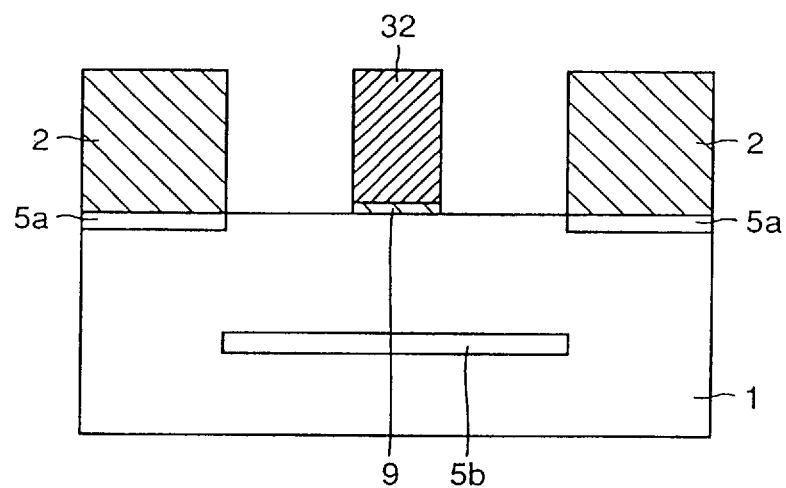
Figure 120:
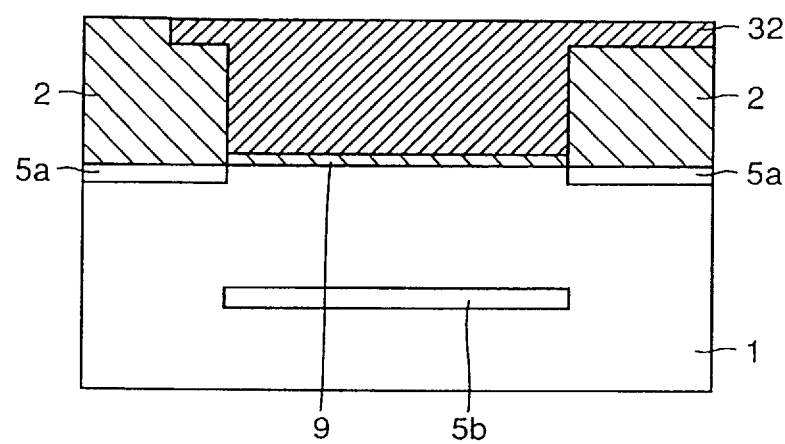
Figure 121:
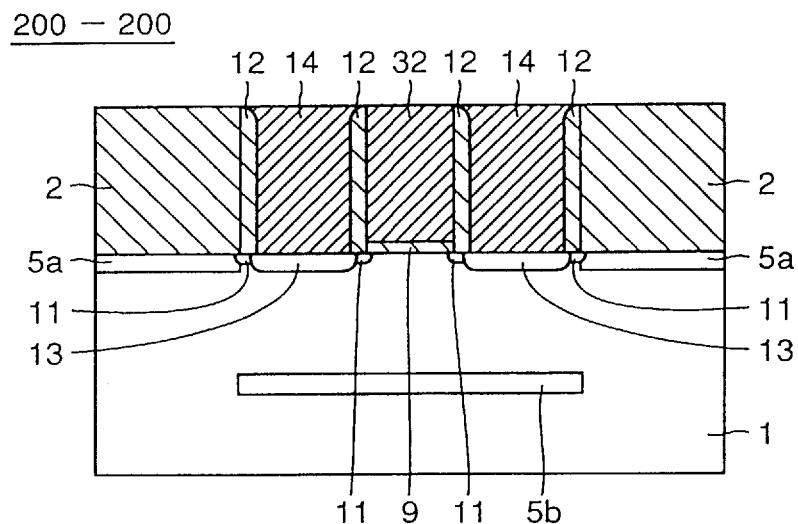

Buried interconnection and gate electrode 32 is etched back to reduce its thickness by about 200 nm, and then third insulating film 6 is etched and removed. Since the buried interconnection and gate electrode 32 is thinned by 200 nm, the upper surface of buried interconnection and gate electrode 32 is located at the same level as the upper surface of first insulating film 2, and thus a flat structure is formed as shown in FIG. 119. In the etching of third insulating film 6, a selectivity ration of silicon oxide film to silicon nitride film is about 3.6, and the silicon oxide film is etched by about 5500 nm, whereby second insulating film 3 is removed. Such a method may also be employed that third insulating film 6 is removed with a higher selectivity ration of 15, and remaining second insulating film 3 made of the silicon nitride film is removed with hot phosphoric acid at a temperature of 80° C. Optimum etching conditions can be selected within the above range. Removal of second insulating film 3 is not essential, and, if it is not removed, it is not necessary to reduce the thickness of buried interconnection and gate electrode 32 by the etching. FIG. 120 is a cross sectional view in the gate width direction showing the step in FIG. 119.

Thereafter, a process similar to that of the embodiment 1 shown in FIGS. 9 to 12 is used to form lightly doped impurity diffusion layers 11, side wall insulating films 12, heavily doped impurity diffusion layers 13 and source/drain electrodes 14.

Figure 122:
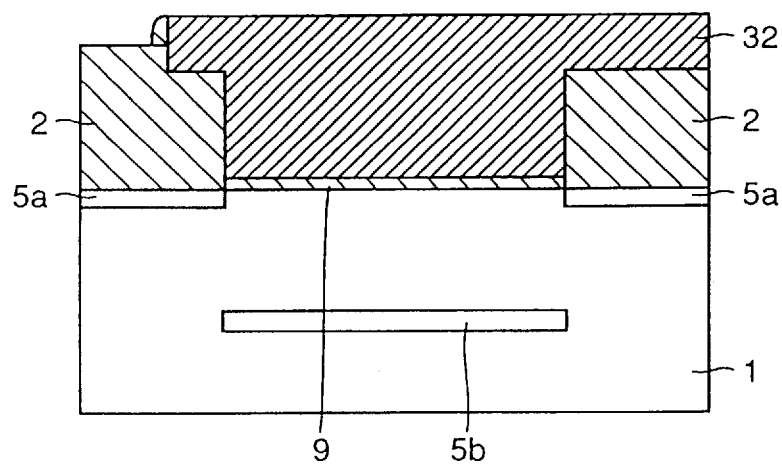
Figure 123:
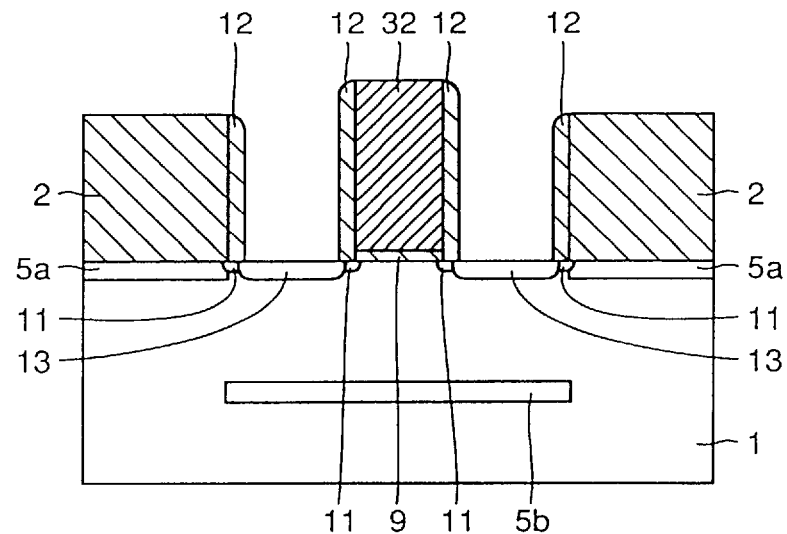
Figure 124:
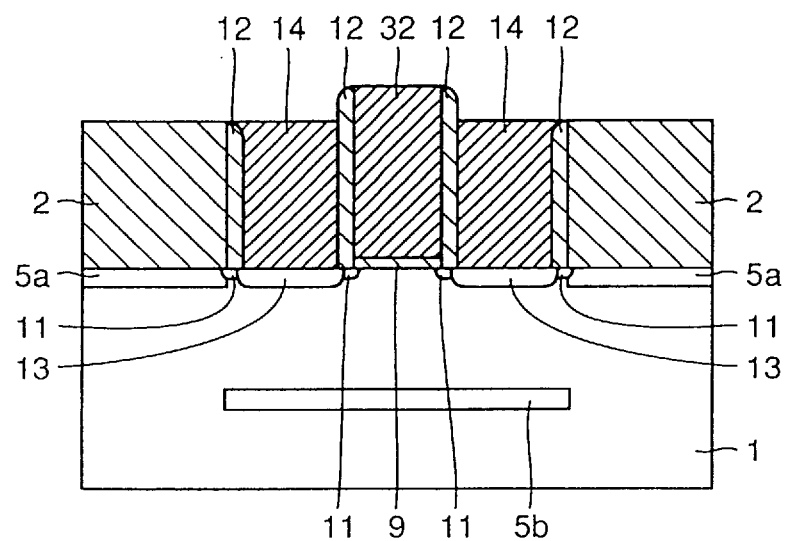

In the step shown in FIG. 119, buried interconnection and gate electrode 32 is thinned to form a flat configuration. However, the thickness of buried interconnection and gate electrode 32 may not be reduced as shown in FIGS. 122 and 123. FIG. 122 is a cross sectional view in the gate width direction showing a structure in which lightly doped impurity diffusion layers 11, side wall insulating films 12 and heavily doped impurity diffusion layers 13 are formed after removal of third insulating film 6. FIG. 123 is a cross sectional view in the gate length direction showing the structure in FIG. 122. After the step shown in FIG. 123, source/drain electrodes 14 are formed as shown in FIG. 124. The surfaces of source/drain electrodes 14 are substantially flush with the upper surface of first insulating film 2, and is lower than the surface of buried interconnection and gate electrode 32. Source/drain electrodes 14 are isolated from buried interconnection and gate electrode 32 by side wall insulating films 12.

According to this embodiment 17, as described above, the thicknesses of the first, second and third insulating films are determined in accordance with the selectivity ratio of etching between the silicon nitride film and silicon oxide film, whereby the structure integrally provided with the gate electrode and interconnection can be formed easily.

(Embodiment 18)

The embodiment 18 likewise relates to a structure and a manufacturing process which can simultaneously and integrally form a gate electrode and an interconnection connected thereto. A manufacturing process of the embodiment 18 will be described below with reference to FIGS. 125 to 130.

Figure 125:
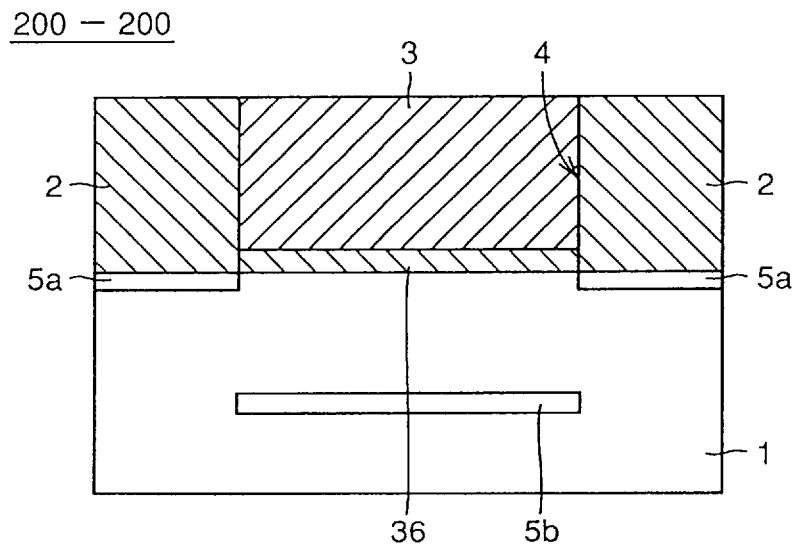
FIGS. 125 to 130 are cross sectional views showing a process of manufacturing a semiconductor device of an embodiment 18 of the invention.

After the step of the embodiment 5 shown in FIG. 32, thermal oxidation is performed to form underlaying oxide film 36 of about 20 nm in thickness made of a silicon oxide film as shown in FIG. 125. Underlaying oxide film 36 is thicker than the gate insulating film 9 to be formed later. Then, second insulating film 3 made of a silicon nitride film is formed, and is polished or etched back to form second insulating film 3 filling transistor opening 4. First insulating film 2 is made of a silicon oxide film and has a thickness of about 450 nm.

Figure 126:
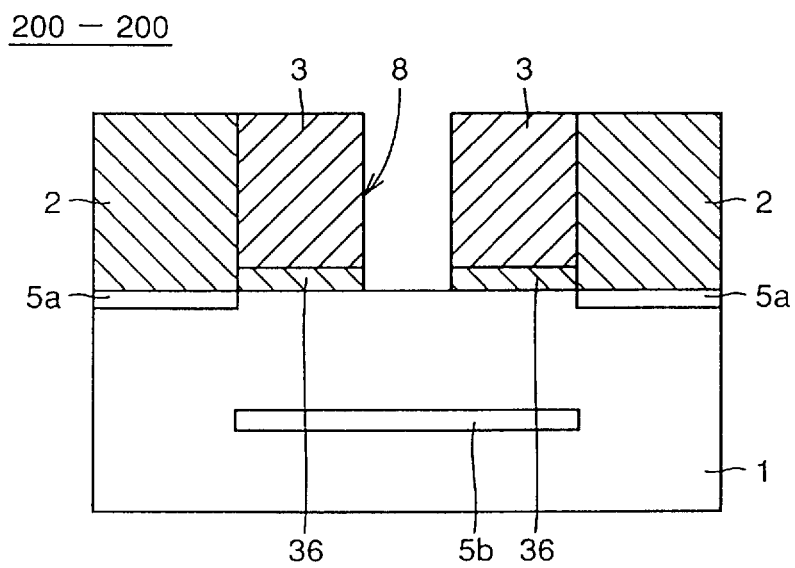
Figure 127:
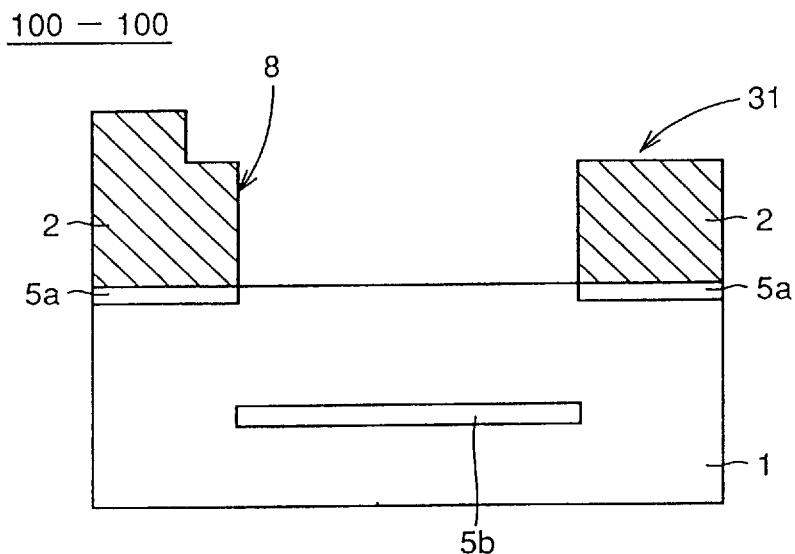

Using photoresist 35 which is the same as that in the embodiment 17 shown in FIG. 115, gate electrode opening 8 and interconnection groove 31 are formed as shown in FIGS. 126 and 127. Similarly to the embodiment 17, by setting a flow rate of $H_2$ to an optimum value, the etching selectivity ratio of the silicon nitride film to the silicon oxide film is set to 3:1. The etching quantity is set to a value corresponding to the thickness of silicon nitride film of 520 nm, whereby second insulating film 3 and underlaying oxide film 36 are removed. In this step, first insulating film 2, i.e., silicon oxide film is etched by a quantity corresponding to a thickness of about 170 nm. Therefore, interconnection groove 31 has a depth of about 170 nm.

Figure 128:
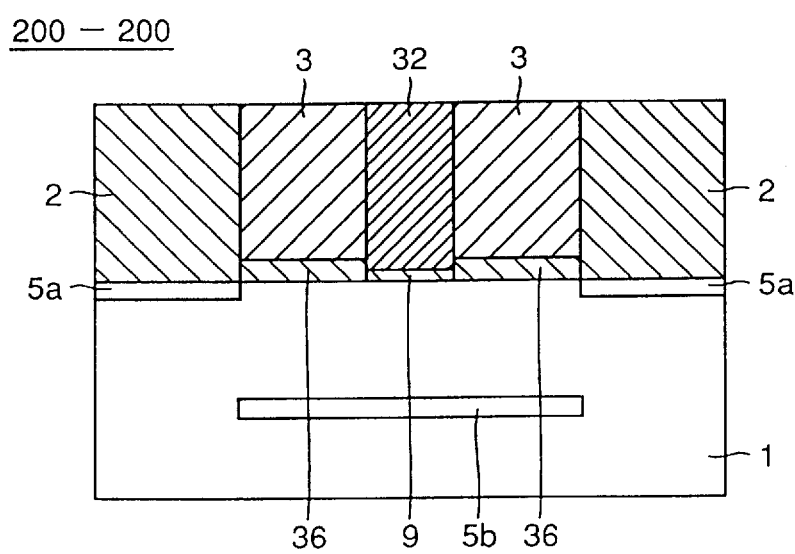
Figure 129:
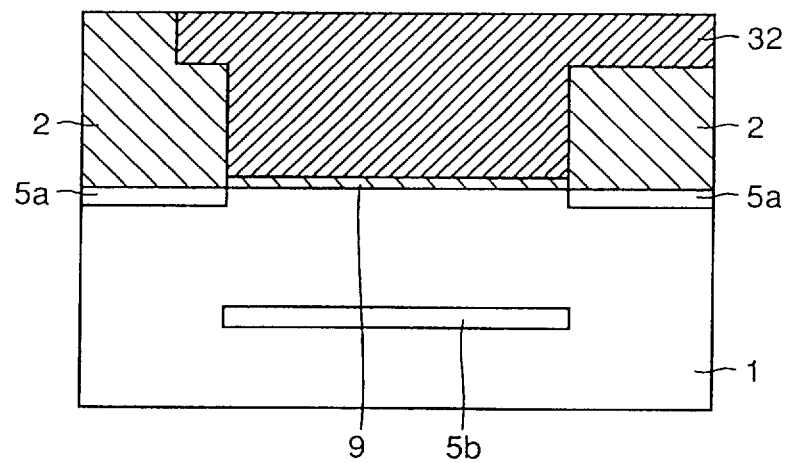
Figure 130:
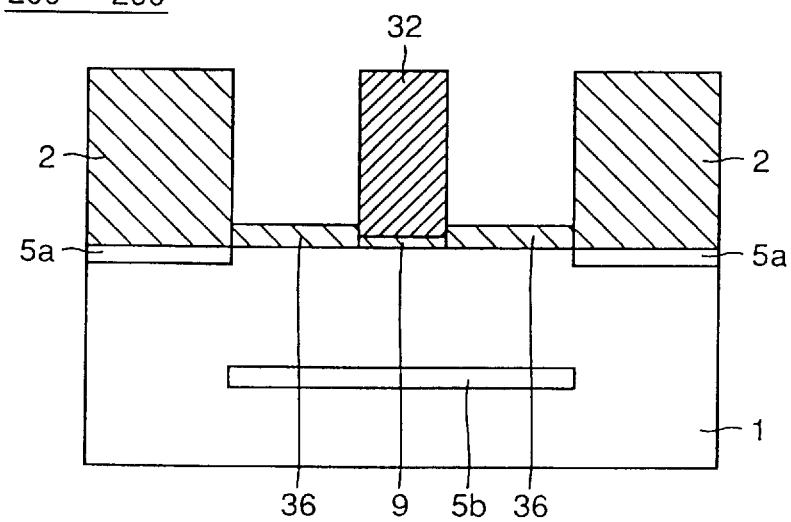

As shown in FIG. 128, the thermal oxidation or CVD method is performed to form gate insulating film 9. A conductive film is formed on gate insulating film 9, and then is polished or etched back to form interconnection and gate electrode 32 only inside gate electrode opening 8 and interconnection groove 31. FIG. 129 shows a section in the gate width direction in the step shown in FIG. 128. Thereafter, second insulating film 3 made of the silicon nitride film is removed with chemicals such as hot phosphoric acid or by the dry etching. In this processing, gate insulating film 9 is laterally protected by underlaying oxide film 36, so that the side surfaces of gate insulating film 9 are not etched.

Thereafter, a process similar to that of the embodiment 1 shown in FIGS. 9 to 12 is performed, so that the transistor of the embodiment 18 is completed. Underlying oxide film 36 is removed by the etching which is effected for forming side wall insulating films 12. Since the purpose of underlying oxide film 36 is to protect gate insulating film 9, it is not necessary to form underlying oxide film 36 provided that the etching selectivity ratio of the silicon oxide film to the silicon nitride film is several tens and thus sufficiently large in the step shown in FIG. 129.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an element isolating film formed on a main surface of a semiconductor substrate, having a flat upper surface, having an opening which extends to the main surface, and made of a plurality of layers;

a pair of source/drain regions formed on the main surface of said semiconductor substrate located commonly in said opening, and spaced apart from each other by a distance to define a channel region therebetween;

a gate electrode formed on said channel region with a gate insulating film therebetween, filling a predetermined region between said pair of source/drain regions in said opening of said element isolating film, and having an upper surface at substantially the same level as the upper surface of said element isolating film;

a side wall insulating film surrounding said pair of source/drain regions, and formed along an inner side surface of said opening in said element isolating film and opposite side surfaces of said gate electrode; and a pair of source/drain electrodes filling regions surrounded by said side wall insulating film, electrically connected to said pair of source/drain regions, respectively, and having upper surfaces at substantially the same level as the upper surface of said element isolating film, wherein said gate electrode and said pair of source/drain electrodes are electrically isolated from each other by said side wall insulating film.

2. The semiconductor device according to claim 1, wherein an impurity region of a conductivity type different from that of said source/drain regions is formed in a buried manner at the main surface of said semiconductor substrate located only immediately under said gate electrode.

3. The semiconductor device according to claim 1, wherein said element isolating film has a two-layer structure including a first insulating film and a second insulating film of a material different from that of said first insulating film.

4. The semiconductor device according to claim 1, wherein said pair of source/drain electrodes includes a metal nitride film.

5. The semiconductor device according to claim 1, wherein said gate electrode includes a U-shaped polycrystalline silicon layer formed on said gate insulating film and a metal silicide layer filling a space inside said U-shaped polycrystalline silicon layer.

6. The semiconductor device according to claim 1, wherein said element isolating film includes:

a first insulating film formed on the main surface of said semiconductor substrate;

a conductive film formed on the surface of said first insulating film; and a second insulating film formed on said conductive film.

7. A semiconductor device comprising:

an element isolating film formed on a main surface of a semiconductor substrate, having a flat upper surface, and having a predetermined opening which extends to the main surface;

a pair of source/drain regions formed on the main surface of said semiconductor substrate located commonly in said opening, and spaced apart from each other by a predetermined distance to define a channel region therebetween;

a gate electrode formed on said channel region with a gate insulating film therebetween, filling a predetermined region between said pair of source/drain regions in said opening of said element isolating film, and having an upper surface at substantially the same level as the upper surface of said element isolating film;

a side wall insulating film surrounding said pair of source/drain regions, and formed along an inner side surface of said opening in said element isolating film and opposite side surfaces of said gate electrode;

a pair of source/drain electrodes filling regions surrounded by said side wall insulating film, electrically connected to said pair of source/drain regions, respectively, and having upper surfaces at substantially the same level as the upper surface of said element isolating film; and a gate interconnection electrically connected to said gate electrode, wherein said element isolating film includes:

a first insulating film formed on the main surface of said semiconductor substrate, and a second insulating film formed on said first insulating film and having a groove; said gate interconnection fills said groove in said second insulating film, is formed integrally with said gate electrode, and has an upper surface at said substantially same level as the upper surface of said second insulating film; and said gate interconnection and said gate electrode are electrically isolated from said pair of source/drain electrodes by said sidewall insulating film.

8. A semiconductor device comprising:

an element isolating film formed on a main surface of a semiconductor substrate, having a flat upper surface, and having an opening which extends to the main surface; a pair of source/drain regions formed on the main surface of said semiconductor substrate located commonly in said opening, and spaced apart from each other by a distance to define a channel region therebetween;

a gate electrode formed on said channel region with a gate insulating film therebetween, filling a predetermined region between said pair of source/drain regions in said opening of said element isolating film, and having an upper surface at substantially the same level as the upper surface of said element isolating film;

a side wall insulating film surrounding said pair of source/drain regions, and formed along an inner side surface of said opening in said element isolating film and opposite side surfaces of said gate electrode;

a pair of source/drain electrodes filling regions surrounded by said side wall insulating film, electrically connected to said pair of source/drain regions, respectively, and having upper surfaces at substantially the same level as the upper surface of said element isolating film; and a gate interconnection electrically connected to said gate electrode, wherein said element isolating film includes:

a first insulating film formed on the main surface of said semiconductor substrate, a second insulating film formed on said first insulating film and having a material different from that of said first insulating film, a third insulating film formed on said second insulating film, having a material different from that of said second insulating film, and having a groove;

wherein said gate interconnection fills said groove, is integral with said gate electrode, has an upper surface at the substantially same level as the upper surface of said third insulating layer, and has a thickness substantially equal to the thickness of said third insulating film; and wherein said gate interconnection and said gate electrode are electrically isolated from said pair of source/drain electrodes by said sidewall insulating film.

9. A semiconductor device comprising:

an element isolating film formed on a main surface of a semiconductor substrate, having a flat upper surface, having an opening which extends to the main surface and having a groove;

a pair of source/drain regions formed on the main surface of said semiconductor substrate located commonly in said opening, and spaced apart from each other by a distance to define a channel region therebetween;

a gate electrode formed on said channel region with a gate insulating film therebetween, filling a predetermined region between said pair of source/drain regions in said opening of said element isolating film, and having an upper surface at substantially the same level as the upper surface of said element isolating film;

a side wall insulating film surrounding said pair of source/drain regions, and formed along an inner side surface of said opening in said element isolating film and opposite side surfaces of said gate electrode;

a pair of source/drain electrodes filling regions surrounded by said side wall insulating film, electrically connected to said pair of source/drain regions, respectively, and having upper surfaces at substantially the same level as the upper surface of said element isolating film;

an interconnection layer filling said groove in said element isolating film and having an upper surface at said substantially same level as the upper surface of said element isolating film;

a coupling groove above said side wall insulating film between one of said source/drain regions and said interconnection layer; and a conductive film filling said coupling groove, and provided for electrically connecting said one of said source/drain regions and said interconnection layer, wherein said gate electrode is electrically isolated from said pair of source/drain electrodes by said sidewall insulating film.

10. A semiconductor device comprising:

an element isolating film formed on a main surface of a semiconductor substrate, having a flat upper surface, and having a predetermined opening which extends to the main surface;

a pair of source/drain regions formed on the main surface of said semiconductor substrate located commonly in said opening, and spaced apart from each other by a predetermined distance to define a channel region therebetween;

a gate electrode formed on said channel region with a gate insulating film therebetween, filling a predetermined region between said pair of source/drain regions in said opening of said element isolating film, and having an upper surface at substantially the same level as the upper surface of said element isolating film;

a side wall insulating film surrounding said pair of source/drain regions, and formed along an inner side surface of said opening in said element isolating film and opposite side surfaces of said gate electrode;

a pair of source/drain electrodes filling regions surrounded by said side wall insulating film, electrically connected to said pair of source/drain regions, respectively, and having upper surfaces at substantially the same level as the upper surface of said element isolating film; and an interlayer insulating film formed on said element isolating film, said gate electrode and said pair of source/drain electrodes, wherein said element isolating film includes:

a first insulating film formed on the main surface of said semiconductor substrate, and a second insulating film formed on said first insulating film and having a material different from that of said first insulating film;

said sidewall insulating film includes:

a first side wall insulating film formed on the main surface of said semiconductor substrate, and a second side wall insulating film formed on said first side wall insulating film and having the same material as said second insulating film;

said interlayer insulating film has a material different from that of said second insulating film;

a contact hole is formed at said interlayer insulating film, said second insulating film and said second side wall insulating film for exposing the upper and side surfaces of at least one of said source/drain electrodes; and an interconnection having a portion filling said contact hole is in electrical contact with the upper and side surfaces of said at least one of said source/drain electrodes in said contact hole.

* * * * *